(12) United States Patent
Bedeschi et al.

(10) Patent No.: US 11,114,147 B2
(45) Date of Patent: Sep. 7, 2021

(54) SELF-BOOST, SOURCE FOLLOWING, AND SENSE-AND-HOLD FOR ACCESSING MEMORY CELLS

(71) Applicant: Micron Technology, Inc., Boise, ID (US)

(72) Inventors: Ferdinando Bedeschi, Biassono (IT); Umberto Di Vincenzo, Capriate San Gervasio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/118,035

(22) Filed: Dec. 10, 2020

(65) Prior Publication Data

US 2021/0098044 A1   Apr. 1, 2021

Related U.S. Application Data

(60) Continuation of application No. 16/592,630, filed on Oct. 3, 2019, now Pat. No. 10,896,710, which is a
(Continued)

(51) Int. Cl.
| | |
|---|---|
| *G11C 11/22* | (2006.01) |
| *G11C 11/404* | (2006.01) |
| *G11C 11/409* | (2006.01) |
| *G11C 11/408* | (2006.01) |
| *G11C 7/10* | (2006.01) |
| *G11C 11/4091* | (2006.01) |
| *G11C 7/06* | (2006.01) |

(Continued)

(52) U.S. Cl.
CPC ............ *G11C 11/221* (2013.01); *G11C 5/145* (2013.01); *G11C 7/06* (2013.01); *G11C 7/10* (2013.01); *G11C 11/2257* (2013.01); *G11C 11/2273* (2013.01); *G11C 11/404* (2013.01); *G11C 11/409* (2013.01); *G11C 11/4085* (2013.01); *G11C 11/4091* (2013.01); *G11C 27/024* (2013.01)

(58) Field of Classification Search
CPC .... G11C 11/2273; G11C 11/221; G11C 17/12
USPC .............................................. 365/145, 230.06
See application file for complete search history.

(56) References Cited

U.S. PATENT DOCUMENTS 9,117,535 B2 * 8/2015 Madan ................ G11C 11/2273

* cited by examiner

*Primary Examiner* — Jason Lappas
(74) *Attorney, Agent, or Firm* — Holland & Hart LLP

(57) ABSTRACT

Methods, systems, and devices for operating a memory cell or cells are described. A capacitor coupled with an access line may be precharged and then boosted such that the charge stored in the capacitor is elevated to a higher voltage with respect to a memory cell. The boosted charge in the capacitor may support sensing operations that would otherwise require a relatively higher voltage. Some embodiments may employ charge amplification between an access line and a sense component, which may amplify signals between the memory cell and the sense component, and reduce charge sharing between these components. Some embodiments may employ "sample-and-hold" operations, which may re-use certain components of a sense component to separately generate a signal and a reference, reducing sensitivity to manufacturing and/or operational tolerances. In some embodiments, sensing may be further improved by employing "self-reference" operations that use a memory cell to generate its own reference.

20 Claims, 15 Drawing Sheets

Related U.S. Application Data division of application No. 15/653,276, filed on Jul. 18, 2017, now Pat. No. 10,475,498.

(51) Int. Cl.
*G11C 5/14* (2006.01)
*G11C 27/02* (2006.01)

SELF-BOOST, SOURCE FOLLOWING, AND SENSE-AND-HOLD FOR ACCESSING MEMORY CELLS

CROSS REFERENCE

The present Application for Patent is a continuation of U.S. patent application Ser. No. 16/592,630 by Bedeschi et al., entitled "SELF-BOOST, SOURCE FOLLOWING, AND SAMPLE-AND-HOLD FOR ACCESSING MEMORY CELLS," filed Oct. 3, 2019, which is a divisional of and claims priority to and the benefit of U.S. patent application Ser. No. 15/653,276 by Bedeschi et al., entitled "SELF-BOOST, SOURCE FOLLOWING, AND SAMPLE-AND-HOLD FOR ACCESSING MEMORY CELLS," filed Jul. 18, 2017, assigned to the assignee hereof, and each of which is expressly incorporated by reference in its entirety herein.

BACKGROUND

The following relates generally to memory systems and more specifically to self-boost, source following, and sample-and-hold for accessing memory cells.

Memory devices are widely used to store information in various electronic devices such as computers, wireless communication devices, cameras, digital displays, and the like. Information is stored by programing different states of a memory device. For example, binary memory devices have two logic states, often denoted by a logic "1" or a logic "0." In other memory devices, more than two logic states may be stored. To access the stored information, a component of the electronic device may read, or sense, the stored logic state in the memory device. To store information, a component of the electronic device may write, or program, the logic state in the memory device.

Various types of memory devices exist, including those that employ magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, such as PCM and FeRAM, may maintain stored logic states for extended periods of time even in the absence of an external power source. Volatile memory devices, such as DRAM, may lose stored logic states over time unless they are periodically refreshed by a power source. In some cases non-volatile memory may use similar device architectures as volatile memory but may have non-volatile properties by employing such physical phenomena as ferroelectric capacitance or different material phases.

Improving memory devices, may include increasing memory cell density, increasing read/write speeds, increasing reliability, increasing data retention, reducing power consumption, or reducing manufacturing costs, among other metrics. In some cases, operation of a memory device may require a relatively high voltage for sensing and/or writing operations, and the components associated with providing the relatively high voltage may be associated with relatively high power consumption or require relatively greater electrical insulation. Furthermore, a memory device may employ substantially duplicated components to provide a signal and a reference, and manufacturing and/or operational tolerances of the duplicated components may introduce an imbalance between the signal and the reference that can lead to sensing difficulties.

DETAILED DESCRIPTION

Figure 1:
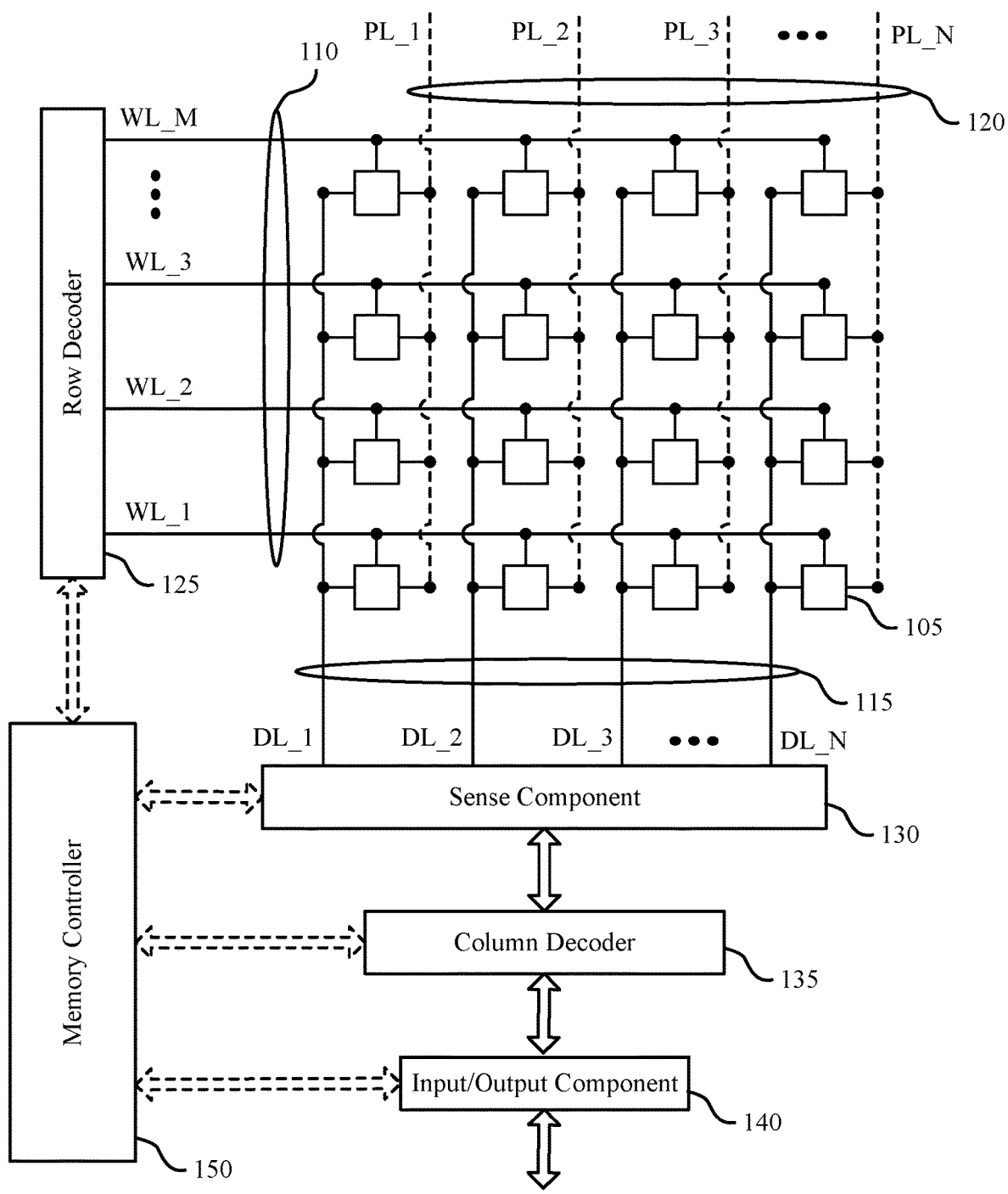
FIG. 1 illustrates an example memory device that may support self-boost, source following, and sample-and-hold for accessing memory cells in accordance with various embodiments of the present disclosure.

The described features and operations generally relate to memory systems, and in particular to various combinations of self-boost, source following, and sample-and-hold features and operations for accessing a memory cell.

In some memory systems, accessing a memory cell may benefit from using a relatively high supply voltage. However, providing a relatively high voltage may be associated with correspondingly high power consumption, complex components, large devices, or high insulation requirements, relative to power consumption, complexity, size, and insulation employed with lower supply voltages. Thus, it may be preferable to support accessing a memory cell with relatively lower voltage devices.

In accordance with embodiments of the present disclosure, a capacitor coupled with an access line of a sense component may be precharged with a relatively low voltage difference, and then boosted with a relatively low voltage such that the charge stored in the capacitor is elevated to a relatively high voltage with respect to the memory cell (e.g., boosting a terminal of the capacitor to a relatively high voltage). Such operations may be referred to as "self-boost." The boosted charge in the capacitor may support sensing operations that would otherwise require a relatively high voltage from a single voltage supply of the memory system, and/or would take a relatively longer time when using a relatively low voltage supply. For example, the boosted charge in such a capacitor may facilitate sensing schemes for a ferroelectric memory cell that reverse a saturation polarization of certain logic states in such a memory cell.

In some memory systems that include capacitors coupled with an access line of a sense component, it may be preferable to use relatively low capacitance (e.g., relatively low capacitance integrator capacitors) such that a voltage signal resulting from a flow of charge of a memory cell is relatively high. However, such systems may require relatively small and/or sensitive components in a sense component. Thus, in some memory systems it may be beneficial to employ charge amplification between an access line and a sense component in accordance with embodiments of the present disclosure, which may be referred to as "source following." Source following may amplify signals between the memory cell and the sense component, and may also isolate the memory cell from the sense component thereby preventing charge sharing between these components. The charge amplification may also support larger components in the sense component, which may improve robustness of the memory system.

Some memory systems may apply self-boost and/or source following for both a signal line and a reference line coupled with a sense component, which may support relatively fast sense operations because certain operations of developing a signal and developing a reference may occur concurrently. Such memory systems may use substantially duplicated components for supporting self-boost and/or source following operations. The substantially duplicated components may have different properties, such as threshold voltage (e.g., for transistors) and/or insulation properties, as a result of manufacturing and/or operational tolerances. Although the relatively fast sense operations supported by the duplicated components may be suitable for some applications, it may be beneficial in some applications to improve robustness to manufacturing and/or operational tolerances despite a drawback of relatively slower operations. Thus, some memory systems may employ "sample-and-hold" operations in accordance with embodiments of the present disclosure, which may re-use certain components of a sense component to separately generate a signal and a reference, thereby reducing sensitivity to manufacturing and/or operational tolerances.

In some memory systems that support sample-and-hold operations, sensing may be further improved by employing "self-reference" operations in accordance with embodiments of the present disclosure. For example, a memory cell may be sensed a first time, with the resulting signal latched and stored at a first terminal of a sense component. The same memory cell may be sensed a second time, with the resulting signal latched and stored at a second terminal of the sense component. The signals stored at the terminals of the sense component may be compared in order to determine a logic state originally stored in the memory cell. For example, as applied to a ferroelectric memory cell, self-reference operations using a positive sense voltage used to sense a positively polarized memory cell may store a displacement signal at both the first terminal and second terminal of the sense component. On the other hand, self-reference operations using a positive sense voltage used to sense a negatively polarized memory cell may store a displacement and polarization signal at the first terminal of the sense component, and a displacement signal at the second terminal of the sense component. The difference, or lack thereof, between the first and second sensing of the same memory cell may be used to determine the logic state originally stored in the memory cell, and because the same memory cell is accessed for both a sense signal and a reference signal, effects due to circuit path resistance, intrinsic capacitance, and the like may be cancelled between the first and second sensing. Accordingly, some memory systems may employ self-reference operations when increased robustness to circuit variations are beneficial.

Features of the disclosure introduced above are further described below in the context of a memory array. Specific examples are then described for self-boost, source following, sample-and-hold, and self-reference operations. These and other features of the disclosure are further illustrated by and described with reference to apparatus diagrams, system diagrams, and flowcharts that relate to self-boost, source following, sample-and-hold, and self-reference for accessing a memory cell.

FIG. 1 illustrates an example memory device 100 that may support self-boost, source following, and sample-and-hold for accessing a memory cell in accordance with various embodiments of the present disclosure. Memory device 100 may also be referred to as an electronic memory apparatus. Memory device 100 includes memory cells 105 that are programmable to store different logic states. In some cases a memory cell 105 may be programmable to store two logic states, denoted a logic 0 and a logic 1. In some cases, a memory cell 105 may be programmable to store more than two logic states.

In some examples a memory cell 105 may store an electrical charge representative of the programmable logic states in a capacitive memory element. For example, a charged and uncharged capacitor of a memory cell 105 may represent two logic states, respectively, or a positively charged and a negatively charged capacitor of a memory cell 105 may represent two logic states, respectively. DRAM architectures may use such designs, and the capacitor employed may include a dielectric material with linear or para-electric electric polarization properties as the insulator. In some examples, such as FeRAM, a memory cell 105 may include a ferroelectric capacitor having a ferroelectric material as an insulating layer between terminals of the capacitor. Different levels of polarization of a ferroelectric capacitor may represent different logic states. Ferroelectric materials have non-linear polarization properties including those discussed in further detail with reference to FIG. 3.

Memory device 100 may include a three-dimensional (3D) memory array, where a plurality of two-dimensional (2D) memory arrays (e.g., decks) are formed on top of one another. This may increase the number of memory cells 105 that may be placed or created on a single die or substrate as compared with 2D arrays, which in turn may reduce production costs or increase the performance of the memory device 100, or both. The decks may be separated by an electrically insulating material. Each deck may be aligned or positioned so that memory cells 105 may be approximately aligned with one another across each deck, forming a stack of memory cells 105.

According to the example of FIG. 1, each row of memory cells 105 is coupled with one of a plurality of first access lines 110 (e.g., a word line (WL)), and each column of memory cells 105 is coupled with one of a plurality of second access lines 115 (e.g., a digit line (DL)). Thus, one memory cell 105 may be located at the intersection of one of the first access lines 110 and one of the second access lines 115. This intersection may be referred to as an address of the memory cell 105. References to word lines and bit lines, or their analogues, are interchangeable without loss of understanding or operation. In some cases, first access lines 110 and second access lines 115 may be substantially perpendicular to one another in the memory device 100 (e.g., when viewing a plane of a deck of the memory device 100, as shown in FIG. 1). Although the access lines described with reference to FIG. 1 are shown as simple lines between memory cells 105 and coupled components, access lines may include other circuit elements, such as capacitors, resistors, transistors, amplifiers, and others, which may be used to support sensing operations including those described herein.

In some architectures, the logic storing component (e.g., a capacitive memory element) of a memory cell 105 may be electrically isolated from a second access line 115 by a selection component. A first access line 110 may be coupled with and may control the selection component. For example, the selection component may be a transistor and the first access line 110 may be coupled with a gate of the transistor. Activating the first access line 110 may result in an electrical connection or closed circuit between the logic storing component of the memory cell 105 and its corresponding second access line 115. The second access line 115 may then be accessed to read and/or write the memory cell 105.

In some examples, memory cells 105 may also be coupled with one of a plurality of third access lines 120 (e.g., a plate line (PL)). In some examples the plurality of third access lines may couple memory cells 105 with a voltage source for various sensing and/or writing operations including those described herein. For example, when memory cells 105 employ a capacitor for storing a logic state, a second access line 115 may provide access to a first terminal of the capacitor, and a third access line 120 may provide access to a second terminal of the capacitor. As used herein, the term "terminal" need not suggest a physical boundary or connection point of a capacitor of a memory cell 105, or any other circuit element. Rather, "terminal" may refer to a reference point of a circuit relevant to the circuit element, which may also be referred to as a "node" or "reference point." Although the plurality of third access lines 120 of the memory device 100 are shown as substantially parallel with the plurality of second access lines 115, in other examples a plurality of third access lines 120 may be substantially parallel with the plurality of first access lines 110, or in any other configuration.

Operations such as reading, writing, and rewriting may be performed on a memory cell 105 by activating or selecting a first access line 110, a second access line 115, and/or a third access line 120 coupled with the memory cell 105, which may include applying a voltage, a charge, and/or a current to the respective access line. Access lines 110, 115, and 120 may be made of conductive materials, such as metals (e.g., copper (Cu), silver (Ag), aluminum (Al), gold (Au), tungsten (W), titanium (Ti), etc.), metal alloys, carbon, or other conductive materials, alloys, or compounds. Upon selecting a memory cell 105, a resulting signal may be used to determine the stored logic state. For example, a memory cell 105 with a capacitive memory element storing a logic state may be selected, and the resulting flow of charge via an access line and/or resulting voltage of an access line may be detected to determine the programmed logic state of the memory cell 105.

Accessing memory cells 105 may be controlled through a row decoder 125 and a column decoder 135. For example, a row decoder 125 may receive a row address from the memory controller 150 and activate the appropriate first access line 110 based on the received row address. Similarly, a column decoder 135 may receive a column address from the memory controller 150 and activate the appropriate second access line 115. Thus, in some examples a memory cell 105 may be accessed by activating a first access line 110 and a second access line 115.

Upon accessing, a memory cell 105 may be read, or sensed, by a sense component 130. For example, sense component 130 may be configured to determine the stored logic state of a memory cell 105 based on a signal generated by accessing the memory cell 105. The signal may include a voltage, an electrical charge, an electrical current, or a combination thereof, and sense component 130 may include voltage sense amplifiers, charge sense amplifiers, current sense amplifiers, or both. For example, a voltage may be applied to a memory cell 105 having a capacitive memory element (e.g., using the corresponding first access line 110, second access line 115, and/or third access line 120), and a magnitude of the resulting flow of charge and/or voltage may depend on the stored charge and/or polarization of the capacitive memory element.

Sense component 130 may include various transistors or amplifiers used to detect and amplify a signal, which may be referred to as latching. The detected logic state of a memory cell 105 may then be output via an input/output component 140. In some cases, sense component 130 may be a part of column decoder 135 or row decoder 125. In some cases, sense component 130 may be coupled with or in electronic communication with column decoder 135, row decoder 125, and/or memory controller 150.

A memory cell 105 may also be set, or written, by activating the relevant first access line 110, second access line 115, and/or third access line 120—i.e., a logic state may be stored in the memory cell 105. Column decoder 135 or row decoder 125 may accept data, for example via input/output component 140, to be written to the memory cells 105. In the case of a capacitive memory element, a memory cell 105 may be written by applying a voltage to the capacitor, and then isolating the capacitor (e.g., isolating the capacitor from a voltage source used to write the memory cell 105). In the case of ferroelectric memory, a ferroelectric memory element (e.g., a ferroelectric capacitor) of a memory cell 105 may be written by applying a voltage with a magnitude high enough to polarize the ferroelectric memory element (e.g., applying a saturation voltage), and the ferroelectric memory element may be isolated (e.g., floating), or a zero net voltage may be applied across the ferroelectric memory element (e.g., grounding or virtually grounding the ferroelectric memory element).

In some memory architectures, accessing the memory cell 105 may degrade or destroy the stored logic state. Thus, re-write or refresh operations may be performed to return a programmed logic state to memory cell 105 after such accessing. In DRAM, for example, a logic-storing capacitor of a memory cell 105 may be partially or completely discharged during a sense operation, corrupting the stored logic state. So the logic state may be re-written after a sense operation. In some examples, activating a single access line (e.g., a first access line 110, a second access line 115, or a third access line 120) may result in the discharge of all memory cells 105 along that access line. Thus, in some examples all memory cells 105 in a row or column may need to be re-written after an access operation. But when accessing a memory cell 105 having non-volatile properties (e.g., a FeRAM memory cell), accessing the memory cell 105 may not destroy the logic state and, thus, the memory cell 105 may not require re-writing after accessing.

Some memory architectures, including DRAM, may lose their stored logic states over time unless they are periodically refreshed (e.g., by an voltage source external to the memory cells 105). For example, a charged capacitor may become discharged over time through leakage currents, resulting in the loss of the stored charge. The refresh rate of such memory devices may be relatively high, e.g., tens of refresh operations per second for DRAM, which may result in significant power consumption. With increasingly larger memory arrays, such power consumption may inhibit the deployment or operation of memory arrays (e.g., power supplies, heat generation, material limits, etc.), especially for devices that rely on a finite source of energy, such as a battery. Memory cells 105 having memory elements with non-volatile properties may result in improved performance relative to other memory architectures. For example, FeRAM may offer comparable read/write speeds as DRAM but may have non-volatile properties that allow for reduced power consumption and/or increased cell density.

The memory controller 150 may control the operation (read, write, re-write, refresh, self-boost, source following, sample-and-hold, etc.) of memory cells 105 through the various components, for example, initiating operations of and/or receiving information from the row decoder 125, column decoder 135, and sense component 130, and others components as described herein. In some cases, one or more row decoder 125, one or more column decoder 135, one or more sense component 130, and/or one or more input/output component 140 may be co-located with the memory controller 150. Memory controller 150 may generate row and column address signals in order to activate a desired first access line 110, second access line 115, and/or third access line 120. Furthermore, one, multiple, or all memory cells 105 within memory device 100 may be accessed simultaneously. For example, multiple or all memory cells 105 of memory device 100 may be accessed simultaneously during a reset operation in which all memory cells 105, or a group of memory cells 105, are set to a single logic state Memory controller 150 may also generate and/or control application of various voltages, charges, or currents used during the operation of the memory device 100 (e.g., via various voltage supplies, charge supplies, current supplies, ground points, virtual ground points, etc.). The amplitude, shape, or duration of an applied voltage, charge, or current discussed herein may be adjusted or varied and may be different for the various operations discussed in operating memory device 100. The memory controller 150 may also generate and/or control application of various logic signals (e.g., via various voltage supplies, logic controllers, etc.), which may control various switching components in accordance with embodiments of the present disclosure.

Figure 2:
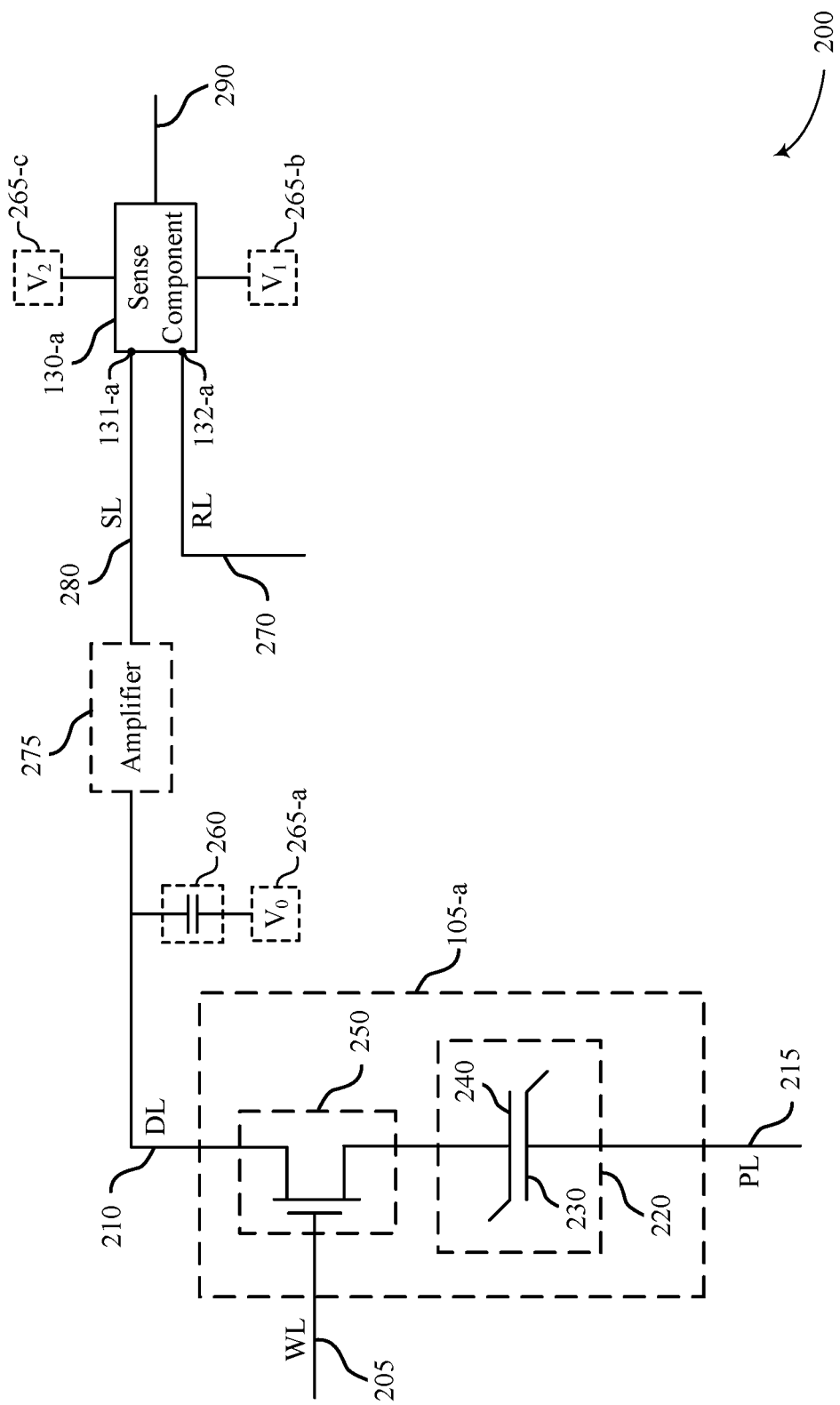
FIG. 2 illustrates an example circuit that may support self-boost, source following, and sample-and-hold for accessing memory cells in accordance with various embodiments of the present disclosure.

FIG. 2 illustrates an example circuit 200 that may support self-boost, source following, and sample-and-hold for accessing memory cells in accordance with various embodiments of the present disclosure. Circuit 200 includes a memory cell 105-a and a sense component 130-a, which may be examples of a memory cell 105 and a sense component 130 described with reference to FIG. 1. Circuit 200 may also include a word line 205, a digit line 210, and a plate line 215, which in some examples may correspond to a first access line 110, a second access line 115, and a third access line 120, respectively, as described with reference to FIG. 1. The circuit 200 may also include a reference line 270 used by the sense component 130-a to determine a stored logic state of the memory cell 105-a. However, in various examples other configurations of access lines and/or reference lines are possible.

Memory cell 105-a may include a logic storage component (e.g., a memory element), such as capacitor 220 that has a first plate, cell plate 230, and a second plate, cell bottom 240. Cell plate 230 and cell bottom 240 may be capacitively coupled through a dielectric material positioned between them (e.g., in a DRAM application), or capacitively coupled through a ferroelectric material positioned between them (e.g., in a FeRAM application). The orientation of cell plate 230 and cell bottom 240 may be flipped without changing the operation of memory cell 105-a. Cell plate 230 may be accessed via plate line 215 and cell bottom 240 may be accessed via digit line 210. As described herein, various states may be stored by charging, discharging, and/or polarizing the capacitor 220.

Capacitor 220 may be in electronic communication with digit line 210, and the stored logic state of capacitor 220 may be read or sensed by operating various elements represented in circuit 200. For example, the memory cell 105-a may also include a selection component 250, and the capacitor 220 can be coupled with digit line 210 when selection component 250 is activated, and the capacitor 220 can be isolated from digit line 210 when selection component 250 is deactivated. Activating selection component 250 may be referred to as selecting memory cell 105-a, and deactivating selection component 250 may be referred to as deselecting memory cell 105-a. In some cases, selection component 250 is a transistor and its operation is controlled by applying a voltage to the transistor gate, where the voltage applied across the transistor (e.g., the voltage between the transistor gate terminal and the transistor source terminal) for activating the transistor is greater than the threshold voltage magnitude of the transistor. The word line 205 may be used to activate the selection component 250. For example, a selection voltage applied to the word line 205 (e.g., a word line logic signal) may be applied to the gate of a transistor of selection component 250, which may connect capacitor 220 with the digit line 210 (e.g., providing a conductive path between the capacitor 220 and the digit line 210.

In other examples, the positions of the selection component 250 and the capacitor 220 in the memory cell 105-*a* may be switched, such that selection component 250 is coupled between plate line 215 and cell plate 230, and the capacitor 220 is coupled between digit line 210 and the other terminal of selection component 250. In such an embodiment, the selection component 250 may remain in electronic communication with digit line 210 through capacitor 220. This configuration may be associated with alternative timing and biasing for read and write operations.

In examples that employ a ferroelectric capacitor 220, the capacitor 220 may not fully discharge upon connection to digit line 210. In various schemes, to sense the logic state stored by a ferroelectric capacitor 220, a voltage may be applied to plate line 215 and/or digit line 210, and the word line 205 may be biased to select memory cell 105-*a*. In some cases, the plate line 215 and/or digit line 210 may be virtually grounded and then isolated from the virtual ground, which may be referred to as a floating condition, prior activating the word line 205. Operation of the memory cell 105-*a* by varying the voltage to cell plate 230 (e.g., via the plate line 215) may be referred to as "moving cell plate." Biasing the plate line 215 and/or digit line 210 may result in a voltage difference (e.g., the voltage of the plate line 215 minus the voltage of the digit line 210) across the capacitor 220. The voltage difference may accompany a change in the stored charge on capacitor 220, where the magnitude of the change in stored charge may depend on the initial state of capacitor 220—e.g., whether the initial logic state stored a logic 1 or a logic 0. In some schemes the change in the stored charge of the capacitor may cause a change in the voltage of the digit line 210, which may be used by the sense component 130-*a* to determine the stored logic state of the memory cell 105-*a*.

Digit line 210 may connect many memory cells 105, and the digit line 210 may have a length that results in a non-negligible intrinsic capacitance 260 (e.g., on the order of picofarads (pF)), which may couple the digit line with a voltage source 265-*a*, which may represent a common ground or virtual ground voltage, or the voltage of an adjacent access line of the circuit 200 (not shown). Although illustrated as a separate component in FIG. 2, the intrinsic capacitance 260 may be associated with properties distributed throughout the digit line 210. For example, the intrinsic capacitance may depend on physical characteristics of the digit line 210, including conductor dimensions (e.g., length, width, and/or thickness) of the digit line 210. Further, additional capacitors may be coupled with an access line including the digit line 210, such as one or more integrator capacitors that support various sensing and writing operations, including those described herein that support self-boost operations. Thus, a change in voltage of digit line 210 after selecting the memory cell 105-*a* may depend on the net capacitance of the digit line 210. That is, as charge flows through the digit line 210, some finite charge may be stored in the digit line 210 (e.g., in the intrinsic capacitance 260 or any other capacitance coupled with the digit line 210), and the resulting voltage of the digit line 210 may depend on the net capacitance of the digit line 210. The resulting voltage of digit line 210 after selecting the memory cell 105-*a* may be compared to a reference (e.g., a voltage of reference line 270) by the sense component 130-*a* in order to determine the logic state that was stored in the memory cell 105-*a*. Other operations may be used to support selecting and/or sensing the memory cell 105-*a*, including operations for self-boost, source following, sample-and-hold, and self-reference operations as described herein.

In some examples, the circuit 200 may include an amplifier 275, which may amplify signals of the digit line 210 prior to a sensing operation. The amplifier 275 may include, for example, a transistor, a cascode, or any other charge or voltage amplifier. In such examples, a line between the sense component 130-*a* and the amplifier 275 may be referred to a signal line (e.g., signal line 280). In examples without an amplifier 275, the digit line 210 may connect directly with the sense component 130-*a*. Although the digit line 210 and the signal line 280 are identified as separate lines, the digit line 210, the signal line 280, and any other lines connecting a memory cell 105 with a sense component 130 may be referred to as a single access line in accordance with the present disclosure. Constituent portions of such an access line may be identified separately for the purposes of illustrating intervening components, and intervening signals, in various example configurations.

Sense component 130-*a* may include various transistors or amplifiers to detect and amplify a difference in signals, which may be referred to as latching. For example, sense component 130-*a* may include a sense amplifier that receives and compares the voltage of digit line 210 (e.g., as stored or latched at a first terminal 131-*a*) with a reference voltage of the reference line 270 (e.g., as stored or latched at a second terminal 132-*a*). An output of the sense amplifier may be driven to a higher (e.g., a positive) or a lower (e.g., negative or ground) voltage based on the comparison at the sense amplifier. For instance, if the digit line 210 (or signal line 280, where applicable) coupled with the sense component 130-*a* has a lower voltage than the reference line 270, the output of the sense component 130-*a* may be driven to a relatively lower voltage of a first sense component voltage source 265-*b* (e.g., a voltage of $V_1$, which may be a ground voltage substantially equal to $V_0$, or a negative voltage, for example). The sense component 130-*a* may latch the output of the sense amplifier to determine the logic state stored in the memory cell 105-*a* (e.g., detecting a logic 0 when the digit line 210 has a lower voltage than the reference line 270. If the digit line 210 (or signal line 280, where applicable) coupled with the sense component 130-*a* has a higher voltage than the reference line 270, the output of the sense component 130-*a* may be driven to the voltage of a second sense component voltage source 265-*c* (e.g., a voltage of $V_2$). The sense component 130-*a* may latch the output of the sense amplifier to determine the logic state stored in the memory cell 105-*a* (e.g., detecting a logic 1 when the digit line 210 has a higher voltage than the reference line 270). The latched output of the amplifier, corresponding to the detected logic state of memory cell 105-*a*, may then be output via an input/output (I/O) line 290 (e.g., through a column decoder 135 via input/output component 140 described with reference to FIG. 1).

To perform a write operation on the memory cell 105-*a*, a voltage may be applied across the capacitor 220. Various methods may be used. In one example, the selection component 250 may be activated through the word line 205 in order to electrically connect the capacitor 220 to the digit line 210. A voltage may be applied across capacitor 220 by controlling the voltage of cell plate 230 (e.g., through plate line 215) and cell bottom 240 (e.g., through digit line 210). For example, to write a logic 0, cell plate 230 may be taken high (e.g., applying a positive voltage to plate line 215), and cell bottom 240 may be taken low (e.g., virtually grounding or applying a negative voltage to digit line 210). The opposite process may be performed to write a logic 1, where cell plate 230 is taken low and cell bottom 240 is taken high. In some cases the voltage applied across the capacitor 220 during a write operation may have a magnitude equal to or greater than a saturation voltage of a ferroelectric material in the capacitor 220, such that the capacitor 220 is polarized, and thus maintains a charge even when the magnitude of applied voltage is reduced, or if a zero net voltage is applied across the capacitor 220.

Figure 3:
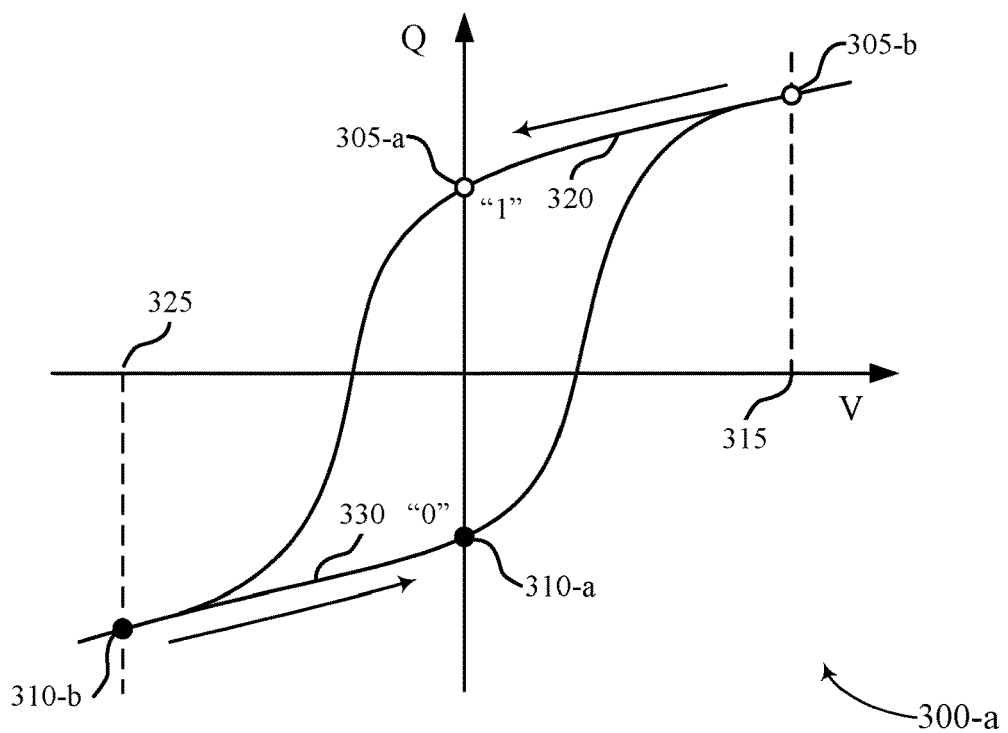
FIG. 3 illustrates an example of non-linear electrical properties with hysteresis plots for a memory cell that may support self-boost, source following, and sample-and-hold for accessing memory cells in accordance with various embodiments of the present disclosure.
Figure 3:
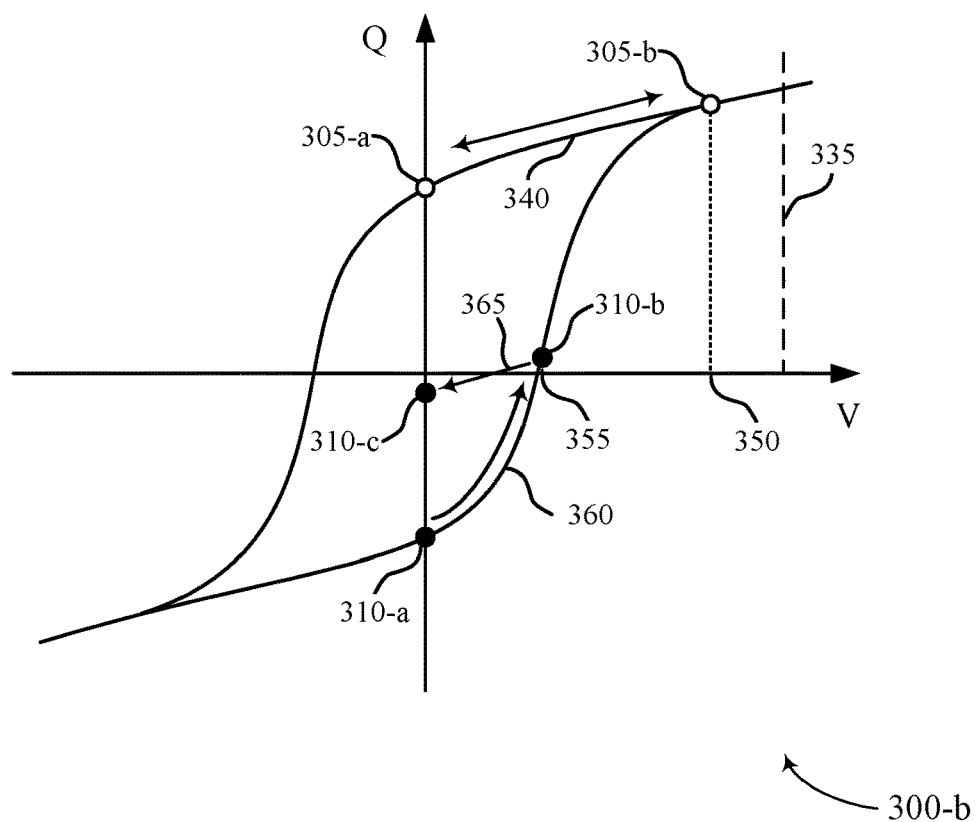

FIG. 3 illustrates an example of non-linear electrical properties with hysteresis plots 300-a and 300-b for a memory cell 105 that may support self-boost, source following, and sample-and-hold for accessing memory cells in accordance with various embodiments of the present disclosure. Hysteresis plots 300-a and 300-b may illustrate an example writing process and reading process, respectively, for a memory cell 105 employing a ferroelectric capacitor 220 as described with reference to FIG. 2. Hysteresis plots 300-a and 300-b depict the charge, Q, stored on the ferroelectric capacitor 220 as a function of a voltage difference, V, between the terminals of the ferroelectric capacitor 220 (e.g., when charge is permitted to flow into or out of the ferroelectric capacitor 220 according to the voltage difference, V).

A ferroelectric material is characterized by a spontaneous electric polarization, where the material may maintain a non-zero electric charge in the absence of an electric field. Example ferroelectric materials include barium titanate (BaTiO3), lead titanate (PbTiO3), lead zirconium titanate (PZT), and strontium bismuth tantalate (SBT). Ferroelectric capacitors 220 described herein may include these or other ferroelectric materials. Electric polarization within a ferroelectric capacitor 220 results in a net charge at the surface of the ferroelectric material, and attracts opposite charge through the terminals of the ferroelectric capacitor 220. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors without ferroelectric properties such as those used in conventional DRAM arrays. Employing ferroelectric materials may reduce the need to perform refresh operations as described above for some DRAM architectures.

Hysteresis plots 300-a and 300-b may be understood from the perspective of a single terminal of a ferroelectric capacitor 220. By way of example, if the ferroelectric material has a negative polarization, positive charge accumulates at the associated terminal of the ferroelectric capacitor 220. Likewise, if the ferroelectric material has a positive polarization, a negative charge accumulates at the associated terminal of the ferroelectric capacitor 220. Additionally, it should be understood that the voltages in hysteresis plots 300-a and 300-b represent a voltage difference across the capacitor (e.g., between the terminals of the ferroelectric capacitor 220) and are directional. For example, a positive voltage may be realized by applying a positive voltage to the perspective terminal (e.g., a cell bottom 240) and maintaining the reference terminal (e.g., a cell plate 230) at ground or virtual ground (or approximately zero volts (0V)). In some examples a negative voltage may be applied by maintaining the perspective terminal at ground and applying a positive voltage to the reference terminal. In other words, positive voltages may be applied to arrive at a negative voltage difference across the ferroelectric capacitor 220 and thereby negatively polarize the terminal in question. Similarly, two positive voltages, two negative voltages, or any combination of positive and negative voltages may be applied to the appropriate capacitor terminals to generate the voltage difference shown in hysteresis plots 300-a and 300-b.

As depicted in hysteresis plot 300-a, a ferroelectric material used in a ferroelectric capacitor 220 may maintain a positive or negative polarization when there is no net voltage difference between the terminals of the ferroelectric capacitor 220. For example, the hysteresis plot 300-a illustrates two possible polarization states, charge state 305-a and charge state 310-b, which may represent a positively saturated polarization state and a negatively saturated polarization state, respectively. Charge states 305-a and 310-a may be at a physical condition illustrating remnant polarization (Pr) values, which may refer to the polarization (or charge) that remains upon removing the external bias (e.g., voltage). The coercive voltage is the voltage at which the charge (or polarization) is zero. According to the example of hysteresis plot 300-a, charge state 305-a may represent a logic 1 when no voltage difference is applied to the ferroelectric capacitor 220, and charge state 310-a may represent a logic 0 when no voltage difference is applied to the ferroelectric capacitor 220. In some examples, the logic values of the respective charge states may be reversed to accommodate other schemes for operating a memory cell 105.

A logic 0 or 1 may be written to the memory cell by controlling the electric polarization of the ferroelectric material, and thus the charge on the capacitor terminals, by applying a net voltage difference across the ferroelectric capacitor 220. For example, voltage 315 may be a voltage equal to or greater than a positive saturation voltage, and applying the voltage 315 across the ferroelectric capacitor 220 may result in charge accumulation until charge state 305-b is reached (e.g., writing a logic 1). Upon removing the voltage 315 from the ferroelectric capacitor 220 (e.g., applying a zero net voltage across the terminals of the ferroelectric capacitor 220), the charge state of the ferroelectric capacitor 220 may follow the path 320 shown between charge state 305-b and the charge state 305-a at zero voltage. Similarly, voltage 325 may be a voltage equal to or lesser than a negative saturation voltage, and applying the voltage 325 across the ferroelectric capacitor 220 results in charge accumulation until charge state 310-b is reached (e.g., writing a logic 0). Upon removing the voltage 325 from the ferroelectric capacitor 220 (e.g., applying a zero net voltage across the terminals of the ferroelectric capacitor 220), the charge state of the ferroelectric capacitor 220 may follow the path 330 shown between charge state 310-b and the charge state 310-a at zero voltage. In some examples the voltage 315 and the voltage 325, representing saturation voltages, may have the same magnitude, but opposite polarity.

To read, or sense, the stored state of a ferroelectric capacitor 220, a voltage may be applied across the ferroelectric capacitor 220. In response to the applied voltage, the subsequent charge Q stored by the ferroelectric capacitor changes, and the degree of the change may depend on the initial polarization state. In other words, the resulting charge Q may depend on whether charge state 305-a or 310-a was initially stored. For example, hysteresis plot 300-b illustrates the reading of stored charge states 305-a and 310-a. A read voltage 335 may be applied, for example, as a voltage difference via a digit line 210 and a plate line 215 as discussed with reference to FIG. 2. The read voltage 335 may be applied across the ferroelectric capacitor 220 when a memory cell 105 is selected (e.g., by activating a selection component 250 as described with reference to FIG. 2). Upon applying the read voltage 335 to the ferroelectric capacitor 220, charge may flow into or out of the ferroelectric capacitor 220 via the digit line 210 and plate line 215, and different charge states may result depending on whether the ferroelectric capacitor 220 was at charge state 305-*a* (e.g., a logic 1) or at charge state 310-*a* (e.g., a logic 0). Although read voltage 335 is shown as a positive voltage across the ferroelectric capacitor 220, in alternative operations a read voltage may be a negative voltage across the ferroelectric capacitor 220.

When performing a read operation on a ferroelectric capacitor 220 at the charge state 305-*a* (e.g., a logic 1), additional positive charge may accumulate across the ferroelectric capacitor 220, and the charge state may follow path 340 until reaching the charge and voltage of charge state 305-*b*. Such a read operation may not change the remnant polarization of the ferroelectric capacitor 220 that stored charge state 305-*a*, and thus after performing the read operation the ferroelectric capacitor 220 may return to charge state 305-*a* when the read voltage 335 is removed (e.g., by applying a zero net voltage across the ferroelectric capacitor 220). Thus, performing a read operation with a positive read voltage on a ferroelectric capacitor 220 with a charge state 305-*a* may be considered a non-destructive read process.

When performing the read operation on the ferroelectric capacitor 220 at the charge state 310-*a* (e.g., a logic 0), the stored charge may reverse polarity as a net positive charge accumulates across the ferroelectric capacitor 220, and the charge state may follow path 360 until reaching the charge and voltage of charge state 310-*b*. In various examples, a read operation with a positive read voltage (e.g., read voltage 335) may result in a reduction or a reversal of remnant polarization of the capacitor 220 that stored charge state 310-*a*. In other words, according to the properties of the ferroelectric material, after performing the read operation the ferroelectric capacitor 220 may not return to charge state 310-*a* when the read voltage 335 is removed (e.g., by applying a zero net voltage across the capacitor 220). Rather, when applying a zero net voltage across the ferroelectric capacitor 220 after a read operation with read voltage 335, the charge state may follow path 365 from charge state 310-*b* to charge state 310-*c*, illustrating a net reduction in polarization magnitude (i.e., a less negatively polarized charge state than initial charge state 310-*a*). Thus, performing a read operation with a positive read voltage on a ferroelectric capacitor 220 with a charge state 310-*a* may be a destructive read process. However, in some sensing schemes, a reduced remnant polarization may still be read as the same stored logic state as a saturated remnant polarization state (e.g., supporting detection of a logic 0 from both charge state 310-*a* and charge state 310-*c*), thereby providing a degree of non-volatility for a memory cell 105 with respect to read operations.

The transition from charge state 310-*a* to charge state 310-*c* may be illustrative of a sensing operation that is associated with a partial reduction and/or partial reversal in polarization of a ferroelectric capacitor 220 of a memory cell (e.g., a reduction in the magnitude of charge Q from charge state 310-*a* to charge state 310-*c*). In various examples, the amount of change in polarization of a ferroelectric capacitor 220 of a memory cell 105 as a result of a sensing operation may be selected according to a particular sensing scheme. In some examples sensing operations having a greater change in polarization of a ferroelectric capacitor 220 of a memory cell 105 may be associated with relatively greater robustness in detecting a logic state of a memory cell 105. In some sensing schemes, sensing a logic 0 of a ferroelectric capacitor 220 at a charge state 310-*a* may result in a full reversal of polarization, with the ferroelectric capacitor 220 transitioning from charge state 310-*a* to 305-*a* after the sensing operation. Such sensing schemes may be referred to as a "2Pr" sensing scheme because the sensing operations may be based on a transition of charge equal to two times the magnitude saturation polarization of a ferroelectric capacitor 220 of the memory cell 105 being sensed.

The position of charge states 305-*b* and charge state 310-*b* after initiating a read operation may depend on a number of factors, including the specific sensing scheme and circuitry. In some cases, the final charge may depend on the net capacitance of the digit line 210 coupled with the memory cell 105, which may include an intrinsic capacitance 260, integrator capacitors, and the like. For example, if a ferroelectric capacitor 220 is electrically coupled with the digit line 210 and voltage 335 is applied to the digit line, the voltage of the digit line 210 may drop when the memory cell 105 is selected due to charge flowing from the net capacitance of the digit line 210 to the ferroelectric capacitor 220 and the. Thus, a voltage measured at a sense component 130 may not be equal to the read voltage 335 and instead may depend on the voltage of the digit line 210 following a period of charge sharing. The position of charge states 305-*b* and 310-*b* on hysteresis plot 300 upon initiating a read operation may depend on the net capacitance of the digit line 210 and may be determined through a load-line analysis— i.e., charge states 305-*b* and 310-*b* may be defined with respect to the net capacitance of the digit line 210. As a result, the voltage of the ferroelectric capacitor 220 after initiating a read operation (e.g., voltage 350 when reading the ferroelectric capacitor 220 that stored charge state 305-*a*, or voltage 355 when reading the ferroelectric capacitor 220 that stored charge state 310-*a*), may be different and may depend on the initial state of the ferroelectric capacitor 220.

The initial state of the ferroelectric capacitor 220 may be determined by comparing the resultant voltage of a digit line 210 (or signal line 280, where applicable) with a reference voltage (e.g., via a reference line 270 as described with reference to FIG. 2). In some examples the digit line voltage may be the final voltage across the ferroelectric capacitor 220 (e.g., voltage 350 when reading the ferroelectric capacitor 220 having a stored charge state 305-*a*, or voltage 355 when reading the ferroelectric capacitor 220 having a stored charge state 310-*a*). In some examples the digit line voltage may be the difference between voltage 335 and the final voltage across the capacitor 220 (e.g., (voltage 335—voltage 350) when reading the ferroelectric capacitor 220 having a stored charge state 305-*a*, or (voltage 335—voltage 355) when reading the ferroelectric capacitor 220 having a stored charge state 310-*a*).

In some sensing schemes a reference voltage may be generated such that the reference voltage is between the possible resultant voltages when reading different logic states. For example, a reference voltage may be selected to be lower than the resulting digit line voltage when reading a logic 1, and higher than the resulting digit line voltage when reading a logic 0. When reading a signal voltage across a ferroelectric capacitor 220 of a memory cell 105, for example, the reference voltage may be an average of voltage 350 and voltage 355. During comparison by the sense component 130, the sensed digit line voltage may be determined to be higher or lower than the reference voltage, and the stored logic state of the memory cell 105 (i.e., a logic 0 or 1) may thus be determined.

Figure 4:
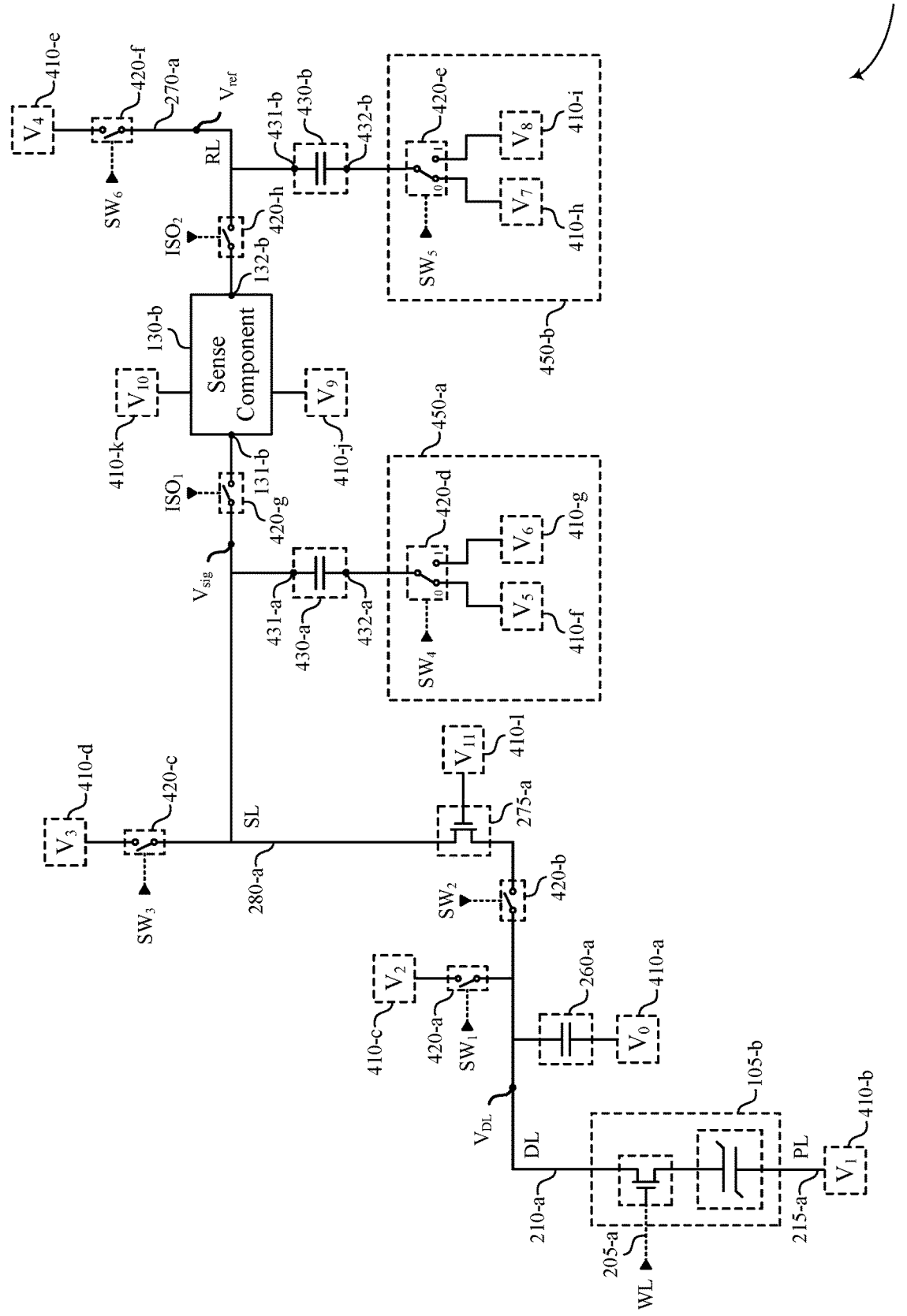
FIG. 4 illustrates an example of a circuit that may support self-boost and sample-and-hold for accessing memory cells in accordance with various embodiments of the present disclosure.

FIG. 4 illustrates an example of a circuit 400 that may support self-boost and sample-and-hold for accessing memory cells in accordance with various embodiments of the present disclosure. The circuit 400 includes a sense component 130-b for sensing a logic state of a memory cell 105-b. Electrical signals may be communicated between the sense component 130-b and the memory cell 105-b via a digit line 210-a and a signal line 280-a, which may, in combination, be referred to as a single access line of the memory cell 105-b. Signals of the access line may be illustrated by voltage $V_{DL}$ on the digit line 210-a, and $V_{sig}$ on the signal line 280-a, as shown. The example circuit 400 may include an amplifier 275-a coupled between the digit line 210-a and the signal line 280-a, which may be enabled by voltage source 410-l. The circuit 400 may also include a word line 205-a for selecting or deselecting the memory cell 105-b (e.g., by way of logic signal WL) and a reference line 270-a for providing a reference signal (e.g., $V_{ref}$, as shown) for comparison with a signal of the signal line 280-a when detecting a logic state of the memory cell 105-b. The circuit 400 may also include a plate line 215-a for accessing a cell plate of a capacitor of the memory cell 105-b. Thus, the memory cell 105-b may represent a memory cell coupled between a first access line (e.g., the digit line 210-a and the signal line 280-a) and a second access line (e.g., the word line 205-a).

The circuit 400 may include a variety of voltage sources 410, which may be coupled with various voltage supplies and/or common grounding or virtual grounding points of a memory device that includes the example circuit 400.

A voltage source 410-a may represent a common grounding point (e.g., a chassis ground, a neutral point, etc.), which may be associated with a common reference voltage having a voltage $V_0$, from which other voltages are defined. The voltage source 410-a may be coupled with the digit line 210-a via the intrinsic capacitance 260-a of the digit line 210-a.

A voltage source 410-b having a voltage $V_1$ may represent a plate line voltage source, and may be coupled with the memory cell 105-b via a plate line 215-a of the memory cell 105-b. In some examples the voltage source 410-b may be used for write operations, including those operations described with reference to hysteresis plot 300-a of FIG. 3.

A voltage source 410-c having a voltage $V_2$ may represent a digit line voltage source, and may be coupled with the digit line 210-a via a switching component 420-a, which may be activated or deactivated by a logical signal $SW_1$.

A voltage source 410-d having a voltage $V_3$ may represent a signal line precharge voltage source, and may be coupled with the signal line 280-a via a switching component 420-c, which may be activated or deactivated by a logical signal $SW_3$.

A voltage source 410-e having a voltage $V_4$ may represent a reference signal voltage source, and may be coupled with the reference line 270-a via a switching component 420-f, which may be activated or deactivated by a logical signal $SW_6$.

A voltage source 410-1 having a voltage $V_{11}$ may represent a digit line voltage source, and may be coupled with an amplifier 275-a which may be an example of the amplifier 275 described with reference to FIG. 2. For example, the amplifier 275-a may be a transistor, and the voltage source 410-1 may be coupled with the gate of the transistor. The amplifier 275-a may be coupled with the signal line 280-a at a first terminal, and the digit line 210-a at a second terminal. The amplifier 275-a may provide a conversion of signals between the digit line 210-a and the signal line 280-a. For example, the amplifier 275-a may permit a flow of charge (e.g., electrical current) from the signal line 280-a to the digit line 210-a, as fed or enabled by the voltage source 410-1, upon a reduction in voltage of the digit line 210-a (e.g., upon selection of the memory cell 105-b). A relatively small flow of charge to the digit line 210-a may be associated with a relatively small change in voltage of the signal line 280-a, whereas a relatively large flow of charge to the digit line 210-a may be associated with a relatively large change in voltage of the signal line 280-a. According to the net capacitance of the signal line 280-a, for example, the signal line 280-a may undergo a relatively small change in voltage or a relatively large change in voltage depending on the flow of charge across the amplifier 275-a after selecting the memory cell 105-b. In some examples the amplifier 275-a may be isolated from the digit line 210-a by a switching component 420-b, which may be activated or deactivated by a logical signal $SW_2$. The amplifier 275-a may also referred to as a "voltage regulator" or a "bias component," relating to how the amplifier 275-a regulates a flow of charge in response to the voltage of the digit line 210-a.

The circuit may also include a first integrator capacitor 430-a and a second integrator capacitor 430-b, which may each be coupled with a respective variable voltage source 450. For example, the first integrator capacitor 430-a may be coupled with the signal line 280-a at a first terminal 431-a, and coupled with a variable voltage source 450-a at a second terminal 432-a. The second integrator capacitor 430-b may be coupled with the reference line 270-a at a first terminal 431-b, and coupled with a variable voltage source 450-b at a second terminal 432-b In the example of circuit 400, the variable voltage source 450-a may include a voltage source 410-f having a voltage $V_5$ and a voltage source 410-g having a voltage $V_6$, which may be selected for connection with the first integrator capacitor 430-a by a switching component 420-d by way of a logical signal $SW_4$. In some examples the voltage source 410-f may be coupled with a common grounding point (not shown). In other examples the voltage source 410-f may be coupled with a voltage supply that provides a positive or negative voltage. Voltage source 410-g may be coupled with a voltage supply having a higher voltage than that of voltage source 410-f, thereby providing the boosting functions as described herein (e.g., in accordance with the difference in voltage between voltage source 410-g and 410-f, equal to $V_6-V_5$, or simply $V_6$ when the voltage source 410-f is grounded).

In the example of circuit 400, the variable voltage source 450-b may include a voltage source 410-h having a voltage $V_7$ and a voltage source 410-i having a voltage $V_s$, which may be selected for connection with the second integrator capacitor 430-b by a switching component 420-e by way of a logical signal $SW_5$. In some examples the voltage source 410-h may be coupled with a common grounding point (not shown). In other examples the voltage source 410-h may be coupled with a voltage supply that provides a positive or negative voltage. Voltage source 410-i may be coupled with a voltage supply having a higher voltage than that of voltage source 410-h, thereby providing the boosting functions as described herein (e.g., in accordance with the difference in voltage between voltage source 410-i and 410-h, equal to $V_8-V_7$, or simply $V_8$ when the voltage source 410-h is grounded).

Although circuit 400 is shown as including two variable voltage sources 450, some configurations in accordance with the present disclosure may include a single, common variable voltage source 450. For example, a first voltage source 410 of a common variable voltage source 450 may be coupled with both the second terminal 432-a of the first integrator capacitor 430-a and the second terminal 432-b of the second integrator capacitor 430-b when a switching component 420 of the common variable voltage source 450 is deactivated, and a second voltage source 410 of the common variable voltage source 450 may be coupled with both the second terminal 432-a of the first integrator capacitor 430-a and the second terminal 432-b of the second integrator capacitor 430-b when the selection component 420 of the common variable voltage source 450 is activated. In some examples that use a common variable voltage source 450, the source voltage provided to the second terminal 432-a of the first integrator capacitor 430-a may be different to the source voltage provided to the second terminal 432-b of the second integrator capacitor 430-b due to differences in the circuit (e.g., conductor length, width, resistance, capacitance, etc.) between the variable voltage source 450 and each of the integrator capacitors 430.

Further, although the variable voltage source 450 is illustrated as including two voltage sources 410 and a selection component 420, a variable voltage source 450 supporting the operations herein may include other configurations, such as a voltage buffer that provides a variable voltage to one or both of the second terminal 432-a of the first integrator capacitor 430-a and the second terminal 432-b of the second integrator capacitor 430-b.

To support various operations described herein, the sense component 130-b may be isolated from portions of the circuit 400. For example, the sense component 130-b may be coupled with the signal line 280-a via a switching component 420-g (e.g., an isolation component), which may be activated or deactivated by a logical signal $ISO_1$. Additionally or alternatively, the sense component 130-b may be coupled with the reference line 270-a via a switching component 420-h (e.g., an isolation component), which may be activated or deactivated by a logical signal $ISO_2$. Further, the sense component 130-b may be coupled with a voltage source 410-j having a voltage $V_9$ and a voltage source 410-k having a voltage of $V_{10}$, which may be examples of sense component voltage sources 256-b and 265-c, described with reference to FIG. 2, respectively.

Each of the logical signals illustrated in circuit 400 may be provided by a memory controller (not shown), such as a memory controller 150 described with reference to FIG. 1. In some examples, certain logical signals may be provided by other components. For example, logical signal WL may be provided by a row decoder (not shown), such as a row decoder 125 described with reference to FIG. 1.

In various examples, voltage sources 410 may be coupled with different configurations of voltage supplies and/or common grounding or virtual grounding points of a memory device that includes the example circuit 400. For example, in some embodiments voltage sources 410-a, 410-f, 410-h, or 410-j, or any combination thereof, may be coupled with the same ground point or virtual ground point, and may provide substantially the same reference voltage for various operations of accessing the memory cell 105-b. In some embodiments, several voltage sources 410 may be coupled with the same voltage supply of a memory device. For example, in some embodiments, voltage sources 410-c, 410-d, 410-g, 410-i, or 410-k, or any combination thereof, may be coupled with a voltage supply having a certain voltage (e.g., a voltage of 1.5V, which may be referred to as "VARY"). In such embodiments, the signal line 280-a may be boosted to a voltage substantially equal to 2*VARY, or approximately 3.0V, prior to selecting the memory cell 105-b via word line 205-a for sensing. Thus, in accordance with embodiments of the present disclosure, self-boost operations may overcome a need to provide a relatively higher voltage supply for sense operations (e.g., a voltage source of 3.0V or more, which in some applications may refer to a "positive pump" voltage of $V_{pp}$). In other examples, voltage sources 410-g and 410-i may be coupled with a different voltage supply than other voltage supplies (e.g., a voltage of 1.2V, which may be referred to as "PDS"), which may thus be associated with a voltage boost of 1.2V.

In some examples the voltage sources 410-j and 410-k may be selected according to particular input/output parameters. For example, voltage sources 410-j and 410-k may be substantially at 0V and 1V, respectively, in accordance with certain input/output component conventions such as certain DRAM conventions. Although voltage sources 410 may be coupled with common voltage supplies and/or grounding points, the voltage of each of the voltage sources 410 coupled with a common voltage supply or common grounding point may be different due to various differences in the circuit (e.g., conductor length, width, resistance, capacitance, etc.) between the respective voltage sources 410 and the associated common voltage supply or common grounding point.

Voltage source 410-e may provide a reference voltage for sensing the logic state of the memory cell 105-b, such that $V_4$ is an average voltage between signal line voltage associated with sensing a logic 1 and a logic 0. In some examples, a voltage of $V_4$ may be provided as a voltage dropped from a voltage supply of the memory device, which may be the same voltage supply coupled with other voltage sources 410. For example, $V_4$ may be provided by connecting voltage source 410-e with a same voltage supply as voltage source 410-d, but with an intervening electrical load (e.g., a resistive load or capacitance) between the voltage supply and the voltage source 410-e).

Figure 5:
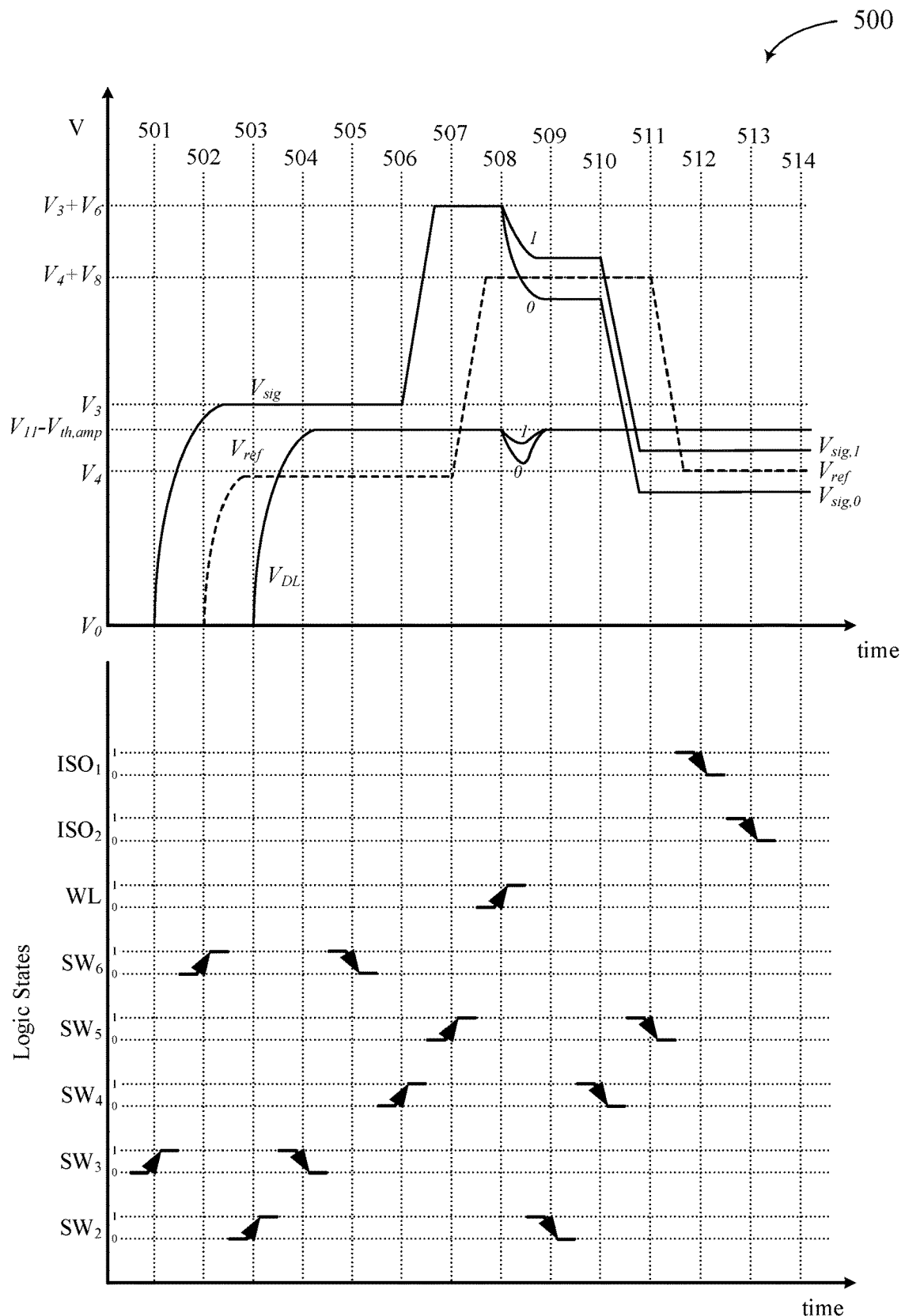
FIG. 5 shows a timing diagram illustrating operations of an example access procedure that may support self-boost for accessing memory cells in accordance with various embodiments of the present disclosure.

FIG. 5 shows a timing diagram 500 illustrating operations of an example access procedure that may support self-boost for accessing memory cells in accordance with various embodiments of the present disclosure. The example access procedure is described with reference to components of the example circuit 400 described with reference to FIG. 4.

In the example of timing diagram 500, voltage sources 410-a, 410-f and 410-h are considered to be grounded, and therefore at a zero voltage (e.g., $V_0$=0V, $V_5$=0V, $V_7$=0V). However, in other examples voltage sources 410-a, 410-f, and 410-h may be at non-zero voltages, and the voltages of timing diagram 500 may thus be adjusted accordingly. In some examples, prior to initiating the operations of timing diagram 500, the digit line 210-a and the plate line 215-a may be controlled to the same voltage, which may minimize charge leakage across the memory cell 105-b. For example, according to the timing diagram 500, the digit line 210-a has an initial voltage of 0V, which may be the same as the initial voltage of the plate line 215-a. In other examples, the digit line 210-a and the plate line 215-a may have some other initial voltage different from the ground voltage.

At 501, the access procedure may include activating switching component 420-c (e.g., by activating logical signal $SW_3$). Activating switching component 420-c may connect voltage source 410-d with the signal line 280-a, and accordingly the voltage of signal line 280-a may rise to voltage level $V_3$ as charge flows into the integrator capacitor 430-a. Thus, activating switching component 420-c may initiate a precharging operation for the integrator capacitor 430-a. For example, at 501 the switching component 420-d may be deactivated, such that the voltage source 410-f (e.g., a ground or virtual ground voltage at 0V) is coupled with the second terminal 432-a of the integrator capacitor 430-a, and the voltage source 410-d is coupled with the first terminal 431-a of the integrator capacitor 430-a. Thus, the integrator capacitor 430-a may be charged according to the voltage difference between the voltage source 410-d and the voltage source 410-f.

At 502, the access procedure may include activating switching component 420-f (e.g., by activating logical signal $SW_6$). Activating switching component 420-f may connect voltage source 410-e with the reference line 270-a, and accordingly the voltage of reference line 270-a may rise to voltage level $V_4$ as charge flows into the integrator capacitor 430-b. Thus, activating switching component 420-f may initiate a precharging operation for the integrator capacitor 430-b. For example, at 502 the switching component 420-e may be deactivated, such that the voltage source 410-h (e.g., a ground or virtual ground voltage at 0V) is coupled with the second terminal 432-b of the integrator capacitor 430-b, and the voltage source 410-e is coupled with the first terminal 431-b of the integrator capacitor 430-b. Thus, the integrator capacitor 430-b may be charged according to the voltage difference between the voltage source 410-e and the voltage source 410-h.

At 503, the access procedure may include activating switching component 420-b (e.g., by activating logical signal $SW_2$). Activating switching component 420-b may initiate a precharging operation for the digit line 210-a. For example, activating switching component 420-b may connect the signal line 280-a with the digit line 210-a, which may be coupled with the voltage source 410-a (e.g., a ground or virtual ground voltage) by way of the intrinsic capacitance 260-a. As fed by the voltage source 410-d, charge may flow through the amplifier 275-a and build on the digit line 210-a, causing the voltage on the digit line 210-a to rise. The voltage of the digit line 210-a may rise until the threshold voltage of the amplifier 275-a (e.g., threshold voltage $V_{th,amp}$) is no longer exceeded. Thus, after activating switching component 420-b, the voltage of the digit line 210-a may rise to a voltage level of $V_{11}-V_{th,amp}$ as charge flows from the signal line (e.g., as fed by the voltage source 410-d, and the digit line 210-a, including intrinsic capacitance 260-a, may be charged according to the voltage difference between the voltage level $V_{11}-V_{th,amp}$ and the voltage source 410-a (e.g., 0V). In some examples, the voltage level $V_{11}$ may be selected such that the digit line 210-a is precharged to substantially the same level as the signal line 280-a. For example, the voltage level $V_{11}$ may be set at a level of $V_3+V_{th,amp}$, which may be provided by a voltage supply having a voltage level greater than voltage source 410-d. Thus, in some examples the digit line 210-a may rise to a voltage level equal to voltage level $V_3$ in response to activating switching component 420-b at 503.

Additionally or alternatively, in some examples the digit line 210-a may be precharged by the voltage source 410-c. For example, prior to activating switching component 420-b, the access procedure 500 may include activating switching component 420-a (e.g., by activating logical signal $SW_1$). Activating switching component 420-a may initiate an alternative precharging operation for the digit line 210-a that is not shown in timing diagram 500. As fed by the voltage source 410-c, charge may build on the digit line 210-a, causing the voltage on the digit line 210-a to match the voltage level $V_2$. In some examples the voltage level $V_2$ may be substantially equal to the voltage level $V_3$, such that the digit line 210-a and the signal line 280-a are precharged to the same voltage prior to activating switching component 420-b. In some examples, precharging the digit line 210-a with the voltage source 410-c may reduce power consumption and/or reduce precharge time associated with accessing the memory cell 105-b. Following a precharge of the digit line 210-a by the voltage source 410-c, the access procedure may include activating switching component 420-b (e.g., by activating logical signal $SW_2$) to connect the signal line 280-a to the digit line 210-a.

At 504, the access procedure may include deactivating the switching component 420-c (e.g., by deactivating logical signal $SW_3$). Deactivating switching component 420-c may isolate voltage source 410-d from the signal line 280-a, and the voltage of signal line 280-a may hold at voltage level $V_3$. Upon deactivating the switching component 420-c the signal line 280-a, and thus the first terminal 431-a of the integrator capacitor 430-a, may be floating, and the signal line 280-a may maintain a level of charge according to the capacitance of the signal line 280-a, including the capacitance of the integrator capacitor 430-a.

At 505, the access procedure may include deactivating the switching component 420-f (e.g., by deactivating logical signal $SW_6$). Deactivating switching component 420-f may isolate voltage source 410-i from the reference line 270-a, and the voltage of reference line 270-a may hold at voltage level $V_4$. Upon deactivating the switching component 420-f the reference line 270-a, and thus the first terminal 431-b of the integrator capacitor 430-b, may be floating, and the reference line 270-a may maintain a level of charge according to the capacitance of the signal line 270-a, including the capacitance of the integrator capacitor 430-b.

At 506, the access procedure may include activating switching component 420-d (e.g., by activating logical signal SW4). Activating switching component 420-d may cause a transition from the voltage source 410-f being coupled with the second terminal 432-a of the integrator capacitor 430-a to the voltage source 410-g being coupled with the second terminal 432-a of the integrator capacitor 430-a. By connecting the second terminal 432-a of the integrator capacitor 430-a to a voltage source at a higher voltage, the charge stored by the integrator capacitor 430-a may be boosted to a higher voltage, and accordingly the voltage of signal line 280-a, coupled with the first terminal 431-a of the integrator capacitor 430-a, may rise to voltage level ($V_3+V_6$). Thus, activating switching component 420-d may initiate a boosting operation for the integrator capacitor 430-a.

At 507, the access procedure may include activating switching component 420-e (e.g., by activating logical signal $SW_5$). Activating switching component 420-e may cause a transition from the voltage source 410-h being coupled with the second terminal 432-b of the integrator capacitor 430-b to the voltage source 410-i being coupled with the second terminal 432-b of the integrator capacitor 430-b. By connecting the second terminal 432-b of the integrator capacitor 430-b to a voltage source at a higher voltage, the charge stored by the integrator capacitor 430-b may be boosted to a higher voltage, and accordingly the voltage of reference line 270-a, coupled with the first terminal 431-b of the integrator capacitor 430-b, may rise to voltage level ($V_4+V_8$). Thus, activating switching component 420-e may initiate a boosting operation for the integrator capacitor 430-b.

At 508, the access procedure may include selecting the memory cell 105-b (e.g., by activating a word line via logical signal WL). Selecting the memory cell 105-b may cause a capacitor of the memory cell 105-b to be coupled with the digit line 210-a. Accordingly, charge may be shared between the memory cell 105-b, the digit line 210-a, and the signal line 280-*a*, which may depend on the logic state (e.g., the charge and/or polarization) stored in the memory cell 105-*b*.

For example, when the memory cell 105-*b* stores a logic 1, the capacitor of the memory cell 105-*b* may store a positive charge by way of a positive polarization (e.g., a charge state 305-*a* as described with reference to FIG. 3). Thus, when memory cell 105-*b* storing a logic 1 is selected, a relatively small amount of charge may flow from the digit line 210-*a* to the memory cell 105-*b*. As charge flows from the digit line 210-*a* to the memory cell 105-*b*, the voltage of the digit line 210-*a* may drop, which may allow the threshold voltage of the amplifier 275-*a* to be exceeded. When the threshold voltage of the amplifier 275-*a* is exceeded, charge may flow from the signal line 280-*a* (e.g., from the integrator capacitor 430-*a*) to the digit line 210-*a* across the amplifier 275-*a*, as well as a relatively small amount of charge from the voltage source 410-1, depending on the characteristics of the amplifier 275-*a*. Accordingly, charge may flow to the digit line 210-*a* until the voltage of the digit line 210-*a* returns to the voltage level equal to $V_{11}-V_{th,amp}$. When selecting the memory cell 105-*b* storing a logic 1, because a relatively small amount of charge flows into the memory cell 105-*b*, the signal line 280-*a* may undergo a relatively small voltage drop after selecting the memory cell 105-*b*, illustrated by the voltage of $V_{sig,1}$.

Alternatively, when the memory cell 105-*b* stores a logic 0, the capacitor of the memory cell 105-*b* may store a negative charge by way of a negative polarization (e.g., charge state 310-*a* as described with reference to FIG. 3). Thus, when memory cell 105-*b* storing a logic 0 is selected, a relatively large amount of charge may flow from the digit line 210-*a* to the memory cell 105-*b*. Accordingly, the signal line 280-*a* may undergo a relatively larger voltage drop, illustrated by the voltage of $V_{sig,0}$, as charge flows through the amplifier 275-*a* to return the digit line to the voltage level $V_{11}-V_{th,amp}$, such that the threshold voltage $V_{th,amp}$ of the amplifier 275-*a* is no longer exceeded. In some examples, selecting the memory cell 105-*b* storing a logic 0 may result in a partial loss of polarization of a capacitor of the memory cell 105-*b*. In examples where a 2Pr sensing operation is employed, selecting the memory cell 105-*b* storing a logic 0 may result in a reversal of saturation polarization of the capacitor of the memory cell 105-*b*, such that an amount of charge associated with twice the saturation polarization flows into the memory cell 105-*b*. In either case, selecting a memory cell 105-*b* storing a logic 0 according to the present example may require a subsequent refresh or rewrite operation.

At 509, the access procedure may include isolating the digit line 210-*a* from the signal line 280-*a* by deactivating the switching component 420-*b* (e.g., by deactivating logical signal $SW_2$). Isolating the digit line 210-*a* from the signal line 280-*a* may prevent additional charge from being shared between the digit line 210-*a* and the signal line 280-*a*, including charge sharing across the amplifier 275-*a* that may be caused by the threshold voltage of the amplifier 275-*a* being exceeded as a result of subsequent sensing operations.

At 510, the access procedure may include deactivating switching component 420-*d* (e.g., by deactivating logical signal $SW_4$). Deactivating switching component 420-*d* may cause a transition from the voltage source 410-*g* being coupled with the second terminal 432-*a* of the integrator capacitor 430-*a* to the voltage source 410-*f* being coupled with the second terminal 432-*a* of the integrator capacitor 430-*a*. By connecting the second terminal 432-*a* of the integrator capacitor 430-*a* to the voltage source at a lower voltage, the charge stored by the integrator capacitor 430-*b* may be shifted to a lower voltage, and accordingly the voltage of signal line 280-*a*, coupled with the first terminal 431-*a* of the integrator capacitor 430-*a*, may drop by voltage level of ($V_6-V_5$, or just $V_6$ in the event that voltage source 410-*f* is coupled with a common ground point). Thus, deactivating switching component 420-*d* may initiate a shifting operation for the integrator capacitor 430-*a*, which may reduce the voltage of the signal line 280-*a* to a level that may be read by the sense component 130-*b* (e.g., a voltage between $V_9$ and $V_{10}$, representing the low and high voltage sources of the sense component 130-*b*). For example, after the shifting operation of 510, $V_{sig,1}$ may be approximately 1.5V as sensed by the sense component 130-*b*, and $V_{sig,0}$ may be approximately 1.2V as sensed by the sense component 130-*b*.

At 511, the access procedure may include deactivating switching component 420-*e* (e.g., by deactivating logical signal $SW_5$). Deactivating switching component 420-*e* may cause a transition from the voltage source 410-*i* being coupled with the second terminal 432-*b* of the integrator capacitor 430-*b* to the voltage source 410-*h* being coupled with the second terminal 432-*b* of the integrator capacitor 430-*b*. By connecting the second terminal 432-*b* of the integrator capacitor 430-*b* to the voltage source at a lower voltage, the charge stored by the integrator capacitor 430-*b* may be shifted to a lower voltage, and accordingly the voltage of reference line 270-*a*, coupled with the first terminal 431-*b* of the integrator capacitor 430-*b*, may drop by voltage level of ($V_8-V_7$, or just $V_8$ in the event that voltage source 410-*h* is coupled with a common ground point). Thus, deactivating switching component 420-*e* may initiate a shifting operation for the integrator capacitor 430-*b*, which may reduce the voltage of the reference line 270-*a* to a level that may be read by the sense component 130-*b* (e.g., a voltage between $V_9$ and $V_{10}$). For example, after the shifting operation of 511, $V_{ref}$ may be approximately 1.35V as sensed by the sense component 130-*b*.

At 512 the access procedure may include isolating the sense component 130-*b* from the signal line 280-*a* by deactivating switching component 420-*g* (e.g., by deactivating logical signal $ISO_1$). Isolating the sense component 130-*b* from the signal line 280-*a* may allow the sense component 130-*b* to store a voltage and/or charge associated with the signal line voltage (e.g., $V_{sig}$, at the first terminal 131-*b* of the sense component 130-*b*) prior to determining the logic state stored in the memory cell 105-*b*.

At 513 the access procedure may include isolating the sense component 130-*b* from the reference line 270-*a* by deactivating switching component 420-*h* (e.g., by deactivating logical signal $ISO_2$). Isolating the sense component 130-*b* from the reference line 270-*a* may allow the sense component 130-*b* to store a voltage and/or charge associated with the reference line voltage (e.g., $V_{ref}$, at the second terminal 132-*b* of the sense component 130-*b*) prior to determining the logic state stored in the memory cell 105-*b*.

At 514 the access procedure may include detecting a difference between the stored voltages at the first terminal 131-*b* and the second terminal 132-*b* of the sense component 130*b*. For example, if the signal stored at the first terminal 131-*b* is greater than the signal stored at the second terminal 132-*b* (e.g., $V_{sig,1}>V_{ref}$), the sense component 130-*b* may output a voltage equal to the high voltage source of the sense component (e.g., $V_{10}$, associated with voltage source 410-*k*). If the signal stored at the first terminal 131-*b* is less than the signal stored at the second terminal 132-*b* (e.g., $V_{sig,0}<V_{ref}$), the sense component 130-*b* may output a voltage equal to the low voltage source of the sense component (e.g., $V_9$, associated with voltage source 410-$j$).

Although illustrated as separate operations occurring at different times, certain operations may occur simultaneously, or in a different order. In some examples, various operations may be advantageously initiated simultaneously in order to reduce the amount of time required to sense a logic state of the memory cell 105-$b$. For example, the initiation of precharging at 501 and 502 may occur in an opposite order, or simultaneously (e.g., when logical signals $SW_3$ and $SW_6$ are driven as a common logical signal). Further, connecting the digit line 210-$a$ with the signal line 280-$a$ at 503 may occur prior to 501 and/or 502, or all three operations may occur simultaneously. Boosting the signal line 280-$a$ at 506 and boosting the reference line 270-$a$ at 507 may also occur in an opposite order, or simultaneously (e.g., when using a common variable voltage source 450, or when logical signals $SW_4$ and $SW_5$ are driven as a common logical signal). Similarly, shifting the signal line 280-$a$ at 510 and shifting the reference line 270-$a$ at 511 may also occur in an opposite order or simultaneously. In some examples, isolating the sense component 130-$b$ from the signal line 280-$a$ at 512 and isolating the sense component 130-$b$ from the reference line 270-$a$ at 513 may occur in an opposite order, or simultaneously (e.g., when logical signals $ISO_1$ and $ISO_2$ are driven as a common logical signal).

In some examples, boosting and shifting of the reference line 270-$a$ may be eliminated altogether, and thus operations at 508 and 511 may be omitted. Thus, in some embodiments, the second integrator capacitor 430-$b$ and the second variable voltage source 450-$b$ may be omitted from the circuit 400, and self-boost may still be supported for signal generation when accessing the memory cell 105-$b$.

The order of operations shown in timing diagram 500 is for illustration only, and various other orders and combinations of steps may be performed to support self-boost in accordance with the present disclosure. Further, the timing of the operations of timing diagram 500 is also for illustration purposes only, and is not meant to indicate a particular relative duration between one operation and another. Various operations may occur over a duration that is relatively shorter or relatively longer than illustrated in various embodiments of self-boost in accordance with the present disclosure.

The transitions of the logical signals of the timing diagram 500 are illustrative of transitions from one state to another, and generally reflect transitions between an enabled or activated state (e.g., state "0") and a disabled or deactivated state (e.g., state "1") as associated with a particular numbered operation. In various examples the states may be associated with a particular voltage of the logical signal (e.g., a logical input voltage applied to a gate of a transistor operating as a switch), and the change in voltage from one state to another may not be instantaneous. Rather, in some examples a voltage associated with a logical signal may follow a curve over time from one logical state to another. Thus, the transitions shown in timing diagram 500 are not necessarily indicative of an instantaneous transition. Further, the initial state of a logical signal associated with a transition at a numbered operation may have been arrived during various times preceding the numbered operation while still supporting the described transitions and associated operations.

Figure 6:
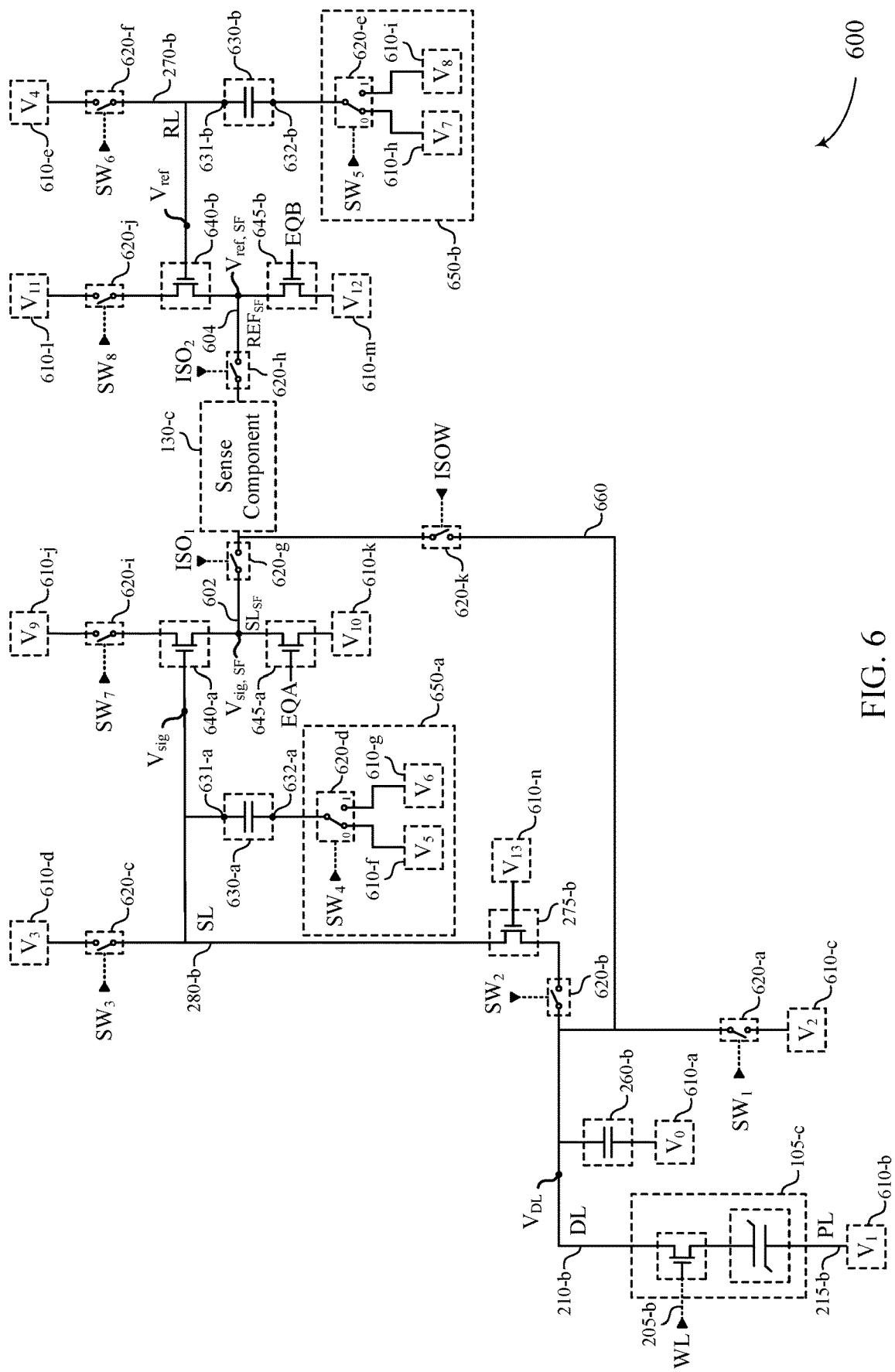
FIG. 6 illustrates an example of a circuit that may support self-boost, source following, and sense-and-hold for accessing memory cells in accordance with various embodiments of the present disclosure.

FIG. 6 illustrates an example of a circuit 600 that may support self-boost, source following, and sense-and-hold for accessing memory cells in accordance with various embodiments of the present disclosure. The circuit 600 includes a sense component 130-$c$ for sensing a logic state of a memory cell 105-$c$. Electrical signals may be communicated between the sense component 130-$c$ and the memory cell 105-$c$ via a digit line 210-$b$, a signal line 280-$b$, and a source follower signal line 602, which may, in combination, be referred to as a single access line of the memory cell 105-$b$. Signals of the access line may be illustrated by voltage $V_{DL}$ on the digit line 210-$b$, $V_{sig}$ on the signal line 280-$b$, and VSF on the source follower signal line 602, as shown. The example circuit 600 may include an amplifier 275-$b$ coupled between the digit line 210-$b$ and the signal line 280-$b$, which may be enabled by voltage source 610-$n$. The example circuit 600 may also include a source follower amplifier 640-$a$ coupled between the signal line 280-$a$ and the source follower signal line 602, and a source follower load component 645-$a$ coupled between the source follower signal line 602 and a voltage source 610-$k$ having a voltage $V_{11}$, which may be enabled or disabled by a signal EQA. Thus, the memory cell 105-$c$ may represent a memory cell coupled between a first access line (e.g., the digit line 210-$b$, the signal line 280-$a$, and the source follower signal line 602) and a second access line (e.g., the word line 205-$b$).

The circuit 600 may also include a reference line 270-$b$ and a source follower reference line 604. A source follower amplifier 640-$b$ may be coupled between the reference line 270-$b$ and the source follower reference line 604, and a source follower load component 645-$b$ coupled between the source follower reference line 604 and a voltage source 610-$m$ having a voltage $V_{12}$, which may be enabled or disabled by a signal EQB. The source follower reference line 604 may provide a reference signal for comparison with a signal of the source follower signal line 602 when detecting a logic state of the memory cell 105-$c$. The circuit 600 may also include a word line 205-$b$ for selecting or deselecting the memory cell 105-$c$ (e.g., by way of logic signal WL), and a plate line 215-$b$ for accessing a cell plate of a capacitor of the memory cell 105-$c$. In some examples the circuit 600 may also include a write line 660, which may support various write operations, and may provide a connection or isolation between the sense component 130-$c$ and the digit line 210-$b$ by enabling or disabling a switching component 620-$k$ (e.g., by activating or deactivating logical signal ISOW).

The circuit 600 may include a variety of voltage sources 610, which may be coupled with various voltage supplies and/or common grounding or virtual grounding points of a memory device that includes the example circuit 600.

A voltage source 610-$a$ may represent a common grounding point (e.g., a chassis ground, a neutral point, etc.), which may provide a common reference voltage having a voltage $V_0$, from which other voltages are defined. The voltage source 610-$a$ may be coupled with the digit line 210-$b$ via the intrinsic capacitance 260-$b$ of the digit line 210-$b$.

A voltage source 610-$b$ having a voltage $V_1$ may represent a plate line voltage source, and may be coupled with the memory cell 105-$c$ via a plate line 215-$b$ of the memory cell 105-$c$.

A voltage source 610-$c$ having a voltage $V_2$ may represent a digit line voltage source, and may be coupled with the digit line 210-$b$ via a switching component 620-$a$, which may be activated or deactivated by a logical signal $SW_1$.

A voltage source 610-$d$ having a voltage $V_3$ may represent a signal line precharge voltage source, and may be coupled with the signal line 280-$b$ via a switching component 620-$c$, which may be activated or deactivated by a logical signal $SW_3$.

A voltage source 610-e having a voltage $V_4$ may represent a reference signal voltage source, and may be coupled with the reference line 270-b via a switching component 620-f, which may be activated or deactivated by a logical signal $SW_6$.

A voltage source 610-n having a voltage $V_{13}$ may represent a digit line voltage source, and may be coupled with an amplifier 275-b which may be an example of the amplifier 275 or 275-a described with reference to FIGS. 2 and 4. For example, the amplifier 275-b may be a transistor, and the voltage source 610-n may be coupled with the gate of the transistor. The amplifier 275-b may be coupled with the signal line 280-b at a first terminal, and the digit line 210-b at a second terminal. The amplifier 275-b may provide a conversion of signals between the digit line 210-b and the signal line 280-b. For example, the amplifier 275-b may permit a flow of charge (e.g., electrical current) from the signal line 280-b to the digit line 210-b, as fed or enabled by the voltage source 610-n, upon a reduction in voltage of the digit line 210-b (e.g., upon selection of the memory cell 105-c). A relatively small flow of charge to the digit line 210-b may be associated with a relatively small change in voltage of the signal line 280-b, whereas a relatively large flow of charge to the digit line 210-b may be associated with a relatively large change in voltage of the signal line 280-b. According to the net capacitance of the signal line 280-b, for example, the signal line 280-b may undergo a relatively small change in voltage or a relatively large change in voltage depending on the flow of charge across the amplifier 275-b after selecting the memory cell 105-b. In some examples the amplifier 275-b may be isolated from the digit line 210-b by a switching component 620-b, which may be activated or deactivated by a logical signal $SW_2$. The amplifier 275-b may also referred to as a "voltage regulator" or a "bias component," relating to how the amplifier 275-b regulates a flow of charge in response to the voltage of the digit line 210-b.

The circuit may also include a first integrator capacitor 630-b and a second integrator capacitor 630-b, which may each be coupled with a respective variable voltage source 650. Integrator capacitors 630 may be examples of the integrator capacitors 430 described with reference to FIG. 4, and variable voltage sources 650 may be examples of the variable voltage sources 450 described with reference to FIG. 4. For example, the first integrator capacitor 630-a may be coupled with the signal line 280-b at a first terminal 631-a, and coupled with a variable voltage source 650-a at a second terminal 632-a. The second integrator capacitor 630-b may be coupled with the reference line 270-b at a first terminal 631-b, and coupled with a variable voltage source 650-b at a second terminal 632-b In the example of circuit 600, the variable voltage source 650-a may include a voltage source 610-f having a voltage $V_5$ and a voltage source 610-g having a voltage $V_6$, which may be selected for connection with the first integrator capacitor 630-a by a switching component 620-d by way of a logical signal $SW_4$. In some examples the voltage source 610-f may be coupled with a common grounding point (not shown). In other examples the voltage source 610-f may be coupled with a voltage supply that provides a positive or negative voltage. Voltage source 610-g may be coupled with a voltage supply having a higher voltage than that of voltage source 610-f, thereby providing the boosting functions as described herein (e.g., in accordance with the difference in voltage between voltage source 610-g and 610-f, equal to $V_6$–$V_5$, or simply $V_6$ when the voltage source 610-f is grounded).

In the example of circuit 600, the variable voltage source 650-b may include a voltage source 610-h having a voltage $V_7$ and a voltage source 610-i having a voltage $V_8$, which may be selected for connection with the second integrator capacitor 630-b by a switching component 620-e by way of a logical signal $SW_5$. In some examples the voltage source 610-h may be coupled with a common grounding point (not shown). In other examples the voltage source 610-h may be coupled with a voltage supply that provides a positive or negative voltage. Voltage source 610-i may be coupled with a voltage supply having a higher voltage than that of voltage source 610-h, thereby providing the boosting functions as described herein (e.g., in accordance with the difference in voltage between voltage source 610-i and 610-h, equal to $V_8$–$V_7$, or simply $V_8$ when the voltage source 610-h is grounded).

Although circuit 600 is shown as including two variable voltage sources 650, some configurations in accordance with the present disclosure may include a single, common variable voltage source 650. In some examples that use a common variable voltage source 650, the source voltage provided to the second terminal 632-a of the first integrator capacitor 630-a may be different to the source voltage provided to the second terminal 632-b of the second integrator capacitor 630-b due to differences in the circuit (e.g., conductor length, width, resistance, capacitance, etc.) between the variable voltage source 650 and each of the integrator capacitors 630. Further, although a variable voltage source 650 is illustrated as including two voltage sources 610 and a switching component 620, a variable voltage source 650 supporting the operations herein may include other configurations, such as a voltage buffer that provides a variable voltage to one or both of the second terminal 632-a of the first integrator capacitor 630-a and the second terminal 632-b of the second integrator capacitor 630-b.

Source follower amplifiers 640-a and 640-b may be configured to support source following in accordance with embodiments of the present disclosure. For example, source follower amplifier 640-a may be a transistor, and the signal line 280-b may be coupled with a gate terminal of the transistor. The source follower amplifier 640-a may be fed by a voltage source 610-j having a voltage $V_9$, which may represent a signal source follower voltage source. The voltage source 610-j may be coupled with the source follower amplifier 640-a via a switching component 620-i, which may be activated or deactivated by a logical signal $SW_7$. Thus, logical signal SWC may be used to enable or disable the source follower amplifier 640-a for generating the signal source follower voltage $V_{sig,\ SF}$ on the source follower signal line 602, where $V_{sig,SF}$ may be equal to $V_{sig}$ minus the threshold voltage, $V_{th,1}$, of the transistor of the source follower amplifier 640-a.

Similarly, source follower amplifier 640-b may also be a transistor, and the reference line 270-b may be coupled with a gate terminal of the transistor. The source follower amplifier 640-b may be fed by a voltage source 610-l having a voltage $V_{11}$, which may represent a reference source follower voltage source. The voltage source 610-l may be coupled with the source follower amplifier 640-b via a switching component 620-j, which may be activated or deactivated by a logical signal $SW_8$. Thus, logical signal $SW_8$ may be used to enable or disable the source follower amplifier 640-b for generating the reference source follower voltage $V_{ref,SF}$ on the source follower reference line 604, where $V_{ref,SF}$ may be equal to $V_{ref}$ minus the threshold voltage $V_{th,2}$ of the transistor of the source follower amplifier 640-b.

To support various operations described herein, the sense component 130-c may be isolated from portions of the circuit 600. For example, the sense component 130-c may be coupled with the source follower signal line 602 via a switching component 620-g (e.g., an isolation component), which may be activated or deactivated by a logical signal $ISO_1$. Additionally or alternatively, the sense component 130-c may be coupled with the source follower reference line 604 via a switching component 620-h (e.g., an isolation component), which may be activated or deactivated by a logical signal $ISO_2$. Further, the sense component 130-c may be coupled with a low voltage source and a high voltage source (not shown), which may be examples of sense component voltage sources 256-b and 265-c described with reference to FIG. 2, respectfully.

Each of the logical signals illustrated in circuit 600 may be provided by a memory controller (not shown), such as a memory controller 150 described with reference to FIG. 1. In some examples, certain logical signals may be provided by other components. For example, logical signal WL may be provided by a row decoder (not shown), such as a row decoder 125 described with reference to FIG. 1.

In various examples, voltage sources 610 may be coupled with different configurations of voltage supplies and/or common grounding or virtual grounding points of a memory device that includes the example circuit 600. For example, in some embodiments voltage sources 610-a, 610-f, 610-h, 610-k, and 610-m, or any combination thereof, may be coupled with the same ground point or virtual ground point, and may provide substantially the same reference voltage for various operations of accessing the memory cell 105-c. In some embodiments, several voltage sources 610 may be coupled with the same voltage supply of a memory device. For example, in some embodiments, voltage sources 610-c, 610-d, 610-g, 610-i. 610-j, and 610-l, or any combination thereof, may be coupled with a voltage supply having a certain voltage (e.g., a voltage of 1.5V, which may be referred to as "VARY"). In such embodiments, the signal line 280-b may be boosted to a voltage substantially equal to 2*VARY, or approximately 3.0V, prior to selecting the memory cell 105-c via word line 205-b for sensing. Thus, in accordance with embodiments of the present disclosure, self-boost operations may overcome a need to provide a relatively higher voltage supply for sense operations (e.g., a voltage source of 3.0V or more, which in some applications may refer to a "positive pump" voltage of $V_{pp}$). In other examples, voltage sources 610-g and 610-i may be coupled with a different voltage supply than other voltage supplies (e.g., a voltage of 1.2V, which may be referred to as "PDS"), which may thus be associated with a voltage boost of 1.2V. Although voltage sources 610 may be coupled with common voltage supplies and/or grounding points, the voltage of each of the voltage sources 610 coupled with a common voltage supply or common grounding point may be different due to differences in the circuit (e.g., conductor length, width, resistance, capacitance, etc.) between the respective voltage sources 610 and the associated common voltage supply or common grounding point.

Voltage source 610-e may provide a reference voltage for sensing the logic state of the memory cell 105-c, such that $V_4$ is an average voltage between signal voltage associated with sensing a logic 1 and a logic 0. In some examples, a voltage of $V_4$ may be provided as a voltage dropped from a voltage supply of the memory device, which may be the same voltage supply coupled with other voltage sources 610. For example, $V_4$ may be provided by connecting voltage source 610-e with a same voltage supply as voltage source 610-d, but with an intervening electrical load (e.g., a resistive load or capacitance) between the voltage supply and the voltage source 610-e.

Figure 7:
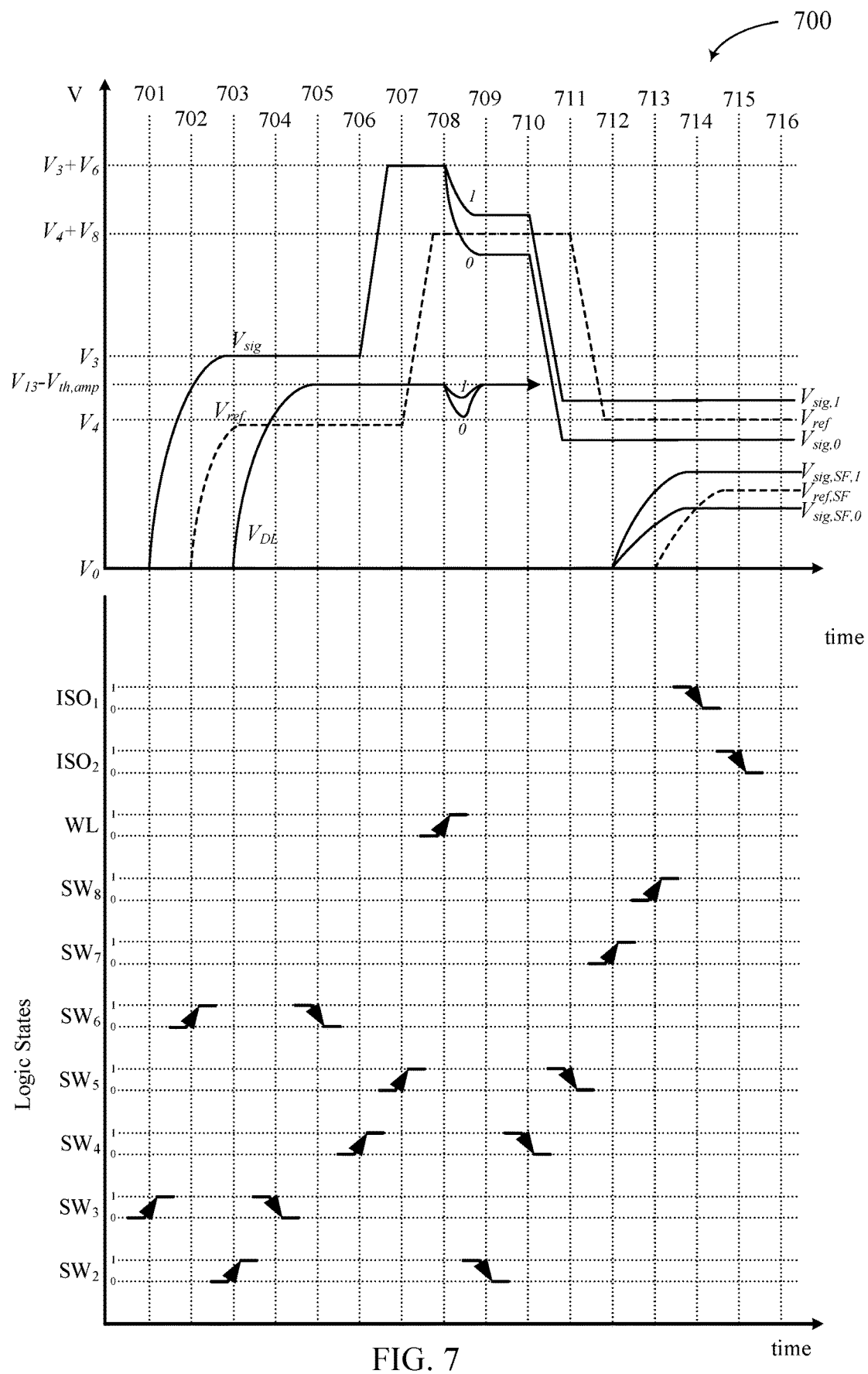
FIG. 7 shows a timing diagram illustrating operations of an example access procedure that may support self-boost and source following for accessing memory cells in accordance with various embodiments of the present disclosure.

FIG. 7 shows a timing diagram 700 illustrating operations of an example access procedure that may support self-boost and source following for accessing memory cells in accordance with various embodiments of the present disclosure. The example access procedure is described with reference to components of the example circuit 600 described with reference to FIG. 6.

In the example of timing diagram 700, voltage sources 610-a, 610-f, 610-h, 610-k, and 610-m are considered to be grounded, and therefore at a zero voltage (e.g., $V_0=0V$, $V_5=0V$, $V_7=0V$, $V_{10}=0V$, and $V_{12}=0V$). However, in other examples voltage sources 610-a, 610-f, 610-h, 610-k, and 610-m may be at non-zero voltages, and the voltages of timing diagram 700 may thus be adjusted accordingly. In some examples, prior to initiating the operations of timing diagram 700, the digit line 210-b and the plate line 215-b may be controlled to the same voltage, which may minimize charge leakage across the memory cell 105-c. For example, according to the timing diagram 700, the digit line 210-b has an initial voltage of 0V, which may be the same as the initial voltage of the plate line 215-b. In other examples, the digit line 210-b and the plate line 215-b may have some other initial voltage different from the ground voltage.

At 701, the access procedure may include activating switching component 620-c (e.g., by activating logical signal $SW_3$). Activating switching component 620-c may connect voltage source 610-d with the signal line 280-b, and accordingly the voltage of signal line 280-b may rise to voltage level $V_3$ as charge flows into the integrator capacitor 630-a. Thus, activating switching component 620-c may initiate a precharging operation for the integrator capacitor 630-a. For example, at 701 the switching component 620-d may be deactivated, such that the voltage source 610-f (e.g., a ground or virtual ground voltage at 0V) is coupled with the second terminal 632-a of the integrator capacitor 630-a, and the voltage source 610-d is coupled with the first terminal 631-a of the integrator capacitor 630-a. Thus, the integrator capacitor 630-a may be charged according to the voltage difference between the voltage source 610-d and the voltage source 610-f.

At 702, the access procedure may include activating switching component 620-f (e.g., by activating logical signal $SW_6$). Activating switching component 620-f may connect voltage source 610-e with the reference line 270-b, and accordingly the voltage of reference line 270-b may rise to voltage level $V_4$ as charge flows into the integrator capacitor 630-b. Thus, activating switching component 620-f may initiate a precharging operation for the integrator capacitor 630-b. For example, at 702 the switching component 620-e may be deactivated, such that the voltage source 610-h (e.g., a ground or virtual ground voltage at 0V) is coupled with the second terminal 632-b of the integrator capacitor 630-b, and the voltage source 610-e is coupled with the first terminal 631-b of the integrator capacitor 630-b. Thus, the integrator capacitor 630-b may be charged according to the voltage difference between the voltage source 610-e and the voltage source 610-h.

At 703, the access procedure may include activating switching component 620-b (e.g., by activating logical signal $SW_2$). Activating switching component 620-b may initiate a precharging operation for the digit line 210-b. For example, activating switching component 620-b may connect the signal line 280-b with the digit line 210-b, which may be coupled with the voltage source 610-a (e.g., a ground or virtual ground voltage) by way of the intrinsic capacitance 260-b. As fed by the voltage source 610-d, charge may flow through the amplifier 275-b and build on the digit line 210-b, causing the voltage on the digit line 210-b to rise. The voltage of the digit line 210-b may rise until the threshold voltage of the amplifier 275-b (e.g., threshold voltage $V_{th,amp}$) is no longer exceeded. Thus, after activating switching component 620-b, the voltage of the digit line 210-b may rise to a voltage level of $V_{13}-V_{th,amp}$ as charge flows from the signal line (e.g., as fed by the voltage source 610-d), and the digit line 210-b, including intrinsic capacitance 260-b, may be charged according to the voltage difference between the voltage level $V_{13}-V_{th,amp}$ and the voltage source 610-a (e.g., 0V). In some examples, the voltage level $V_{13}$ may be selected such that the digit line 210-b is precharged to substantially the same level as the signal line 280-b. For example, the voltage level $V_{13}$ may be set at a level of $V_3+V_{th,amp}$, which may be provided by a voltage supply having a voltage level greater than voltage source 610-d. Thus, in some examples the digit line 210-b may rise to a voltage level equal to voltage level $V_3$ in response to activating switching component 620-b at 703.

Additionally or alternatively, in some examples the digit line 210-b may be precharged by the voltage source 610-c. For example, prior to activating switching component 620-b, the access procedure 700 may include activating switching component 620-a (e.g., by activating logical signal $SW_1$). Activating switching component 620-a may initiate an alternative precharging operation for the digit line 210-b that is not shown in timing diagram 700. As fed by the voltage source 610-c, charge may build on the digit line 210-b, causing the voltage on the digit line 210-b to match the voltage level $V_2$. In some examples the voltage level $V_2$ may be substantially equal to the voltage level $V_3$, such that the digit line 210-b and the signal line 280-b are precharged to the same voltage prior to activating switching component 620-b. In some examples, precharging the digit line 210-b with the voltage source 610-c may reduce power consumption and/or reduce precharge time associated with accessing the memory cell 105-c. Following a precharge of the digit line 210-b by the voltage source 610-c, the access procedure may include activating switching component 620-b (e.g., by activating logical signal $SW_2$) to connect the signal line 280-b to the digit line 210-b.

At 704, the access procedure may include deactivating the switching component 620-c (e.g., by deactivating logical signal $SW_3$). Deactivating switching component 620-c may isolate voltage source 610-d from the signal line 280-b, and the voltage of signal line 280-b may hold at voltage level $V_3$. Upon deactivating the switching component 620-c the signal line 280-b, and thus the first terminal 631-a of the integrator capacitor 630-a, may be floating, and the signal line 280-b may maintain a level of charge according to the capacitance of the signal line 280-b, including the capacitance of the integrator capacitor 630-a.

At 705, the access procedure may include deactivating the switching component 620-f (e.g., by deactivating logical signal $SW_6$). Deactivating switching component 620-f may isolate voltage source 610-i from the reference line 270-b, and the voltage of reference line 270-b may hold at voltage level $V_4$. Upon deactivating the switching component 620-f the reference line 270-b, and thus the first terminal 631-b of the integrator capacitor 630-b, may be floating, and the reference line 270-b may maintain a level of charge according to the capacitance of the signal line 270-b, including the capacitance of the integrator capacitor 630-b.

At 706, the access procedure may include activating switching component 620-d (e.g., by activating logical signal $SW_4$). Activating switching component 620-d may cause a transition from the voltage source 610-f being coupled with the second terminal 632-a of the integrator capacitor 630-a to the voltage source 610-g being coupled with the second terminal 632-a of the integrator capacitor 630-a. By connecting the second terminal 632-a of the integrator capacitor 630-a to a voltage source at a higher voltage, the charge stored by the integrator capacitor 630-a may be boosted to a higher voltage, and accordingly the voltage of signal line 280-b, coupled with the first terminal 631-a of the integrator capacitor 630-a, may rise to voltage level $(V_3+V_6)$. Thus, activating switching component 620-d may initiate a boosting operation for the integrator capacitor 630-a.

At 707, the access procedure may include activating switching component 620-e (e.g., by activating logical signal $SW_5$). Activating switching component 620-e may cause a transition from the voltage source 610-h being coupled with the second terminal 632-b of the integrator capacitor 630-b to the voltage source 610-i being coupled with the second terminal 632-b of the integrator capacitor 630-b. By connecting the second terminal 632-b of the integrator capacitor 630-b to a voltage source at a higher voltage, the charge stored by the integrator capacitor 630-b may be boosted to a higher voltage, and accordingly the voltage of reference line 270-b, coupled with the first terminal 631-b of the integrator capacitor 630-b, may rise to voltage level $(V_4+V_8)$. Thus, activating switching component 620-e may initiate a boosting operation for the integrator capacitor 630-b.

At 708, the access procedure may include selecting the memory cell 105-c (e.g., by activating a word line via logical signal WL). Selecting the memory cell 105-c may cause a capacitor of the memory cell 105-c to be coupled with the digit line 210-b. Accordingly, charge may be shared between the memory cell 105-c, the digit line 210-b, and the signal line 280-b, which may depend on the logic state (e.g., the charge and/or polarization) stored in the memory cell 105-c.

For example, when the memory cell 105-c stores a logic 1, the capacitor of the memory cell 105-c may store a positive charge by way of a positive polarization (e.g., a charge state 305-a as described with reference to FIG. 3). Thus, when memory cell 105-c storing a logic 1 is selected, a relatively small amount of charge may flow from the digit line 210-b to the memory cell 105-c. As charge flows from the digit line 210-b to the memory cell 105-c, the voltage of the digit line 210-b may drop, which may allow the threshold voltage of the amplifier 275-b to be exceeded. When the threshold voltage of the amplifier 275-b is exceeded, charge may flow from the signal line 280-b (e.g., from the integrator capacitor 630-a) to the digit line 210-b across the amplifier 275-b, as well as a relatively small amount of charge from the voltage source 610-n, depending on the characteristics of the amplifier 275-b. Accordingly, charge may flow to the digit line 210-b until the voltage of the digit line 210-b returns to the voltage level equal to $V_{13}-V_{th,amp}$. When selecting the memory cell 105-c storing a logic 1, because a relatively small amount of charge flows into the memory cell 105-c, the signal line 280-b may undergo a relatively small voltage drop after selecting the memory cell 105-c, illustrated by the voltage of $V_{sig,1}$.

Alternatively, when the memory cell 105-c stores a logic 0, the capacitor of the memory cell 105-c may store a negative charge by way of a negative polarization (e.g., charge state 310-*a* as described with reference to FIG. 3). Thus, when memory cell 105-*c* storing a logic 0 is selected, a relatively large amount of charge may flow from the digit line 210-*b* to the memory cell 105-*c*. Accordingly, the signal line 280-*b* may undergo a relatively larger voltage drop, illustrated by the voltage of $V_{sig,0}$, as charge flows through the amplifier 275-*b* to return the digit line to the voltage level $V_{13}$-$V_{th,\ amp}$, such that the threshold voltage $V_{th,amp}$ of the amplifier 275-*b* is no longer exceeded. In some examples, selecting the memory cell 105-*c* storing a logic 0 may result in a partial loss of polarization of a capacitor of the memory cell 105-*c*. In examples where a 2Pr sensing operation is employed, selecting the memory cell 105-*c* storing a logic 0 may result in a reversal of saturation polarization of the capacitor of the memory cell 105-*c*, such that an amount of charge associated with twice the saturation polarization flows into the memory cell 105-*c*. In either case, selecting a memory cell 105-*c* storing a logic 0 according to the present example may require a subsequent refresh or rewrite operation.

At 709, the access procedure may include isolating the digit line 210-*b* from the signal line 280-*b* by deactivating the switching component 620-*b* (e.g., by deactivating logical signal $SW_2$). Isolating the digit line 210-*b* from the signal line 280-*b* may prevent additional charge from being shared between the digit line 210-*b* and the signal line 280-*b*, including charge sharing across the amplifier 275-*b* that may be caused by the threshold voltage of the amplifier 275-*b* being exceeded as a result of subsequent sensing operations.

At 710, the access procedure may include deactivating switching component 620-*d* (e.g., by deactivating logical signal $SW_4$). Deactivating switching component 620-*d* may cause a transition from the voltage source 610-*g* being coupled with the second terminal 632-*a* of the integrator capacitor 630-*a* to the voltage source 610-*f* being coupled with the second terminal 632-*a* of the integrator capacitor 630-*a*. By connecting the second terminal 632-*a* of the integrator capacitor 630-*a* to the voltage source at a lower voltage, the charge stored by the integrator capacitor 630-*b* may be shifted to a lower voltage, and accordingly the voltage of signal line 280-*b*, coupled with the first terminal 631-*a* of the integrator capacitor 630-*a*, may drop by voltage level of ($V_6$–$V_5$, or just $V_6$ in the event that voltage source 610-*f* is coupled with a common ground point). Thus, deactivating switching component 620-*d* may initiate a shifting operation for the integrator capacitor 630-*a*, which may reduce the voltage of the signal line 280-*b* to a level that may be read by the sense component 130-*c* (e.g., a voltage between low and high voltage sources of the sense component 130-*c*, not shown). For example, after the shifting operation of 710, $V_{sig,1}$ may be approximately 1.5V, and $V_{sig,0}$ may be approximately 1.2V.

At 711, the access procedure may include deactivating switching component 620-*e* (e.g., by deactivating logical signal $SW_5$). Deactivating switching component 620-*e* may cause a transition from the voltage source 610-*i* being coupled with the second terminal 632-*b* of the integrator capacitor 630-*b* to the voltage source 610-*h* being coupled with the second terminal 632-*b* of the integrator capacitor 630-*b*. By connecting the second terminal 632-*b* of the integrator capacitor 630-*b* to the voltage source at a lower voltage, the charge stored by the integrator capacitor 630-*b* may be shifted to a lower voltage, and accordingly the voltage of reference line 270-*b*, coupled with the first terminal 631-*b* of the integrator capacitor 630-*b*, may drop by voltage level of ($V_8$–$V_7$, or just $V_8$ in the event that voltage source 610-*h* is coupled with a common ground point). Thus, deactivating switching component 620-*e* may initiate a shifting operation for the integrator capacitor 630-*b*, which may reduce the voltage of the reference line 270-*b* to a level that may be read by the sense component 130-*c* (e.g., a voltage between low and high voltage sources of the sense component 130-*c*, not shown). For example, after the shifting operation of 711, $V_{ref}$ may be approximately 1.35V.

At 712, the access procedure may include enabling the source follower amplifier 640-*a* coupled between the signal line 280-*b* and the source follower signal line 602. For example, the source follower amplifier 640-*a* may be a transistor, and enabling the source follower amplifier 640-*a* may include connecting a source of the transistor with voltage source 610-*j*, having a voltage $V_9$, by enabling the switching component 620-*i* (e.g., by activating logical signal $SW_7$). Connecting the source follower amplifier 640-*a* with the voltage source 610-*j* may support charge flowing through the source follower amplifier 640-*a* from the signal line 280-*b* to the source follower signal line 602, and also an amplified charge (e.g., a multiple of the charge flowing from the signal line 280-*b*) flowing through the source follower amplifier 640-*a* from the voltage source 610-*j* to the source follower signal line 602. Accordingly, charge may accumulate on the source follower signal line 602 until the voltage threshold of the transistor is no longer exceeded. In other words, the voltage of the source follower signal line 602 may rise to a level of $V_{sig,SF}=(V_{sig}-V_{th,1})$ where $V_{th,1}$ is the threshold voltage of the transistor of the source follower amplifier 640-*a*. For example, $V_{th,1}$ may be approximately 0.5V, so that after enabling the source follower amplifier 640-*a*, $V_{sig,SF,1}$ may be approximately 1.0V, and $V_{sig,SF,0}$ may be approximately 0.7V.

In some examples the voltage of the signal line 280-*b* may only drop by a negligible amount upon enabling the source follower amplifier 640-*a*, because only a trivial amount of charge flows from the signal line 280-*b* to the source follower signal line 602. Although the voltage of the source follower signal line 602 may be lower than the voltage of the signal line 280-*b*, the increased amount of charge provided to the source follower signal line 602 may support larger components in the sense component 130-*c*, and may also limit charge sharing between the signal line 280-*b* and the sense component 130-*c*. Limiting charge sharing between the signal line 280-*b* and the sense component 130-*c* may improve self-boost operations (e.g., by reducing the effective access line capacitance that may otherwise be present without such source following embodiments), and may improve signal development upon accessing the memory cell 105-*c*. Thus, various embodiments of source following may be employed to improve the robustness of logic state detection.

In some examples, the source follower load component 645-*a* may also be enabled during the operations of 712. In examples where the source follower load component 645-*a* is a transistor, signal EQA may be enabled at the gate of the transistor, which may support current flowing through the source follower amplifier 640-*a* to also flow through the source follower load component 645-*a*. Thus, in some examples the source follower load component 645-*a* may operate as a current generator to support source following functionality. Although signal EQA may be substantially a digital signal having a relatively high voltage such that a transistor of the source follower load component 645-*a* operates in a saturation region, signal EQA may also be selected such that a transistor of the source follower load component 645-*a* operates in a linear, or ohmic region. In other words, signal EQA may be selected in order to operate the source follower load component 645-*a* at a particular working point. Further, although signal EQA may be enabled during source follower operations of 712, signal EQA may be disabled at other times (e.g., prior to 712, or after developing $V_{sig,SF}$), which may reduce energy consumption.

At 713, the access procedure may include enabling the source follower amplifier 640-*b* coupled between the reference line 270-*b* and the source follower reference line 604. For example, the source follower amplifier 640-*b* may also be a transistor, and enabling the source follower amplifier 640-*b* may include connecting a source of the transistor with voltage source 610-*l*, having a voltage $V_{11}$, by enabling the switching component 620-*j* (e.g., by activating logical signal $SW_8$). Connecting the source follower amplifier 640-*b* with the voltage source 610-*l* may support charge flowing through the source follower amplifier 640-*b* from the reference line 270-*b* to the source follower reference line 604, and also an amplified charge (e.g., a multiple of the charge flowing from the reference line 270-*b*) flowing through the source follower amplifier 640-*b* from the voltage source 610-*l* to the source follower reference line 604. Accordingly, charge may accumulate on the source follower reference line 604 until the voltage threshold of the transistor is no longer exceeded. In other words, the voltage of the source follower reference line 604 may rise to a level of $V_{ref,SF}=(V_{ref}-V_{th,2})$, where $V_{th,ref}$ is the threshold voltage of the transistor of the source follower amplifier 640-*b*. For example, $V_{th,2}$ may also be approximately 0.5V, so that after enabling the source follower amplifier 640-*g*, $V_{ref,SF}$ may be approximately 0.85V.

In some examples the voltage of the reference line 270-*b* may only drop by a negligible amount upon enabling the source follower amplifier 640-*b*, because only a trivial amount of charge flows from the reference line 270-*b* to the source follower reference line 604. Although the voltage of the source follower reference line 604 may be lower than the voltage of the reference line 270-*b*, the increased amount of charge provided to the source follower reference line 604 may support larger components in the sense component 130-*c*, and may also limit charge sharing between the reference line 270-*b* and the sense component 130-*c*.

In some examples, the source follower load component 645-*b* may also be enabled during the operations of 713. In examples where the source follower load component 645-*b* is a transistor, signal EQB may be enabled at the gate of the transistor, which may support current flowing through the source follower amplifier 640-*b* to also flow through the source follower load component 645-*b*. Thus, in some examples the source follower load component 645-*b* may operate as a current generator to support source following functionality. Although signal EQB may be substantially a digital signal having a relatively high voltage such that a transistor of the source follower load component 645-*b* operates in a saturation region, signal EQB may also be selected such that a transistor of the source follower load component 645-*b* operates in a linear, or ohmic region. In other words, signal EQB may be selected in order to operate the source follower load component 645-*b* at a particular working point. Further, although signal EQB may be enabled during source follower operations of 713, signal EQB may be disabled at other times (e.g., prior to 713, or after developing $V_{ref,SF}$), which may reduce energy consumption. In various examples, signals EQA and EQB may be provided by the same, or different controller outputs or voltage supplies. For example, signals EQA and EQB may be selected to have the same voltage, which may support source follower load component 645-*a* and source follower load component 645-*b* operating at substantially the same working point. Further, signals EQA and EQB may be enabled or disabled at the same times, or different times, according to different embodiments.

At 714, the access procedure may include isolating the sense component 130-*c* from the source follower signal line 602 by deactivating switching component 620-*g* (e.g., by deactivating logical signal $ISO_1$). Isolating the sense component 130-*c* from the source follower signal line 602 may allow the sense component 130-*c* to store a voltage and/or charge associated with the source follower signal line voltage at a first terminal of the sense component 130-*c* prior to determining the logic state stored in the memory cell 105-*c*.

At 715, the access procedure may include isolating the sense component 130-*c* from the source follower reference line 604 by deactivating switching component 620-*h* (e.g., by deactivating logical signal $ISO_2$). Isolating the sense component 130-*c* from the source follower reference line 604 may allow the sense component 130-*c* to store a voltage and/or charge associated with the source follower reference line voltage at a second terminal of the sense component 130-*c* prior to determining the logic state stored in the memory cell 105-*c*.

At 716, the access procedure may include detecting a difference between the stored voltages at the first and second terminals of the sense component 130-*c*. For example, if the signal stored at the first terminal is greater than the signal stored at the second terminal (e.g., $V_{sig,SF,1}>V_{ref,SF}$), the sense component 130-*c* may output a voltage equal to the high voltage source of the sense component. If the signal stored at the first terminal is less than the signal stored at the second terminal (e.g., $V_{sig,SF,0}<V_{ref,SF}$), the sense component 130-*c* may output a voltage equal to the low voltage source of the sense component.

Although illustrated as separate operations occurring at different times, certain operations may occur simultaneously, or in a different order. In some examples, various operations may be advantageously initiated simultaneously in order to reduce the amount of time required to sense a logic state of the memory cell 105-*c*. For example, the initiation of precharging at 701 and 702 may occur in an opposite order, or simultaneously (e.g., when logical signals $SW_3$ and $SW_6$ are driven as a common logical signal). Further, connecting the digit line 210-*b* with the signal line 280-*b* at 703 may occur prior to 701 and/or 702, or all three operations may occur simultaneously. Boosting the signal line 280-*b* at 706 and boosting the reference line 270-*b* at 707 may also occur in an opposite order, or simultaneously (e.g., when using a common variable voltage source 450, or when logical signals $SW_4$ and $SW_5$ are driven as a common logical signal). Similarly, shifting the signal line 280-*b* at 710 and shifting the reference line 270-*b* at 711 may also occur in an opposite order or simultaneously. Likewise, enabling the source follower amplifier 640-*a* at 712 and enabling the source follower amplifier 640-*b* at 713 may also occur in an opposite order, or simultaneously (e.g., when using a common voltage source 610, or when logical signals $SW_7$ and $SW_8$ are driven as a common logical signal). In some examples, isolating the sense component 130-*c* from the signal line 280-*b* at 712 and isolating the sense component 130-*c* from the reference line 270-*b* at 713 may occur in an opposite order, or simultaneously (e.g., when logical signals $ISO_1$ and $ISO_2$ are driven as a common logical signal).

In some examples, boosting and shifting of the reference line 270-b may be eliminated altogether, and thus operations at 707 and 711 may be omitted. Thus, in some embodiments, the second integrator capacitor 630-b and the second variable voltage source 650-b may be omitted from the circuit 600, and self-boost and source following may still be supported for signal generation when accessing the memory cell 105-c.

The order of operations shown in timing diagram 700 is for illustration only, and various other orders and combinations of steps may be performed to support self-boost in accordance with the present disclosure. Further, the timing of the operations of timing diagram 700 is also for illustration purposes only, and is not meant to indicate a particular relative duration between one operation and another. Various operations may occur over a duration that is relatively shorter or relatively longer than illustrated in various embodiments of self-boost in accordance with the present disclosure.

The transitions of the logical signals of the timing diagram 700 are illustrative of transitions from one state to another, and generally reflect transitions between an enabled or activated state (e.g., state "1") and a disabled or deactivated state (e.g., state "0") as associated with a particular numbered operation. In various examples the states may be associated with a particular voltage of the logical signal (e.g., a logical input voltage applied to a gate of a transistor operating as a switch), and the change in voltage from one state to another may not be instantaneous. Rather, in some examples a voltage associated with a logical signal may follow a curve over time from one logical state to another. Thus, the transitions shown in timing diagram 700 are not necessarily indicative of an instantaneous transition. Further, the initial state of a logical signal associated with a transition at a numbered operation may have been arrived during various times preceding the numbered operation while still supporting the described transitions and associated operations.

In accordance with embodiments of the present disclosure, the addition of a source following amplifier, such as those described with reference to FIGS. 6 and 7, may improve robustness in detecting a logic state of a memory cell 105, and may also support relatively fast sensing when certain operations are initiated in an overlapping or simultaneous manner. However, the embodiment shown by example circuit 600 includes substantially duplicated components (e.g., source follower amplifier 640-a and source follower amplifier 640-b). These duplicated components may have different properties as a result of manufacturing or operational tolerances, and therefore the duplicated components may have different effects on a signal of a signal line 280 as compared with a signal of a reference line 270. For example, a threshold voltage of a transistor of the source follower amplifier 640-a, $V_{th,1}$, may not be the same as a threshold voltage of a transistor of the source follower amplifier 640-b, $V_{th,2}$, and thus a voltage drop from the signal line 280-b to the source follower signal line 602 may be different from the voltage drop between the reference line 270-b and the source follower reference line 604. Such a difference may impair the ability of the circuit 600 to support robust read operations of the memory cell 105-c. For example, using the values of $V_{sig}$ and $V_{ref}$ described with reference to 710 and 711 of FIG. 7, if $V_{th,1}$=0.6V, and $V_{th,2}$=0.4V, $V_{sig,SF,1}$ may be approximately 0.9V, $V_{sig,SF,0}$ may be approximately 0.6V and $V_{ref,SF}$ may be approximately 0.95V. Thus, according to this given range of threshold voltages, both a logic 1 and a logic 0 may be sensed as a logic 0. Therefore, some embodiments in accordance with the present disclosure may perform sensing operations with a common component (e.g., a common source follower amplifier 640) to improve sensing operation robustness by eliminating such a source of variation.

Figure 8:
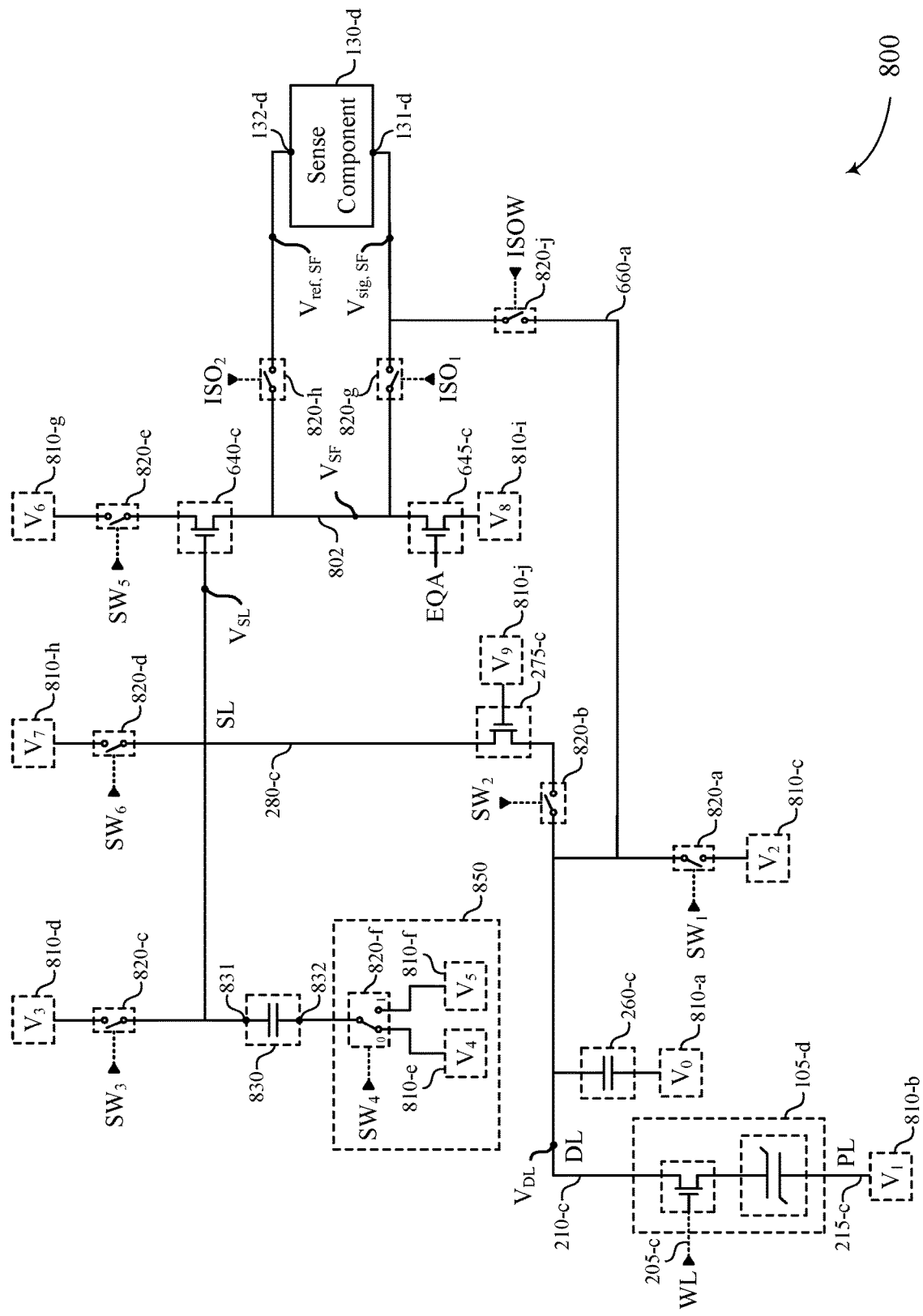
FIG. 8 illustrates an example of a circuit that may support self-boost, source following, and sense-and-hold for accessing memory cells in accordance with various embodiments of the present disclosure.

FIG. 8 illustrates an example of a circuit 800 that may support self-boost, source following, and sense-and-hold for accessing memory cells in accordance with various embodiments of the present disclosure. The circuit 800 includes a sense component 130-d for sensing a logic state of a memory cell 105-d. Electrical signals may be communicated between the sense component 130-d and the memory cell 105-d via a digit line 210-c, a signal line 280-c, a source follower line 802 which may, in combination, be referred to as a single access line of the memory cell 105-d. Signals of the access line may be illustrated by voltage $V_{DL}$ on the digit line 210-b, $V_{SL}$ on the signal line 280-b, and $V_{SF}$ on the source follower signal line 602, as shown.

The circuit 800 may include a single source follower amplifier 640-c coupled between the signal line 280-c and the source follower line 802, and a single source follower load component 645-b coupled between the source follower signal line 802 and a voltage source 810-i having a voltage $V_8$, which may be enabled or disabled by a logical signal EQA. According to embodiments of the present disclosure, the source follower line 802 may support both a signal and a reference as stored and/or compared at the sense component 130-d by way of sense-an-hold operations described herein. The circuit 800 may also include an amplifier 275-c coupled between the digit line 210-c and the signal line 280-c, which may be enabled by voltage source 810-i. Thus, the memory cell 105-d may represent a memory cell coupled between a first access line (e.g., the digit line 210-b, the signal line 280-a, and the source follower line 802) and a second access line (e.g., the word line 205-c). In the example of circuit 800, the digit line 210-b, the signal line 280-a, and the source follower line 802) may also represent a reference line.

The circuit 800 may also include a word line 205-c for selecting or deselecting the memory cell 105-d (e.g., by way of logic signal WL), and a plate line 215-c for accessing a cell plate of a capacitor of the memory cell 105-d. In some examples the circuit 800 may also include a write line 660-a, which may support various write operations, and may provide a connection or isolation between the sense component 130-d and the digit line 210-c by enabling or disabling a switching component 820-i (e.g., by activating or deactivating logical signal ISOW).

The circuit 800 may include a variety of voltage sources 810, which may be coupled with various voltage supplies and/or common grounding or virtual grounding points of a memory device that includes the example circuit 800.

A voltage source 810-a may represent a common grounding point (e.g., a chassis ground, a neutral point, etc.), which may provide a common reference voltage having a voltage $V_0$, from which other voltages are defined. The voltage source 810-a may be coupled with the digit line 210-b via the intrinsic capacitance 260-c of the digit line 210-c.

A voltage source 810-b having a voltage $V_1$ may represent a plate line voltage source, and may be coupled with the memory cell 105-d via plate line 215-c of the memory cell 105-d.

A voltage source 810-c having a voltage $V_2$ may represent a digit line voltage source, and may be coupled with the digit line 210-c via a switching component 820-a, which may be activated or deactivated by a logical signal $SW_1$.

A voltage source 810-*d* having a voltage V$_3$ may represent a first signal line precharge voltage source, and may be coupled with the signal line 280-*c* via a switching component 820-*c*, which may be activated or deactivated by a logical signal SW$_3$.

A voltage source 810-*h* having a voltage V$_7$ may represent a second signal line precharge voltage source, and may be coupled with the signal line 280-*c* via a switching component 820-*f*, which may be activated or deactivated by a logical signal SW$_8$. In some examples, voltage source 810-*h* may provide a reference voltage for sensing the logic state of the memory cell 105-*d*, such that V$_7$ is an average voltage between signal voltage associated with sensing a logic 1 and a logic 0. In some examples, voltage source 810-*h* may provide a sense voltage for a second sensing of the memory cell 105-*d*, such that the sensing signal as a result of applying V$_7$ to the signal line 280-*c* is an average voltage between signal voltage associated with sensing a logic 1 and a logic 0.

In some examples, a voltage of V$_7$ may be provided as a voltage dropped from a voltage supply of the memory device, which may be the same voltage supply coupled with other voltage sources 810. For example, V$_7$ may be provided by connecting voltage source 810-*h* with a same voltage supply as voltage source 810-*d*, but with an intervening electrical load (e.g., a resistive load or capacitance) between the voltage supply and the voltage source 810-*h*.

A voltage source 810-*j* having a voltage V$_9$ may represent a digit line voltage source, and may be coupled with an amplifier 275-*c* which may be an example of the amplifiers 275 described with reference to FIGS. 2, 4, and 6. For example, the amplifier 275-*c* may be a transistor, and the voltage source 810-*j* may be coupled with the gate of the transistor. The amplifier 275-*c* may be coupled with the signal line 280-*c* at a first terminal, and the digit line 210-*c* at a second terminal. The amplifier 275-*c* may provide a conversion of signals between the digit line 210-*c* and the signal line 280-*c*. For example, the amplifier 275-*c* may permit a flow of charge (e.g., electrical current) from the signal line 280-*c* to the digit line 210-*c*, as fed or enabled by the voltage source 810-*j*, upon a reduction in voltage of the digit line 210-*c* (e.g., upon selection of the memory cell 105-*d*). A relatively small flow of charge to the digit line 210-*c* may be associated with a relatively small change in voltage of the signal line 280-*c*, whereas a relatively large flow of charge to the digit line 210-*c* may be associated with a relatively large change in voltage of the signal line 280-*c*. According to the net capacitance of the signal line 280-*c*, for example, the signal line 280-*c* may undergo a relatively small change in voltage or a relatively large change in voltage depending on the flow of charge across the amplifier 275-*c* after selecting the memory cell 105-*c*. In some examples the amplifier 275-*c* may be isolated from the digit line 210-*c* by a switching component 820-*b*, which may be activated or deactivated by a logical signal SW$_2$. The amplifier 275-*c* may also referred to as a "voltage regulator" or a "bias component," relating to how the amplifier 275-*c* regulates a flow of charge in response to the voltage of the digit line 210-*c*.

The circuit may also include a single integrator capacitor 830, which may be coupled with a variable voltage source 850. Integrator capacitor 830 may be an example of the integrator capacitors 430 or 630 described with reference to FIGS. 4 and 6, and variable voltage source 850 may be an example of the variable voltage sources 450 or 650 described with reference to FIGS. 4 and 6. The integrator capacitor 830 may be coupled with the signal line 280-*c* at a first terminal 831, and coupled with the variable voltage source 850 at a second terminal 832.

In the example of circuit 800, the variable voltage source 850 may include a voltage source 810-*e* having a voltage V$_4$ and a voltage source 810-*f* having a voltage V$_5$, which may be selected for connection with the integrator capacitor 830 by a switching component 820-*d* by way of a logical signal SW$_4$. In some examples the voltage source 810-*e* may be coupled with a common grounding point (not shown). In other examples the voltage source 810-*e* may be coupled with a voltage supply that provides a positive or negative voltage. Voltage source 810-*f* may be coupled with a voltage supply having a higher voltage than that of voltage source 810-*e*, thereby providing the boosting functions as described herein (e.g., in accordance with the difference in voltage between voltage source 810-*f* and 810-*e*, equal to V$_5$–V$_4$, or simply V$_5$ when the voltage source 810-*e* is grounded). Although a variable voltage source 850 is illustrated as including two voltage sources 810 and a switching component 820, a variable voltage source 850 supporting the operations herein may include other configurations, such as a voltage buffer that provides a variable voltage to the second terminal 832 of the integrator capacitor 830.

To support various operations described herein, the sense component 130-*d* may be isolated from portions of the circuit 800. For example, the sense component 130-*d* may be coupled with the source follower line 802 via a first switching component 820-*g* (e.g., an isolation component), which may be activated or deactivated by a logical signal ISO$_1$. Additionally or alternatively, the sense component 130-*d* may be coupled with the source follower line 802 via a second switching component 820-*h* (e.g., an isolation component), which may be activated or deactivated by a logical signal ISO$_2$. Further, the sense component 130-*d* may be coupled with a low voltage source and a high voltage source (not shown), which may be examples of sense component voltage sources 256-*b* and 265-*c* described with reference to FIG. 2, respectfully. In accordance with embodiments of the present disclosure, sense component 130-*d* may include a sense amplifier that receives and compares a signal voltage (e.g., as stored or latched at a first terminal 131-*d*) with a reference voltage (e.g., as stored or latched at a second terminal 132-*d*).

Source follower amplifier 640-*c* be configured to support source following in accordance with embodiments of the present disclosure. For example, source follower amplifier 640-*c* may be a transistor, and the signal line 280-*c* may be coupled with a gate terminal of the transistor. The source follower amplifier 640-*c* may be fed by a voltage source 810-*g* having a voltage V$_6$, which may represent a source follower voltage source. The voltage source 810-*g* may be coupled with the source follower amplifier 640-*c* via a switching component 820-*e*, which may be activated or deactivated by a logical signal SW$_5$. Thus, logical signal SW$_5$ may be used to enable or disable the source follower amplifier 640-*c* for generating the signal source follower voltage V$_{SF}$, where V$_{SF}$ may be equal to V$_{SL}$ minus the threshold voltage of the transistor of the source follower amplifier 640-*c*. Although example circuit 800 includes the source follower amplifier 640-*c*, various other embodiments may omit a source follower amplifier 640-*c*, and employ the features and operations of self-boost and sample-and-hold in accordance with embodiments of the present disclosure without also employing source following (e.g., with signal line 280-*c* being coupled with switching components 820-*g* and 820-*h* directly).

Each of the logical signals illustrated in circuit 800 may be provided by a memory controller (not shown), such as a memory controller 150 described with reference to FIG. 1. In some examples, certain logical signals may be provided by other components. For example, logical signal WL may be provided by a row decoder (not shown), such as a row decoder 125 described with reference to FIG. 1.

In various examples, voltage sources 800 may be coupled with different configurations of voltage supplies and/or common grounding or virtual grounding points of a memory device that includes the example circuit 800. For example, in some embodiments voltage sources 810-a, 810-e, 810-i, or any combination thereof, may be coupled with the same ground point or virtual ground point, and may provide substantially the same reference voltage for various operations of accessing the memory cell 105-d. In some embodiments, several voltage sources 810 may be coupled with the same voltage supply of a memory device. For example, in some embodiments, voltage sources 810-c, 810-d, and 810-g, or any combination thereof, may be coupled with a voltage supply having a certain voltage (e.g., a voltage of 1.5V, which may be referred to as "VARY"). In such embodiments, the signal line 280-c may be boosted to a voltage substantially equal to 2*VARY, or approximately 3.0V, prior to selecting the memory cell 105-d via word line 205-c for sensing. Thus, in accordance with embodiments of the present disclosure, self-boost operations may overcome a need to provide a relatively higher voltage supply for sense operations (e.g., a voltage source of 3.0V or more, which in some applications may refer to a "positive pump" voltage of $V_{pp}$). In other examples, voltage source 810-f may be coupled with a different voltage supply than other voltage supplies (e.g., a voltage of 1.2V, which may be referred to as "PDS"), which may thus be associated with a voltage boost of 1.2V. Although voltage sources 810 may be coupled with common voltage supplies and/or grounding points, the voltage of each of the voltage sources 810 coupled with a common voltage supply or common grounding point may be different due to differences in the circuit (e.g., conductor length, width, resistance, capacitance, etc.) between the respective voltage sources 810 and the associated common voltage supply or common grounding point.

Figure 9:
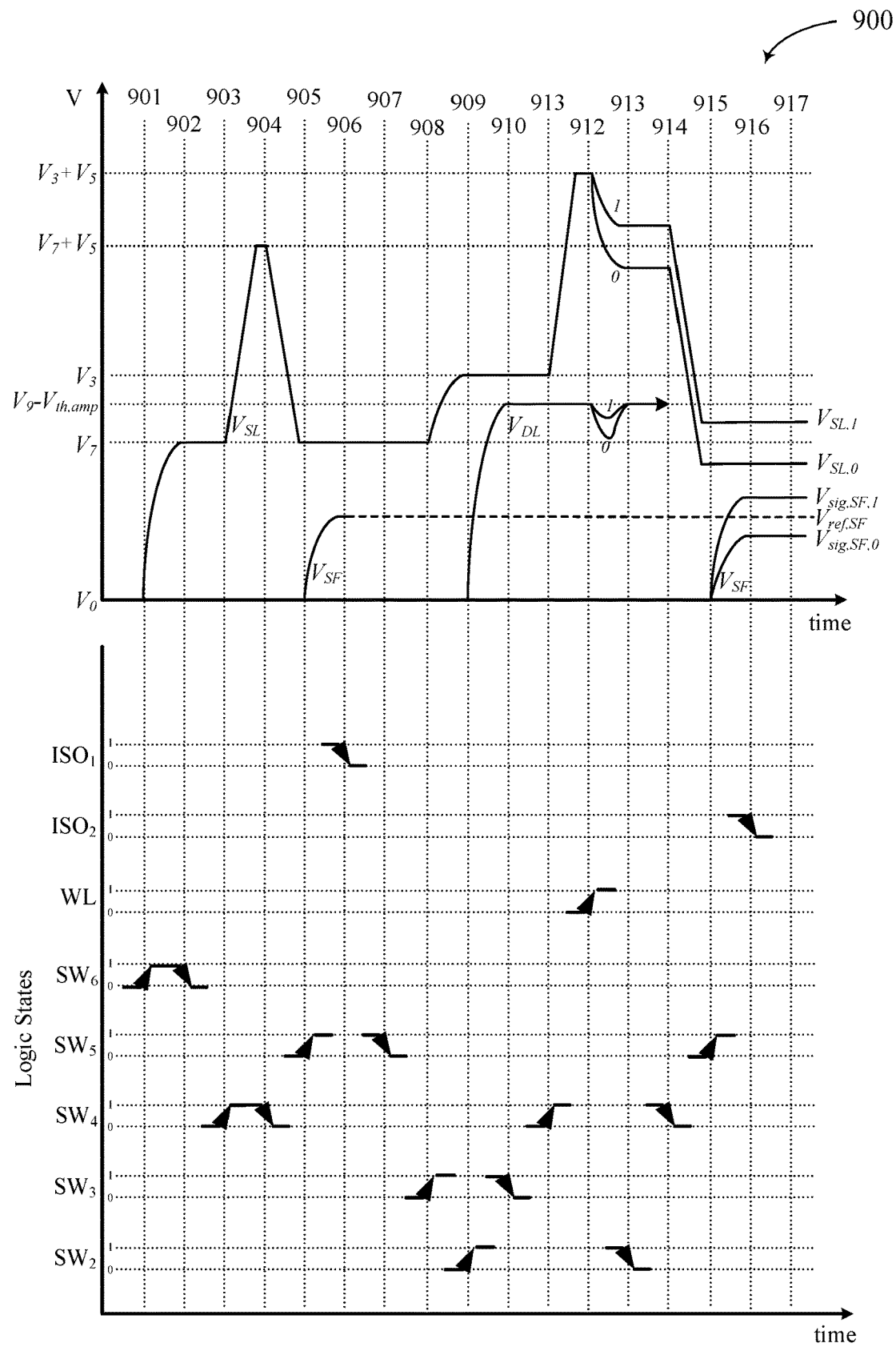
FIG. 9 shows a timing diagram illustrating operations of an example access procedure that may support self-boost, source following, and sample-and-hold for accessing memory cells in accordance with various embodiments of the present disclosure.

FIG. 9 shows a timing diagram 900 illustrating operations of an example access procedure that may support self-boost, source following, and sample-and-hold for accessing memory cells in accordance with various embodiments of the present disclosure. The example access procedure is described with reference to components of the example circuit 800 described with reference to FIG. 8.

In the example of timing diagram 900, voltage sources 810-a, 810-e, and 810-i are considered to be grounded, and therefore at a zero voltage (e.g., $V_0$=0V, $V_4$=0V, and $V_8$=0V). However, in other examples voltage sources 810-a, 810-e, and 810-i may be at non-zero voltages, and the voltages of timing diagram 900 may thus be adjusted accordingly. In some examples, prior to initiating the operations of timing diagram 900, the digit line 210-c and the plate line 215-c may be controlled to the same voltage, which may minimize charge leakage across the memory cell 105-c. For example, according to the timing diagram 900, the digit line 210-c has an initial voltage of 0V, which may be the same as the initial voltage of the plate line 215-c. In other examples, the digit line 210-c and the plate line 215-c may have some other initial voltage different from the ground voltage.

At 901, the access procedure may include activating switching component 820-d (e.g., by activating logical signal $SW_6$). Activating switching component 820-d may connect voltage source 810-h with the signal line 280-c, and accordingly the voltage of signal line 280-c may rise to voltage level $V_7$ as charge flows into the integrator capacitor 830. In the example of timing diagram 900, voltage level $V_7$ may represent a reference voltage source, such that $V_7$ is an average voltage between signal voltage associated with sensing a logic 1 and a logic 0. Activating switching component 820-d may initiate a first precharging operation for the integrator capacitor 830. For example, at 901 the switching component 820-f may be deactivated, such that the voltage source 810-e (e.g., a ground or virtual ground voltage at 0V) is coupled with the second terminal 832 of the integrator capacitor 830, and the voltage source 810-h is coupled with the first terminal 831 of the integrator capacitor 830. Thus, the integrator capacitor 830 may be charged according to the voltage difference between the voltage source 810-h and the voltage source 810-e.

At 902, the access procedure may include deactivating the switching component 820-d (e.g., by deactivating logical signal $SW_6$). Deactivating switching component 820-d may isolate voltage source 810-h from the signal line 280-c, and the voltage of signal line 280-c may hold at voltage level $V_7$. Upon deactivating the switching component 820-d the signal line 280-c, and thus the first terminal 831 of the integrator capacitor 830, may be floating.

At 903, the access procedure may include activating switching component 820-f (e.g., by activating logical signal $SW_4$). Activating switching component 820-f may cause a transition from the voltage source 810-e being coupled with the second terminal 832 of the integrator capacitor 830 to the voltage source 810-f being coupled with the second terminal 832 of the integrator capacitor 830. By connecting the second terminal 832 of the integrator capacitor 830 to a voltage source at a higher voltage, the charge stored by the integrator capacitor 830 may be boosted to a higher voltage, and accordingly the voltage of signal line 280-c, coupled with the first terminal 831 of the integrator capacitor 830, may rise to voltage level ($V_7$+$V_3$). Thus, activating switching component 820-f may initiate a first boosting operation for the integrator capacitor 830.

At 904, the access procedure may include deactivating switching component 820-f (e.g., by deactivating logical signal $SW_4$). Deactivating switching component 820-f may cause a transition from the voltage source 810-f being coupled with the second terminal 832 of the integrator capacitor 830 to the voltage source 810-e being coupled with the second terminal 832 of the integrator capacitor 830. By connecting the second terminal 832 of the integrator capacitor 830 to the voltage source at a lower voltage, the charge stored by the integrator capacitor 830 may be shifted to a lower voltage, and accordingly the voltage of signal line 280-c, coupled with the first terminal 831 of the integrator capacitor 830, may drop by voltage level of $V_5$-$V_4$ (or just $V_5$ in the event that voltage source 810-e is coupled with a common ground point). Thus, deactivating switching component 820-f may initiate a first shifting operation for the integrator capacitor 830. In examples that do not employ source following, the shifting may reduce the voltage of the signal line 280-c to a level that may be read by the sense component 130-d (e.g., a voltage between low and high voltage sources of the sense component 130-d, not shown).

Although operations at 903 and 904 are included in the example of timing diagram 900, in some examples these steps may be omitted. In other words, when generating a reference signal first in a sensing operation that employs sample-and-hold techniques, it may be unnecessary to perform boost and shift operations to generate the reference.

At 905, the access procedure may include enabling the source follower amplifier 640-c coupled between the signal line 280-c and the source follower line 802. For example, the source follower amplifier 640-c may be a transistor, and enabling the source follower amplifier 640-c may include connecting a source of the transistor with voltage source 810-g, having a voltage $V_6$, by enabling the switching component 820-e (e.g., by activating logical signal $SW_5$). Connecting the source follower amplifier 640-c with the voltage source 810-g may support charge flowing through the source follower amplifier 640-c from the signal line 280-c to the source follower line 802, and also an amplified charge (e.g., a multiple of the charge flowing from the signal line 280-c) flowing through the source follower amplifier 640-c from the voltage source 810-g to the source follower line 802. Accordingly, charge may accumulate on the source follower line 802 until the voltage threshold of the transistor is no longer exceeded. In other words, the voltage of the source follower line 802 may rise to a level of $V_{SF}=(V_{SL}-V_{th})$, where $V_{th}$ is the threshold voltage of the transistor of the source follower amplifier 640-c.

In some examples the voltage of the signal line 280-c may only drop by a negligible amount upon enabling the source follower amplifier 640-c, because only a trivial amount of charge flows from the signal line 280-c to the source follower line 802. Although the voltage of the source follower line 802 may be lower than the voltage of the signal line 280-c, the increased amount of charge provided to the source follower line 802 may support larger components in the sense component 130-d, and may also limit charge sharing between the signal line 280-c and the sense component 130-d.

In some examples, the source follower load component 645-c may also be enabled during the operations of 905. In examples where the source follower load component 645-c is a transistor, signal EQA may be enabled at the gate of the transistor, which may support current flowing through the source follower amplifier 640-c to also flow through the source follower load component 645-c. Thus, in some examples the source follower load component 645-c may operate as a current generator to support source following functionality. Although signal EQA may be substantially a digital signal having a relatively high voltage such that a transistor of the source follower load component 645-c operates in a saturation region, signal EQA may also be selected such that a transistor of the source follower load component 645-c operates in a linear, or ohmic region. In other words, signal EQA may be selected in order to operate the source follower load component 645-c at a particular working point. Further, although signal EQA may be enabled during source follower operations of 905, signal EQA may be disabled at other times (e.g., prior to 905, or after developing $V_{ref,SF}$), which may reduce energy consumption.

At 906, the access procedure may include isolating the second node 132-d of the sense component 130-d from the source follower line 802 by deactivating switching component 820-h (e.g., by deactivating logical signal ISO2). Isolating the sense component 130-c from the source follower line 802 may allow the sense component 130-c to store (e.g., "hold") a reference voltage and/or charge associated with the source follower line voltage at the second terminal 132-d of the sense component 130-d prior to determining the logic state stored in the memory cell 105-d.

At 907, the access procedure may include disabling the source follower amplifier 640-c. For example, disabling the source follower amplifier 640-c may include disconnecting the source of the transistor from voltage source 810-g by disabling the switching component 820-e (e.g., by deactivating logical signal $SW_5$). Disabling the source follower amplifier 640-c may, for example, reduce power consumption as compared with embodiments where the source follower amplifier 640-c remains enabled. In some examples the source follower load component 645-c may also be disabled before or after 907 (e.g., by deactivating signal EQA), which may reduce power consumption as compared with embodiments where the source follower load component 645-c remains enabled.

At 908, the access procedure may include activating switching component 820-c (e.g., by activating logical signal $SW_3$). Activating switching component 820-c may connect voltage source 810-d with the signal line 280-c, and accordingly the voltage of signal line 280-c may rise to voltage level $V_3$ as charge flows into the integrator capacitor 830. Thus, activating switching component 820-c may initiate a second precharging operation for the integrator capacitor 830. For example, at 910 the switching component 820-f may be deactivated, such that the voltage source 810-e (e.g., a ground or virtual ground voltage at 0V) is coupled with the second terminal 832 of the integrator capacitor 830, and the voltage source 810-d is coupled with the first terminal 831 of the integrator capacitor 830. Thus, the integrator capacitor 830 may be charged according to the voltage difference between the voltage source 810-d and the voltage source 810-e.

At 909, the access procedure may include activating switching component 820-b (e.g., by activating logical signal $SW_2$). Activating switching component 820-b may initiate a precharging operation for the digit line 210-c. For example, activating switching component 820-b may connect the signal line 280-c with the digit line 210-c, which may be coupled with the voltage source 810-a (e.g., a ground or virtual ground voltage) by way of the intrinsic capacitance 260-c. As fed by the voltage source 810-d, charge may flow through the amplifier 275-c and build on the digit line 210-c, causing the voltage on the digit line 210-c to rise. The voltage of the digit line 210-c may rise until the threshold voltage of the amplifier 275-c (e.g., threshold voltage $V_{th,amp}$) is no longer exceeded. Thus, after activating switching component 820-b, the voltage of the digit line 210-c may rise to a voltage level of $V_9-V_{th,amp}$ as charge flows from the signal line 280-c (e.g., as fed by the voltage source 810-d), and the digit line 210-c, including intrinsic capacitance 260-c, may be charged according to the voltage difference between the voltage level $V_9-V_{th,amp}$ and the voltage source 810-a (e.g., 0V). In some examples, the voltage level $V_9$ may be selected such that the digit line 210-c is precharged to substantially the same level as the signal line 280-c. For example, the voltage level $V_9$ may be set at a level of $V_3+V_{th,amp}$, which may be provided by a voltage supply having a voltage level greater than voltage source 810-d. Thus, in some examples the digit line 210-c may rise to a voltage level equal to voltage level $V_3$ in response to activating switching component 820-b at 909.

Additionally or alternatively, in some examples the digit line 210-c may be precharged by the voltage source 810-c. For example, prior to activating switching component 820-b, the access procedure 900 may include activating switching component 820-a (e.g., by activating logical signal $SW_1$). Activating switching component 820-a may initiate an alternative precharging operation for the digit line 210-c that is not shown in timing diagram 900. As fed by the voltage source 810-c, charge may build on the digit line 210-c, causing the voltage on the digit line 210-c to match the voltage level $V_2$. In some examples the voltage level $V_2$ may be substantially equal to the voltage level $V_3$, such that the digit line 210-c and the signal line 280-c are precharged to the same voltage prior to activating switching component 820-b. In some examples, precharging the digit line 210-c with the voltage source 810-c may reduce power consumption and/or reduce precharge time associated with accessing the memory cell 105-d. Following a precharge of the digit line 210-c by the voltage source 810-c, the access procedure may include activating switching component 820-b (e.g., by activating logical signal $SW_2$) to connect the signal line 280-c to the digit line 210-c.

At 910, the access procedure may include deactivating the switching component 820-c (e.g., by deactivating logical signal $SW_3$). Deactivating switching component 820-c may isolate voltage source 810-d from the signal line 280-c, and the voltage of signal line 280-c may hold at voltage level $V_3$. Upon deactivating the switching component 820-c the reference line 280-c, and thus the first terminal 831 of the integrator capacitor 830, may be floating, and the signal line 280-c may maintain a level of charge according to the capacitance of the signal line 280-c, including the capacitance of the integrator capacitor 830.

At 911, the access procedure may include activating switching component 820-f (e.g., by activating logical signal $SW_4$). Activating switching component 820-f may cause a transition from the voltage source 810-e being coupled with the second terminal 832 of the integrator capacitor 830 to the voltage source 810-f being coupled with the second terminal 832 of the integrator capacitor 830. By connecting the second terminal 832 of the integrator capacitor 830 to a voltage source at a higher voltage, the charge stored by the integrator capacitor 830 may again be boosted to a higher voltage, and accordingly the voltage of signal line 280-c, coupled with the first terminal 831 of the integrator capacitor 830, may rise to voltage level ($V_3+V_5$). Thus, activating switching component 820-f may initiate a second boosting operation for the integrator capacitor 830.

At 912, the access procedure may include selecting the memory cell 105-d (e.g., by activating a word line via logical signal WL). Selecting the memory cell 105-d may cause a capacitor of the memory cell 105-d to be coupled with the digit line 210-c. Accordingly, charge may be shared between the memory cell 105-d, the digit line 210-c, and the signal line 280-c, which may depend on the logic state (e.g., the charge and/or polarization) stored in the memory cell 105-d.

For example, when the memory cell 105-d stores a logic 1, the capacitor of the memory cell 105-d may store a positive charge by way of a positive polarization (e.g., a charge state 305-a as described with reference to FIG. 3). Thus, when memory cell 105-d storing a logic 1 is selected, a relatively small amount of charge may flow from the digit line 210-c to the memory cell 105-d. As charge flows from the digit line 210-c to the memory cell 105-d, the voltage of the digit line 210-c may drop, which may allow the threshold voltage of the amplifier 275-c to be exceeded. When the threshold voltage of the amplifier 275-c is exceeded, charge may flow from the signal line 280-c (e.g., from the integrator capacitor 830) to the digit line 210-c across the amplifier 275-c, as well as a relatively small amount of charge from the voltage source 810-j, depending on the characteristics of the amplifier 275-c.

Accordingly, charge may flow to the digit line 210-c until the voltage of the digit line 210-c returns to the voltage level equal to $V^9-V_{th,amp}$. When selecting the memory cell 105-d storing a logic 1, because a relatively small amount of charge flows into the memory cell 105-d, the signal line 280-c may undergo a relatively small voltage drop after selecting the memory cell 105-d, illustrated by the voltage of $V_{SL,1}$.

Alternatively, when the memory cell 105-d stores a logic 0, the capacitor of the memory cell 105-d may store a negative charge by way of a negative polarization (e.g., charge state 310-a as described with reference to FIG. 3). Thus, when memory cell 105-d storing a logic 0 is selected, a relatively large amount of charge may flow from the digit line 210-c to the memory cell 105-d. Accordingly, the signal line 280-c may undergo a relatively larger voltage drop, illustrated by the voltage of $V_{SL,0}$, as charge flows through the amplifier 275-c to return the digit line to the voltage level $V^9-V_{th,amp}$, such that the threshold voltage $V_{th,amp}$ of the amplifier 275-b is no longer exceeded. In some examples, selecting the memory cell 105-d storing a logic 0 may result in a partial loss of polarization of a capacitor of the memory cell 105-d. In examples where a 2Pr sensing operation is employed, selecting the memory cell 105-d storing a logic 0 may result in a reversal of saturation polarization of the capacitor of the memory cell 105-d, such that an amount of charge associated with twice the saturation polarization flows into the memory cell 105-d. In either case, selecting a memory cell 105-d storing a logic 0 according to the present example may require a subsequent refresh or rewrite operation.

At 913, the access procedure may include isolating the digit line 210-c from the signal line 280-c by deactivating the switching component 820-b (e.g., by deactivating logical signal $SW_2$). Isolating the digit line 210-c from the signal line 280-c may prevent additional charge from being shared between the digit line 210-c and the signal line 280-c, including charge sharing across the amplifier 275-c that may be caused by the threshold voltage of the amplifier 275-c being exceeded as a result of subsequent sensing operations.

At 914, the access procedure may include deactivating switching component 820-f (e.g., by deactivating logical signal $SW_4$). Deactivating switching component 820-f may cause a transition from the voltage source 810-f being coupled with the second terminal 832 of the integrator capacitor 830 to the voltage source 810-e being coupled with the second terminal 832 of the integrator capacitor 830. By connecting the second terminal 832 of the integrator capacitor 830 to the voltage source at a lower voltage, the charge stored by the integrator capacitor 830 may be shifted to a lower voltage, and accordingly the voltage of signal line 280-c, coupled with the first terminal 831 of the integrator capacitor 830, may drop by voltage level of $V_5-V_4$ (or just $V_5$ in the event that voltage source 810-e is coupled with a common ground point). Thus, deactivating switching component 820-f may initiate a second shifting operation for the integrator capacitor 830. In embodiments that do not employ source following, the shifting may reduce the voltage of the signal line 280-c to a level that may be read by the sense component 130-d (e.g., a voltage between low and high voltage sources of the sense component 130-d, not shown).

At 915 the access procedure may include enabling the source follower amplifier 640-c coupled between the signal line 280-c and the source follower line 802. Enabling the source follower amplifier 640-c may include connecting a source of the transistor with voltage source 810-g for a second time by enabling the switching component 820-e (e.g., by activating logical signal $SW_5$). Connecting the source follower amplifier 640-c with the voltage source 810-g may again support charge flowing through the source follower amplifier 640-c from the signal line 280-c to the source follower line 802, and also an amplified charge (e.g., a multiple of the charge flowing from the signal line 280-c) flowing through the source follower amplifier 640-c from the voltage source 810-g to the source follower line 802. Accordingly, charge may accumulate on the source follower line 802 until the voltage threshold of the transistor is no longer exceeded. In other words, the voltage of the source follower line 802 may rise to a level of $V_{SF}=(V_{SL}=V_{th})$, where in this case $V_{SL}$ is based on selecting the memory cell 105-d.

In some examples, the source follower load component 645-c may also be enabled during the operations of 915. In examples where the source follower load component 645-c is a transistor, signal EQA may again be enabled at the gate of the transistor, which may support current flowing through the source follower amplifier 640-c to also flow through the source follower load component 645-c. Although signal EQA may be enabled or reenabled during source follower operations of 915, signal EQA may be disabled at other times (e.g., between 905 and 915, or after developing $V_{sig,SF}$), which may reduce energy consumption.

At 916 the access procedure may include isolating the first terminal 131-d of the sense component 130-d from the source follower line 802 by deactivating switching component 820-g (e.g., by deactivating logical signal $ISO_1$). Isolating the first terminal 131-d of the sense component 130-d from the source follower line 802 may allow the sense component 130-d to store (e.g., "hold") a voltage and/or charge associated with the source follower line voltage at the first terminal 131-d of the sense component 130-c prior to determining the logic state stored in the memory cell 105-c.

At 917 the access procedure may include detecting a difference between the stored voltages at the first and second terminals of the sense component 130-d. For example, if the signal stored at the first terminal is greater than the signal stored at the second terminal (e.g., $V_{sig,SF,1}>V_{ref,SF}$), the sense component 130-d may output a voltage equal to the high voltage source of the sense component. If the signal stored at the first terminal is less than the signal stored at the second terminal (e.g., $V_{sig,SF,0}<V_{ref,SF}$), the sense component 130-d may output a voltage equal to the low voltage source of the sense component.

Although illustrated as separate operations occurring at different times, certain operations may occur simultaneously, or in a different order. In some examples, various operations may be advantageously initiated simultaneously in order to reduce the amount of time required to sense a logic state of the memory cell 105-d. For example, connecting the digit line 210-b with the signal line 280-b at 911 may occur prior to the precharging at 910, or these operations may occur simultaneously.

The order of operations shown in timing diagram 900 is for illustration only, and various other orders and combinations of steps may be performed to support self-boost in accordance with the present disclosure. Further, the timing of the operations of timing diagram 900 is also for illustration purposes only, and is not meant to indicate a particular relative duration between one operation and another. Various operations may occur over a duration that is relatively shorter or relatively longer than illustrated in various embodiments of self-boost in accordance with the present disclosure.

The transitions of the logical signals of the timing diagram 900 are illustrative of transitions from one state to another, and generally reflect transitions between an enabled or activated state (e.g., state "1") and a disabled or deactivated state (e.g., state "0") as associated with a particular numbered operation. In various examples the states may be associated with a particular voltage of the logical signal (e.g., a logical input voltage applied to a gate of a transistor operating as a switch), and the change in voltage from one state to another may not be instantaneous. Rather, in some examples a voltage associated with a logical signal may follow a curve over time from one logical state to another. Thus, the transitions shown in timing diagram 700 are not necessarily indicative of an instantaneous transition. Further, the initial state of a logical signal associated with a transition at a numbered operation may have been arrived during various times preceding the numbered operation while still supporting the described transitions and associated operations.

In accordance with embodiments of the present disclosure, the features and operations of sample-and-hold may reduce or eliminate some sources of variation when sensing a memory cell 105. In some examples it may be further advantageous to perform a second selection of a memory cell 105 to generate a reference, rather than predetermine a reference voltage source. Thus, some embodiments in accordance with the present disclosure may perform a self-referencing sample-and-hold operations to further improve sensing robustness.

Figure 10:
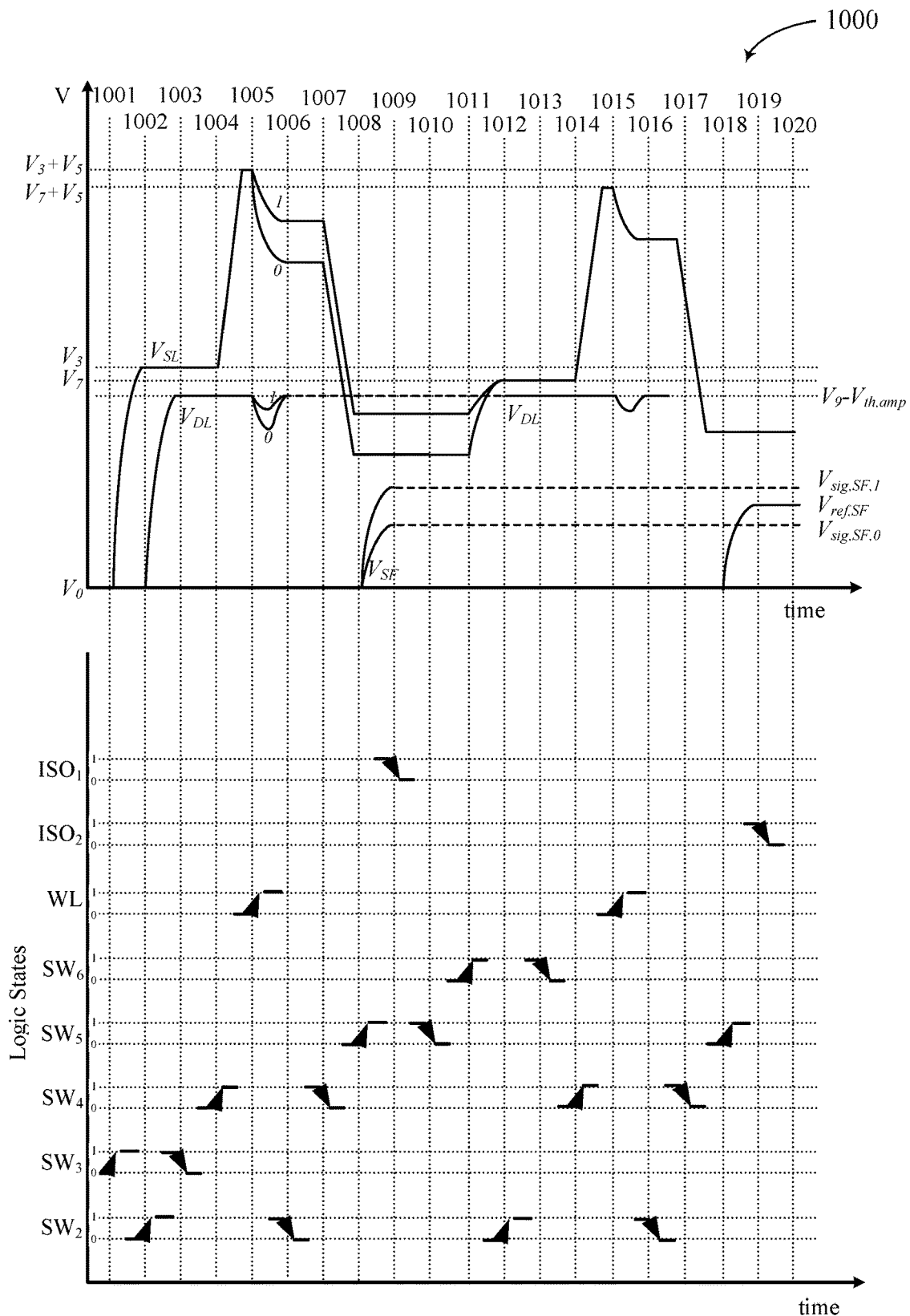
FIG. 10 shows a timing diagram illustrating operations of an example access procedure that may support self-boost, source following, and a self-referencing sample-and-hold for accessing memory cells in accordance with various embodiments of the present disclosure.

FIG. 10 shows a timing diagram 1000 illustrating operations of an example access procedure that may support self-boost, source following, and a self-referencing sample-and-hold for accessing memory cells in accordance with various embodiments of the present disclosure. The example access procedure is described with reference to components of the example circuit 800 described with reference to FIG. 8.

In the example of timing diagram 1000, voltage sources 810-a, 810-e, and 810-i are considered to be grounded, and therefore at a zero voltage (e.g., $V_0=0V$, $V_4=0V$, and $V_8=0V$). However, in other examples voltage sources 810-a, 810-e, and 810-i may be at non-zero voltages, and the voltages of timing diagram 1000 may thus be adjusted accordingly. In some examples, prior to initiating the operations of timing diagram 1000, the digit line 210-c and the plate line 215-c may be controlled to the same voltage, which may minimize charge leakage across the memory cell 105-c. For example, according to the timing diagram 1000, the digit line 210-c has an initial voltage of 0V, which may be the same as the initial voltage of the plate line 215-c. In other examples, the digit line 210-c and the plate line 215-c may have some other initial voltage different from the ground voltage.

At 1001, the access procedure may include activating switching component 820-c (e.g., by activating logical signal $SW_3$). Activating switching component 820-c may connect voltage source 810-d with the signal line 270-b, and accordingly the voltage of signal line 280-c may rise to voltage level $V_3$ as charge flows into the integrator capacitor 830. Thus, activating switching component 820-c may initiate a first precharging operation for the integrator capacitor 830. For example, at 1001 the switching component 820-f may be deactivated, such that the voltage source 810-e (e.g., a ground or virtual ground voltage at 0V) is coupled with the second terminal 832 of the integrator capacitor 830, and the voltage source 810-d is coupled with the first terminal 831 of the integrator capacitor 830. Thus, the integrator capacitor 830 may be charged according to the voltage difference between the voltage source 810-d and the voltage source 810-e.

At 1002, the access procedure may include activating switching component 820-b (e.g., by activating logical signal $SW_2$). Activating switching component 820-b may initiate a first precharging operation for the digit line 210-c. For example, activating switching component 820-b may connect the signal line 280-c with the digit line 210-c, which may be coupled with the voltage source 810-a (e.g., a ground or virtual ground voltage) by way of the intrinsic capacitance 260-c. As fed by the voltage source 810-d, charge may flow through the amplifier 275-c and build on the digit line 210-c, causing the voltage on the digit line 210-c to rise. The voltage of the digit line 210-c may rise until the threshold voltage of the amplifier 275-c (e.g., threshold voltage $V_{th,amp}$) is no longer exceeded. Thus, after activating switching component 820-b, the voltage of the digit line 210-c may rise to a voltage level of $V_9-V_{th,amp}$ as charge flows from the signal line 280-c (e.g., as fed by the voltage source 810-d), and the digit line 210-c, including intrinsic capacitance 260-c, may be charged according to the voltage difference between the voltage level $V_9-V_{th,amp}$ and the voltage source 810-a (e.g., 0V). In some examples, the voltage level $V_9$ may be selected such that the digit line 210-c is precharged to substantially the same level as the signal line 280-c. For example, the voltage level $V_9$ may be set at a level of $V_3+V_{th,amp}$, which may be provided by a voltage supply having a voltage level greater than voltage source 810-d. Thus, in some examples the digit line 210-c may rise to a voltage level equal to voltage level $V_3$ in response to activating switching component 820-b at 1002.

Additionally or alternatively, in some examples the digit line 210-c may be precharged by the voltage source 810-c. For example, prior to activating switching component 820-b, the access procedure 1000 may include activating switching component 820-a (e.g., by activating logical signal $SW_1$). Activating switching component 820-a may initiate an alternative precharging operation for the digit line 210-c that is not shown in timing diagram 1000. As fed by the voltage source 810-c, charge may build on the digit line 210-c, causing the voltage on the digit line 210-c to match the voltage level $V_2$. In some examples the voltage level $V_2$ may be substantially equal to the voltage level $V_3$, such that the digit line 210-c and the signal line 280-c are precharged to the same voltage prior to activating switching component 820-b. In some examples, precharging the digit line 210-c with the voltage source 810-c may reduce power consumption and/or reduce precharge time associated with accessing the memory cell 105-d. Following a precharge of the digit line 210-c by the voltage source 810-c, the access procedure may include activating switching component 820-b (e.g., by activating logical signal $SW_2$) to connect the signal line 280-c to the digit line 210-c.

At 1003, the access procedure may include deactivating the switching component 820-c (e.g., by deactivating logical signal $SW_3$). Deactivating switching component 820-c may isolate voltage source 810-d from the signal line 280-c, and the voltage of signal line 280-c may hold at voltage level $V_3$. Upon deactivating the switching component 820-c the reference line 280-c, and thus the first terminal 831 of the integrator capacitor 830, may be floating.

At 1004, the access procedure may include activating switching component 820-f (e.g., by activating logical signal $SW_4$). Activating switching component 820-f may cause a transition from the voltage source 810-e being coupled with the second terminal 832 of the integrator capacitor 830 to the voltage source 810-f being coupled with the second terminal 832 of the integrator capacitor 830. By connecting the second terminal 832 of the integrator capacitor 830 to a voltage source at a higher voltage, the charge stored by the integrator capacitor 830 may be boosted to a higher voltage, and accordingly the voltage of signal line 280-c, coupled with the first terminal 831 of the integrator capacitor 830, may rise to voltage level ($V_3+V_5$). Thus, activating switching component 820-f may initiate a first boosting operation for the integrator capacitor 830.

At 1005, the access procedure may include selecting the memory cell 105-d (e.g., by activating a word line via logical signal WL). Selecting the memory cell 105-d may cause a capacitor of the memory cell 105-d to be coupled with the digit line 210-c. Accordingly, charge may be shared between the memory cell 105-d, the digit line 210-c, and the signal line 280-c, which may depend on the logic state (e.g., the charge and/or polarization) stored in the memory cell 105-d.

For example, when the memory cell 105-d stores a logic 1, the capacitor of the memory cell 105-d may store a positive charge by way of a positive polarization (e.g., a charge state 305-a as described with reference to FIG. 3). Thus, when memory cell 105-d storing a logic 1 is selected, a relatively small amount of charge may flow from the digit line 210-c to the memory cell 105-d. As charge flows from the digit line 210-c to the memory cell 105-d, the voltage of the digit line 210-c may drop, which may allow the threshold voltage of the amplifier 275-c to be exceeded. When the threshold voltage of the amplifier 275-c is exceeded, charge may flow from the signal line 280-c (e.g., from the integrator capacitor 830) to the digit line 210-c across the amplifier 275-c, as well as a relatively small amount of charge from the voltage source 810-j, depending on the characteristics of the amplifier 275-c. Accordingly, charge may flow to the digit line 210-c until the voltage of the digit line 210-c returns to the voltage level equal to $V_9-V_{th,amp}$. When selecting the memory cell 105-d storing a logic 1, because a relatively small amount of charge flows into the memory cell 105-d, the signal line 280-c may undergo a relatively small voltage drop after selecting the memory cell 105-d, illustrated by the voltage of $V_{SL,1}$.

Alternatively, when the memory cell 105-d stores a logic 0, the capacitor of the memory cell 105-d may store a negative charge by way of a negative polarization (e.g., charge state 310-a as described with reference to FIG. 3). Thus, when memory cell 105-d storing a logic 0 is selected, a relatively large amount of charge may flow from the digit line 210-c to the memory cell 105-d. Accordingly, the signal line 280-c may undergo a relatively larger voltage drop, illustrated by the voltage of $V_{SL,0}$, as charge flows through the amplifier 275-c to return the digit line to the voltage level $V_9-V_{th,amp}$, such that the threshold voltage $V_{th,amp}$ of the amplifier 275-b is no longer exceeded. In some examples, selecting the memory cell 105-d storing a logic 0 may result in a partial loss of polarization of a capacitor of the memory cell 105-d. In examples where a 2Pr sensing operation is employed, selecting the memory cell 105-d storing a logic 0 may result in a reversal of saturation polarization of the capacitor of the memory cell 105-d, such that an amount of charge associated with twice the saturation polarization flows into the memory cell 105-d. In either case, selecting a memory cell 105-d storing a logic 0 according to the present example may require a subsequent refresh or rewrite operation.

At 1006, the access procedure may include isolating the digit line 210-c from the signal line 280-c by deactivating the switching component 820-*b* (e.g., by deactivating logical signal $SW_2$). Isolating the digit line 210-*c* from the signal line 280-*c* may prevent additional charge from being shared between the digit line 210-*c* and the signal line 280-*c*, including charge sharing across the amplifier 275-*c* that may be caused by the threshold voltage of the amplifier 275-*c* being exceeded as a result of subsequent sensing operations.

At 1007, the access procedure may include deactivating switching component 820-*f* (e.g., by deactivating logical signal $SW_4$). Deactivating switching component 820-*f* may cause a transition from the voltage source 810-*f* being coupled with the second terminal 832 of the integrator capacitor 830 to the voltage source 810-*e* being coupled with the second terminal 832 of the integrator capacitor 830. By connecting the second terminal 832 of the integrator capacitor 830 to the voltage source at a lower voltage, the charge stored by the integrator capacitor 830 may be shifted to a lower voltage, and accordingly the voltage of signal line 280-*c*, coupled with the first terminal 831 of the integrator capacitor 830, may drop by voltage level of $V_5-V_4$ (or just $V_5$ in the event that voltage source 810-*e* is coupled with a common ground point). Thus, deactivating switching component 820-*f* may initiate a first shifting operation for the integrator capacitor 830. In embodiments that do not employ source following, the shifting may reduce the voltage of the signal line 280-*c* to a level that may be read by the sense component 130-*d* (e.g., a voltage between low and high voltage sources of the sense component 130-*d*, not shown).

At 1008 the access procedure may include enabling the source follower amplifier 640-*c* coupled between the signal line 280-*c* and the source follower line 802. Enabling the source follower amplifier 640-*c* may include connecting a source of the transistor with voltage source 810-*g* for a second time by enabling the switching component 820-*e* (e.g., by activating logical signal $SW_5$). Connecting the source follower amplifier 640-*c* with the voltage source 810-*g* may support charge flowing through the source follower amplifier 640-*c* from the signal line 280-*c* to the source follower line 802, and also an amplified charge (e.g., a multiple of the charge flowing from the signal line 280-*c*) flowing through the source follower amplifier 640-*c* from the voltage source 810-*g* to the source follower line 802. Accordingly, charge may accumulate on the source follower line 802 until the voltage threshold of the transistor is no longer exceeded. In other words, the voltage of the source follower line 802 may rise to a level of $V_{SF}=(V_{SL}-V_{th})$, where in this case $V_{SL}$ is based on selecting the memory cell 105-*d*.

In some examples, the source follower load component 645-*c* may also be enabled during the operations of 1008. In examples where the source follower load component 645-*c* is a transistor, signal EQA may be enabled at the gate of the transistor, which may support current flowing through the source follower amplifier 640-*c* to also flow through the source follower load component 645-*c*. Thus, in some examples the source follower load component 645-*c* may operate as a current generator to support source following functionality. Although signal EQA may be substantially a digital signal having a relatively high voltage such that a transistor of the source follower load component 645-*c* operates in a saturation region, signal EQA may also be selected such that a transistor of the source follower load component 645-*c* operates in a linear, or ohmic region. In other words, signal EQA may be selected in order to operate the source follower load component 645-*c* at a particular working point. Further, although signal EQA may be enabled during source follower operations of 1008, signal EQA may be disabled at other times (e.g., prior to 1008, or after developing $V_{sig,SF}$), which may reduce energy consumption.

At 1009 the access procedure may include isolating the first terminal 131-*d* of the sense component 130-*d* from the source follower line 802 by deactivating switching component 820-*g* (e.g., by deactivating logical signal $ISO_1$). Isolating the first terminal 131-*d* of the sense component 130-*d* from the source follower line 802 may allow the sense component 130-*d* to store (e.g., "hold") a voltage and/or charge associated with the source follower line voltage at the first terminal 131-*d* of the sense component 130-*c* prior to determining the logic state stored in the memory cell 105-*c*.

At 1010, the access procedure may include disabling the source follower amplifier 640-*c*. For example, disabling the source follower amplifier 640-*c* may include disconnecting the source of the transistor from voltage source 810-*g* by disabling the switching component 820-*e* (e.g., by deactivating logical signal $SW_5$). Disabling the source follower amplifier 640-*c* may, for example, reduce power consumption as compared with embodiments where the source follower amplifier 640-*c* remains enabled. In some examples the source follower load component 645-*c* may also be disabled before or after 907 (e.g., by deactivating signal EQA), which may reduce power consumption as compared with embodiments where the source follower load component 645-*c* remains enabled.

At 1011, the access procedure may include activating switching component 820-*d* (e.g., by activating logical signal $SW_6$). Activating switching component 820-*d* may connect voltage source 810-*h* with the signal line 280-*c*, and accordingly the voltage of signal line 280-*c* may rise to voltage level $V_7$ as charge flows into the integrator capacitor 830. In the example of timing diagram 1000, voltage level $V_7$ provide a sense voltage for a second sensing of the memory cell 105-*d*, such that the signal as a result of applying $V_7$ to the signal line 280-*c* is an average voltage between signal voltage associated with initially sensing a logic 1 and a logic 0. Activating switching component 820-*d* may initiate a second precharging operation for the integrator capacitor 830. For example, at 1013 the switching component 820-*f* may be deactivated, such that the voltage source 810-*e* (e.g., a ground or virtual ground voltage at 0V) is coupled with the second terminal 832 of the integrator capacitor 830, and the voltage source 810-*h* is coupled with the first terminal 831 of the integrator capacitor 830. Thus, the integrator capacitor 830 may be charged according to the voltage difference between the voltage source 810-*h* and the voltage source 810-*e*.

At 1012, the access procedure may include activating switching component 820-*b* (e.g., by activating logical signal $SW_2$) for a second time. Activating switching component 820-*b* may initiate a second precharging operation for the digit line 210-*c*. The voltage of the digit line 210-*c* may rise until the threshold voltage of the amplifier 275-*c* (e.g., threshold voltage $V_{th,amp}$) is no longer exceeded, which in some examples may not result from a net transfer of charge (e.g., then the voltage of the digit line 210-*c* is held between 1006 and 1014. Thus, after activating switching component 820-*b*, the digit line 210-*c*, including intrinsic capacitance 260-*c*, may again be charged according to the voltage difference between the voltage level $V_9-V_{th,amp}$ and the voltage source 810-*a* (e.g., 0V).

At 1013, the access procedure may include deactivating the switching component 820-*d* (e.g., by deactivating logical signal $SW_6$). Deactivating switching component 820-*d* may isolate voltage source 810-*h* from the signal line 280-*c*, and the voltage of signal line 280-c may hold at voltage level $V_7$. Upon deactivating the switching component 820-d the signal line 280-c, and thus the first terminal 831 of the integrator capacitor 830, may be floating.

At 1014, the access procedure may include activating switching component 820-f (e.g., by activating logical signal $SW_4$). Activating switching component 820-f may cause a transition from the voltage source 810-e being coupled with the second terminal 832 of the integrator capacitor 830 to the voltage source 810-f being coupled with the second terminal 832 of the integrator capacitor 830. By connecting the second terminal 832 of the integrator capacitor 830 to a voltage source at a higher voltage, the charge stored by the integrator capacitor 830 may be boosted to a higher voltage, and accordingly the voltage of signal line 280-c, coupled with the first terminal 831 of the integrator capacitor 830, may rise to voltage level ($V_7+V_3$). Thus, activating switching component 820-f may initiate a second boosting operation for the integrator capacitor 830.

At 1015, the access procedure may include selecting the memory cell 105-d (e.g., by activating a word line via logical signal WL) for a second time. Selecting the memory cell 105-d for a second time may cause a capacitor of the memory cell 105-d to again be coupled with the digit line 210-c. Accordingly, charge may be shared between the memory cell 105-d, the digit line 210-c, and the signal line 280-c, which may depend on the logic state (e.g., the charge and/or polarization) stored in the memory cell 105-d.

For example, in a 2Pr sensing scheme, accessing the memory cell 105-d for the first time may result in the memory cell 105-d memory cell storing an intermediate logic state, such as an intermediate logic 1, regardless of whether the memory cell 105-d originally stored a logic 1 or 0. This may be a result of the voltage and/or charge applied when selecting the memory cell 105-d at 1005, where for a logic 1 the applied voltage and/or charge may only provide a displacement component, and for a logic 0 the applied voltage and/or charge may provide both a displacement component and a polarization component that may reverse the polarization of a capacitor of the memory cell 105-d. In either case, when memory cell 105-d is selected s second time, a relatively small amount of charge may flow from the digit line 210-c to the memory cell 105-d due to storing the intermediate logic 1, and accordingly, the signal line 280-c may undergo a relatively small voltage drop after selecting the memory cell 105-d. In some examples, in order to generate a reference signal from selecting the memory cell a second time at 1016, the applied voltage (e.g., $V_7+V_3$) may be selected such that the signal line voltage when selecting the memory cell a second time is between the signal line voltage when initially selecting a memory cell that stores a logic 1 and the signal line voltage when initially selecting a memory cell that stores a logic 0.

At 1016, the access procedure may include isolating the digit line 210-c from the signal line 280-c by deactivating the switching component 820-b (e.g., by deactivating logical signal $SW_2$). Isolating the digit line 210-c from the signal line 280-c may prevent additional charge from being shared between the digit line 210-c and the signal line 280-c, including charge sharing across the amplifier 275-c that may be caused by the threshold voltage of the amplifier 275-c being exceeded as a result of subsequent sensing operations.

At 1017, the access procedure may include deactivating switching component 820-f (e.g., by deactivating logical signal $SW_4$). Deactivating switching component 820-f may cause a transition from the voltage source 810-f being coupled with the second terminal 832 of the integrator capacitor 830 to the voltage source 810-e being coupled with the second terminal 832 of the integrator capacitor 830. By connecting the second terminal 832 of the integrator capacitor 830 to the voltage source at a lower voltage, the charge stored by the integrator capacitor 830 may be shifted to a lower voltage, and accordingly the voltage of signal line 280-c, coupled with the first terminal 831 of the integrator capacitor 830, may drop by voltage level of $V_5$-$V_4$ (or just $V_5$ in the event that voltage source 810-e is coupled with a common ground point). Thus, deactivating switching component 820-f may initiate a second shifting operation for the integrator capacitor 830. In examples that do not employ source following, this shifting may reduce the voltage of the signal line 280-c to a level that may be read by the sense component 130-d (e.g., a voltage between low and high voltage sources of the sense component 130-d, not shown).

At 1018, the access procedure may include enabling the source follower amplifier 640-c for a second time. Connecting the source follower amplifier 640-c with the voltage source 810-g may support charge flowing through the source follower amplifier 640-c from the signal line 280-c to the source follower line 802, and also an amplified charge (e.g., a multiple of the charge flowing from the signal line 280-c) flowing through the source follower amplifier 640-c from the voltage source 810-g to the source follower line 802. Accordingly, charge may accumulate on the source follower line 802 until the voltage threshold of the transistor is no longer exceeded. In other words, the voltage of the source follower line 802 may rise to a level of $V_{SF}=(V_{sig}-V_{th})$, where $V_{th}$ is the threshold voltage of the transistor of the source follower amplifier 640-c. In some examples the voltage of the signal line 280-c may only drop by a negligible amount upon enabling the source follower amplifier 640-c, because only a trivial amount of charge flows from the signal line 280-c to the source follower line 802. Although the voltage of the source follower line 802 may be lower than the voltage of the signal line 280-c, the increased amount of charge provided to the source follower line 802 may support larger components in the sense component 130-d, and may also limit charge sharing between the signal line 280-c and the sense component 130-d.

At 1019, the access procedure may include isolating the second node 132-d of the sense component 130-d from the source follower line 802 by deactivating switching component 820-h (e.g., by deactivating logical signal $ISO_2$). Isolating the sense component 130-c from the source follower line 802 may allow the sense component 130-c to store (e.g., "hold") a reference voltage and/or charge associated with the source follower line voltage at the second terminal 132-d of the sense component 130-d prior to determining the logic state stored in the memory cell 105-d.

In some examples, the source follower load component 645-c may also be enabled during the operations of 1019. In examples where the source follower load component 645-c is a transistor, signal EQA may again be enabled at the gate of the transistor, which may support current flowing through the source follower amplifier 640-c to also flow through the source follower load component 645-c. Although signal EQA may be enabled or reenabled during source follower operations of 1019, signal EQA may be disabled at other times (e.g., between 1008 and 1019, or after developing $V_{ref,SF}$), which may reduce energy consumption.

At 1020 the access procedure may include detecting a difference between the stored voltages at the first and second terminals of the sense component 130-d, which in the example of timing diagram 1000 may be the result of a first and second selection of the same memory cell 105-d. For example, if the signal stored at the first terminal is greater than the signal stored at the second terminal (e.g., $V_{sig,SF,1} > V_{ref,SF}$), the sense component 130-*d* may output a voltage equal to the high voltage source of the sense component. If the signal stored at the first terminal is less than the signal stored at the second terminal (e.g., $V_{sig,SF,0} < V_{ref,SF}$), the sense component 130-*d* may output a voltage equal to the low voltage source of the sense component.

Although illustrated as separate operations occurring at different times, certain operations may occur simultaneously, or in a different order. In some examples, various operations may be advantageously initiated simultaneously in order to reduce the amount of time required to sense a logic state of the memory cell 105-*d*. For example, connecting the digit line 210-*b* with the signal line 280-*b* at 1002 may occur prior to the precharging at 1001, or these operations may occur simultaneously. Likewise, connecting the digit line 210-*b* with the signal line 280-*b* at 1014 may occur prior to the precharging at 1013, or these operations may occur simultaneously.

The order of operations shown in timing diagram 1000 is for illustration only, and various other orders and combinations of steps may be performed to support self-boost in accordance with the present disclosure. Further, the timing of the operations of timing diagram 1000 is also for illustration purposes only, and is not meant to indicate a particular relative duration between one operation and another. Various operations may occur over a duration that is relatively shorter or relatively longer than illustrated in various embodiments of self-boost in accordance with the present disclosure.

The transitions of the logical signals of the timing diagram 1000 are illustrative of transitions from one state to another, and generally reflect transitions between an enabled or activated state (e.g., state "1") and a disabled or deactivated state (e.g., state "0") as associated with a particular numbered operation. In various examples the states may be associated with a particular voltage of the logical signal (e.g., a logical input voltage applied to a gate of a transistor operating as a switch), and the change in voltage from one state to another may not be instantaneous. Rather, in some examples a voltage associated with a logical signal may follow a curve over time from one logical state to another. Thus, the transitions shown in timing diagram 700 are not necessarily indicative of an instantaneous transition. Further, the initial state of a logical signal associated with a transition at a numbered operation may have been arrived during various times preceding the numbered operation while still supporting the described transitions and associated operations.

Figure 11:
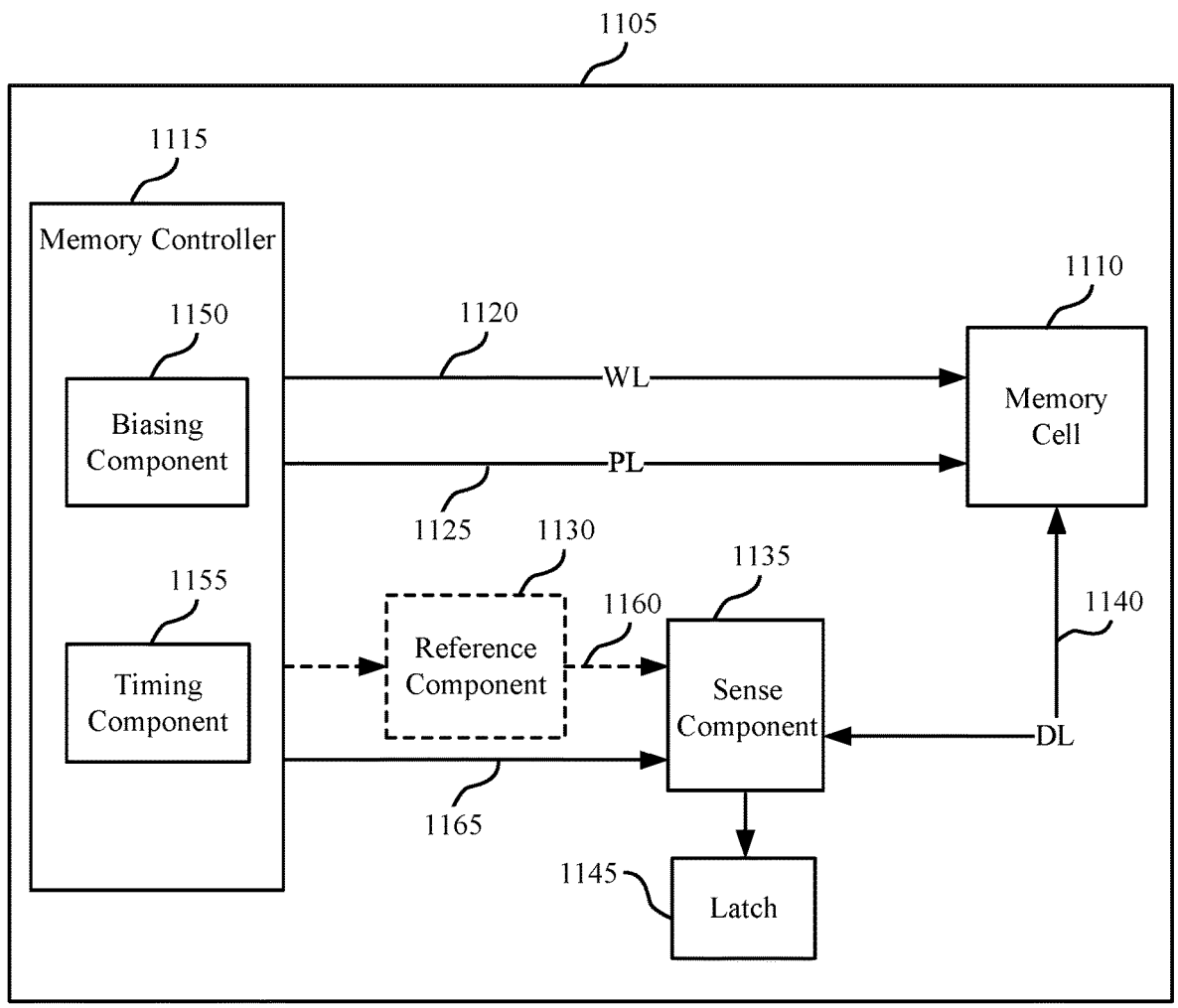
FIG. 11 shows a block diagram of a memory device that may support self-boost, source following, and sample-and-hold for accessing memory cells in accordance with various embodiments of the present disclosure.

FIG. 11 shows a block diagram 1100 of a memory device 1105 that may support self-boost, source following, and sample-and-hold for accessing memory cells in accordance with various embodiments of the present disclosure. Memory device 1105 may be referred to as an electronic memory apparatus, and may be an example of a component of a memory device 100 as described with reference to FIG. 1.

Memory device 1105 may include one or more memory cells 1110, which may be an example of memory cells 105 described with reference to FIGS. 1 through 10. Memory device 1105 may also include a memory controller 1115, a word line 1120, a plate line 1125, a reference component 1130, a sense component 1135, an access line 1140, and a latch 1145. These components may be in electronic communication with each other and may perform one or more of the functions described herein. In some cases, memory controller 1115 may include biasing component 1150 and timing component 1155.

Memory controller 1115 may be in electronic communication with word line 1120, access line 1140, sense component 1135, and plate line 1125, which may be examples of word line 205, digit line 210, sense component 130, and plate line 215 described with reference to FIGS. 1 and 2. Access line 1140 may also be an example of digit line 210-*a* and signal line 280-*a* described with reference to FIG. 4, or an example of digit line 210-*b*, signal line 280-*b*, and source follower signal line 602 described with reference to FIG. 6, or an example of digit line 210-*c*, signal line 280-*c*, and source follower line 802 described with reference to FIG. 8. In some examples the memory device 1105 may also include reference component 1130 and latch 1145. The components of memory array 1105 may be in electronic communication with each other and may perform embodiments of the functions described with reference to FIGS. 1 through 10. In some cases, reference component 1130, sense component 1135, and latch 1145 may be components of memory controller 1115.

In some examples, access line 1140 is in electronic communication with sense component 1135 and a ferroelectric capacitor of a memory cell 1110. A memory cell 1110 may be writable with a logic state (e.g., a first or second logic state). Word line 1120 may be in electronic communication with memory controller 1115 and a selection component of memory cell 1110. Plate line 1125 may be in electronic communication with memory controller 1115 and a plate of the ferroelectric capacitor of memory cell 1110. Sense component 1135 may be in electronic communication with memory controller 1115, access line 1140, latch 1145, and reference line 1160. Reference component 1130 may be in electronic communication with memory controller 1115 and reference line 1160. Some examples may omit reference component 1130, and may generate a reference via the memory cell 1110. In some examples, the access line 1140 may provide the functions of reference line 1160. Sense control line 1165 may be in electronic communication with sense component 1135 and memory controller 1115. These components may also be in electronic communication with other components, both inside and outside of memory device 1105, in addition to components not listed above, via other components, connections, or busses.

Memory controller 1115 may be configured to activate word line 1120, plate line 1125, or access line 1140 by applying voltages to those various nodes. For example, biasing component 1150 may be configured to apply a voltage to operate memory cell 1110 to read or write memory cell 1110 as described above. In some cases, memory controller 1115 may include a row decoder, column decoder, or both, as described with reference to FIG. 1, which may enable memory controller 1115 to access one or more memory cells 105. Biasing component 1150 may also provide voltage potentials to reference component 1130, or memory cell 1110, in order to generate a reference signal for sense component 1135. Additionally, biasing component 1150 may provide voltage potentials for the operation of sense component 1135.

In some cases, memory controller 1115 may perform its operations using timing component 1155. For example, timing component 1155 may control the timing of the various word line selections or plate biasing, including timing for switching and voltage application to perform the memory functions, such as reading and writing, discussed herein. In some cases, timing component 1155 may control the operations of biasing component 1150.

Reference component 1130 may include various components to generate a reference signal for sense component 1135. Reference component 1130 may include circuitry configured to produce a reference signal. In some cases, reference component 1130 may be implemented using other memory cells 1110. Sense component 1135 may compare a signal from memory cell 1110 (e.g., via access line 1140) with a reference signal from reference component 1130, or from another signal from the access line 1140. Upon determining the logic state, the sense component may then store the output in latch 1145, where it may be used in accordance with the operations of an electronic device that includes the memory device 1105. Sense component 1135 may include a sense amplifier in electronic communication with the latch and the ferroelectric memory cell.

Memory controller 1115 may be an example of the memory controller 1215 described with reference to FIG. 12.

Memory controller 1115 and/or at least some of its various sub-components may be implemented in hardware, software executed by a processor, firmware, or any combination thereof. If implemented in software executed by a processor, the functions of the memory controller 1115 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The memory controller 1115 and/or at least some of its various sub-components may be physically located at various positions, including being distributed such that portions of functions are implemented at different physical locations by one or more physical devices. In some examples, memory controller 1115 and/or at least some of its various sub-components may be a separate and distinct component in accordance with various embodiments of the present disclosure. In other examples, memory controller 1115 and/or at least some of its various sub-components may be combined with one or more other hardware components, including but not limited to an I/O component, a transceiver, a network server, another computing device, one or more other components described in the present disclosure, or a combination thereof in accordance with various embodiments of the present disclosure.

In some examples, the memory controller 1115, including any subcomponents thereof, may apply a first voltage to a first node of a capacitor that is coupled to a first access line of a memory cell, apply a second voltage to a second node of the capacitor, apply a third voltage to the second node of the capacitor before selecting the memory cell for a sensing operation, select the memory cell for the sensing operation, compare a resultant voltage of first access line to a reference voltage at the sensing component, where the resultant voltage is based on applying the first voltage and the third voltage to the capacitor and on selecting the memory cell for the sensing operation, and determine a logic value associated with the memory cell based on comparing the resultant voltage and the reference voltage at the sensing component.

In some examples the memory controller 1115, including any subcomponents thereof, may develop a first voltage at an access line of a memory device that is coupled to an array side of a sensing component and a reference side of the sensing component, the first voltage based on a state of charge of a memory cell of the memory device, isolate the access line of the memory device from the array side of the sensing component to store a first read voltage of the sensing component that is based on the first voltage, develop a second voltage at the access line of the memory device, the second voltage based on a reference voltage of the memory device, and determine a logic value associated with the memory cell based on comparing the first read voltage and a second read voltage that is based on the second voltage.

Figure 12:
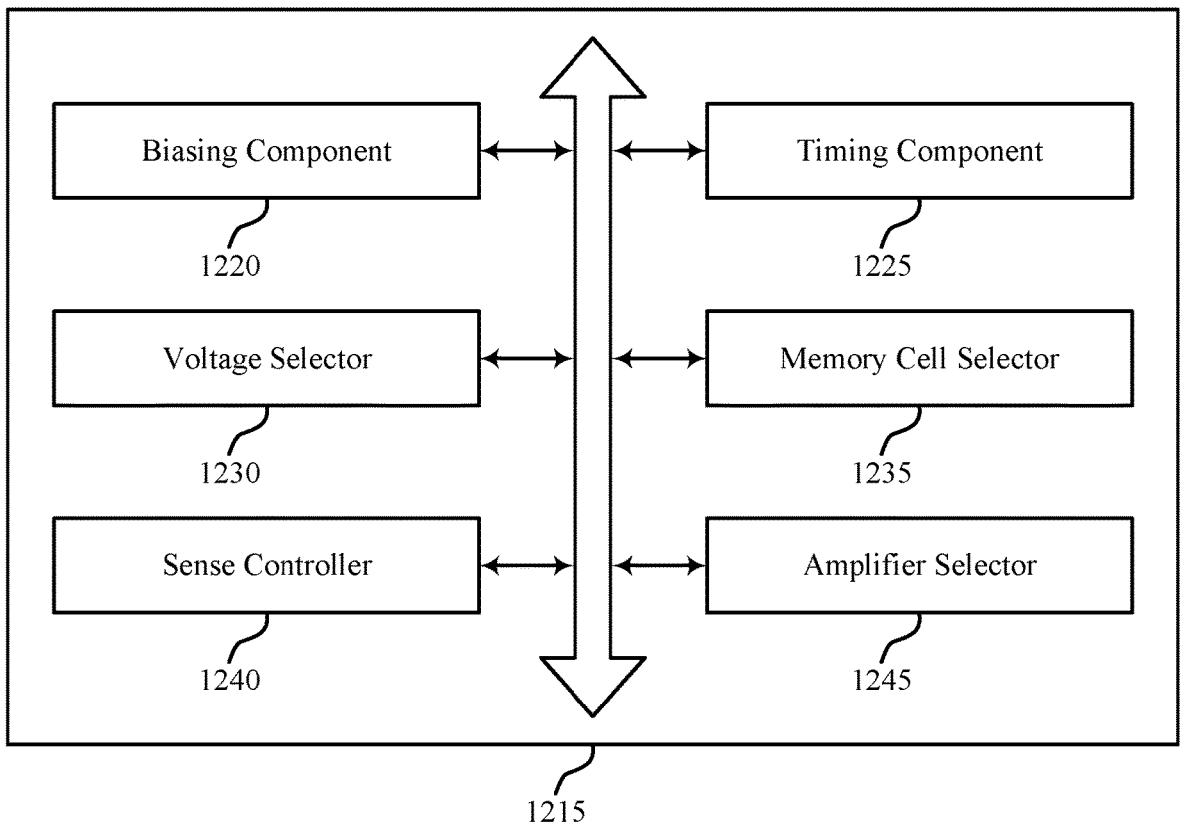
FIG. 12 shows a block diagram of a memory controller that may support self-boost, source following, and sample-and-hold for accessing memory cells in accordance with various embodiments of the present disclosure.

FIG. 12 shows a block diagram 1200 of a memory controller 1215 that may support self-boost, source following, and sample-and-hold for accessing memory cells in accordance with various embodiments of the present disclosure. The memory controller 1215 may be an example of a memory controller 150 described with reference to FIG. 1. The memory controller 1215 may include biasing component 1220, timing component 1225, voltage selector 1230, memory cell selector 1235, sense controller 1240, and amplifier selector 1245. Each of these modules may communicate, directly or indirectly, with one another (e.g., via one or more buses).

Voltage selector 1230 may initiate the selection of voltage sources to support various access operations of a memory device. For example, the voltage selector 1230 may generate logical signals used to activate or deactivate various switching components, such as switching components 420, 620, or 820 described with reference to FIGS. 4, 6, and 8. The voltage selector 1230 may generate one or more of the logical signals of timing diagrams 500, 700, 900, or 1000 described with reference to FIGS. 5, 7, 9, and 10.

For example, voltage selector 1230 may generate a signal to apply a first voltage to a first node of a capacitor that is coupled with a first access line of a memory cell, and apply a second voltage to a second node of the capacitor. In some cases, applying the first voltage to the first node of the capacitor includes activating a switching component coupled between the first node of the capacitor and a first voltage source. The voltage selector 1230 may generate a signal to deactivate the switching component coupled between the first node of the capacitor and the first voltage source prior to applying the third voltage to the second node of the capacitor. In some cases the voltage selector 1230 may generate a signal to apply a third voltage to the second node of the capacitor before selecting the memory cell for a sensing operation. In some cases, applying the third voltage to the second node of the capacitor includes activating a switching component coupled between the second node of the capacitor and the first voltage source. In some examples the voltage selector 1230 may generate a signal to apply, after isolating the first node of the sense component, the first voltage to the first node of the capacitor and the second voltage to the second node of the capacitor. In some examples, the voltage selector 1230 may generate a signal to apply the second voltage to the second node of the capacitor after selecting the memory cell for the sensing operation. In some examples, the voltage selector 1230 may generate a signal to apply the third voltage to the second node of the capacitor before selecting the memory cell for a second selection operation.

In some embodiments, the voltage selector 1230 may generate a signal to apply the second voltage and the third voltage to a node of another capacitor that is coupled to the sensing component, where a reference voltage is based on applying the second voltage and the third voltage to the node of the other capacitor. In some embodiments the voltage selector 1230 may generate a signal to apply a fourth voltage to another node of the other capacitor, where a reference voltage is based on applying the fourth voltage to the other node of the other capacitor.

Memory cell selector 1235 may select a memory cell for sensing operations. For example, the memory cell selector 1235 may generate logical signals used to activate or deactivate a selection component, such as selection components 220 described with reference to FIG. 2. The memory cell selector 1235 may generate the word line logical signals of timing diagrams 500, 700, 900, or 1000 described with reference to FIGS. 5, 7, 9, and 10. The memory cell selector 1235 may generate a signal to develop a first voltage at an access line of a memory device that is coupled to an array side of a sensing component, the first voltage based on a state of charge of a memory cell of the memory device In some examples the memory cell selector 1235 may generate a signal to develop a second voltage at the access line of the memory device, the second voltage based on a reference voltage of the memory device. In some examples the memory cell selector 1235 may generate a signal to apply a selection voltage to the second access line of the memory cell to select the memory cell for a second sensing operation, where a reference voltage is based on selecting the memory cell for the second sensing operation.

Sense controller 1240 may control various operations of a sense component, such as sense components 130 described with reference to FIGS. 1, 2, 4, 6, and 8. For example, the sense controller 1240 may generate logical signals used to activate or deactivate an isolation component, such as switching components 420, 620, and 820 described with reference to FIGS. 4, 6, and 8. The sense controller 1240 may generate the ISO signals of timing diagrams 500, 700, 900, or 1000 described with reference to FIGS. 5, 7, 9, and 10.

For example, the sense controller 1240 may generate a signal to isolate an access line of a memory device from the array side of the sensing component to store a first read voltage of the sensing component that is based on a first voltage. In some examples the sense controller 1240 may generate a signal to isolate a first node of a sense component from the first access line before comparing the signal with a reference, to hold a resultant voltage at the first node of the sense component while the reference voltage is generated.

In some embodiments the sense controller 1240 may compare a resultant voltage of a first access line to a reference voltage at the sensing component, where the resultant voltage is based on selecting the memory cell for the sensing operation. The sense controller 1240 may determine a logic value associated with the memory cell based on comparing the resultant voltage and the reference voltage at the sensing component, or determine a logic value associated with the memory cell based on comparing a first read voltage and a second read voltage.

Amplifier selector 1245 may initiate the selection of amplifiers to support various access operations of a memory device. For example, the amplifier selector 1245 may generate logical signals used to activate or deactivate various switching components, such as switching components 420, 620, or 820 described with reference to FIGS. 4, 6, and 8. The amplifier selector 1245 may generate one or more of the logical signals of timing diagrams 500, 700, 900, or 1000 described with reference to FIGS. 5, 7, 9, and 10.

For example, the amplifier selector 1245 may generate a signal to enable an amplifier coupled between a memory cell and a sense component on a first access line, where a resultant voltage of the first access line is based on enabling the amplifier. In some examples the amplifier selector 1245 may generate a signal to enable the amplifier for a second time, where a reference voltage is based on selecting the memory cell for the second sensing operation and enabling the amplifier for the second time. In some examples the amplifier selector 1245 may generate a signal to enable a first amplifier on the first access line that is coupled between the memory cell and the sense component, where a resultant voltage of first access line is based on enabling the first amplifier, and enable a second amplifier that is coupled between a reference voltage source and the sense component where a reference voltage is based on enabling the second amplifier.

Figure 13:
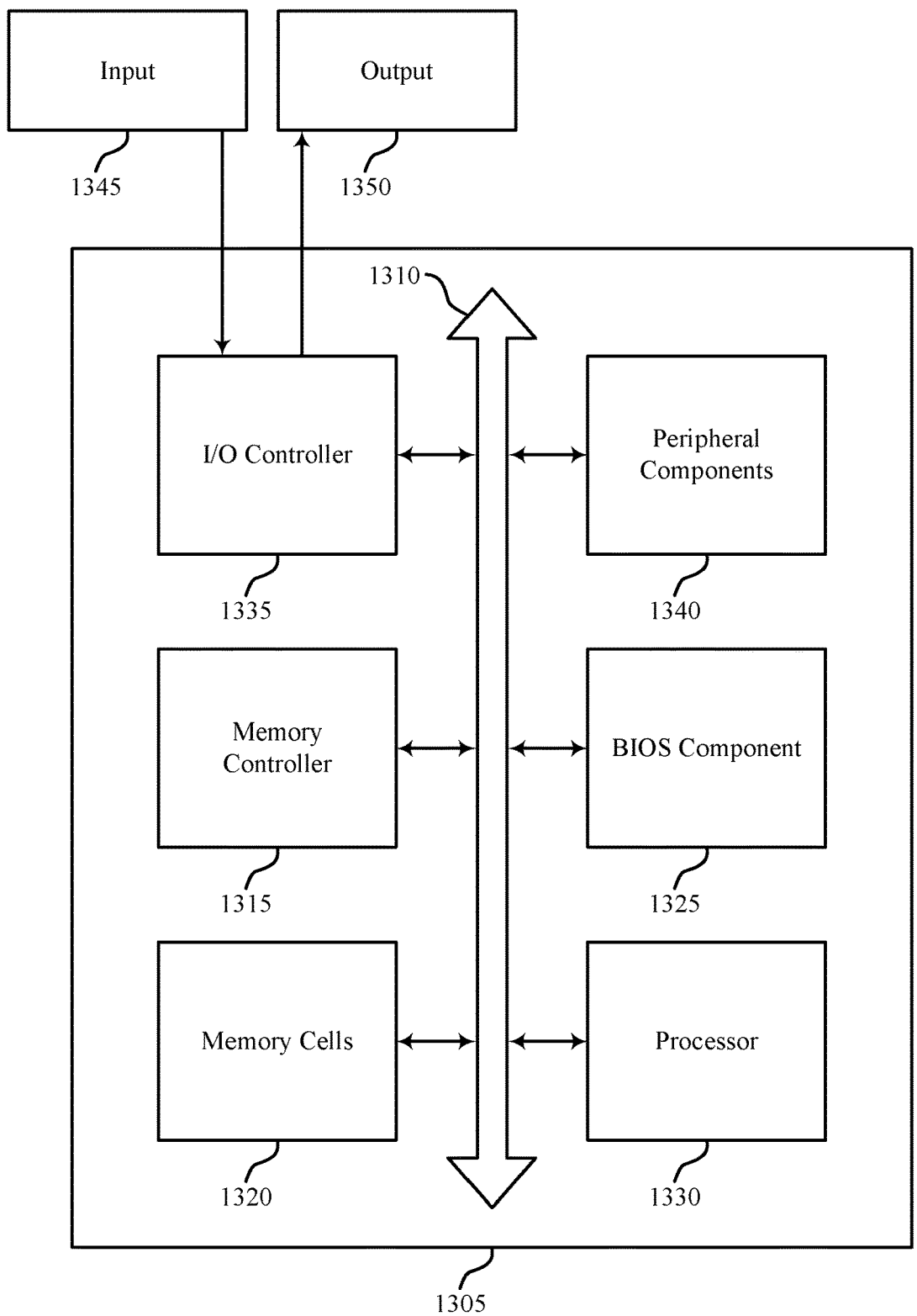
FIG. 13 shows a diagram of a system including a device that may support self-boost, source following, and sample-and-hold for accessing memory cells in accordance with various embodiments of the present disclosure.

FIG. 13 shows a diagram of a system 1300 including a device 1305 that may support self-boost, source following, and sample-and-hold for accessing memory cells in accordance with various embodiments of the present disclosure. Device 1305 may be an example of or include the components of memory device 100 as described above, e.g., with reference to FIG. 1. Device 1305 may include components for bi-directional communications including components for transmitting and receiving communications, including memory controller 1315, memory cells 1320, basic input/output system (BIOS) component 1325, processor 1330, I/O controller 1335, and peripheral components 1340. These components may be in electronic communication via one or more busses (e.g., bus 1310).

Memory controller 1315 may operate one or more memory cells as described herein. Specifically, memory controller 1315 may be configured to support self-boost, source following, and sample-and-hold for accessing memory cells. In some cases, memory controller 1315 may include a row decoder, column decoder, or both, as described with reference to FIG. 1 (not shown).

Memory cells 1320 may be an example of memory cells 105 or 1110 described with reference to FIGS. 1 through 11, and may store information (i.e., in the form of a logical state) as described herein.

BIOS component 1325 be a software component that includes BIOS operated as firmware, which may initialize and run various hardware components. BIOS component 1325 may also manage data flow between a processor and various other components, e.g., peripheral components, input/output control component, etc. BIOS component 1325 may include a program or software stored in read only memory (ROM), flash memory, or any other non-volatile memory.

Processor 1330 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1330 may be configured to operate a memory array using a memory controller. In other cases, a memory controller may be integrated into processor 1330. Processor 1330 may be configured to execute computer-readable instructions stored in a memory to perform various functions (e.g., functions or tasks supporting self-boost, source following, and sample-and-hold for accessing memory cells).

I/O controller 1335 may manage input and output signals for device 1305. I/O controller 1335 may also manage peripherals not integrated into device 1305. In some cases, I/O controller 1335 may represent a physical connection or port to an external peripheral. In some cases, I/O controller 1335 may utilize an operating system such as iOS®, ANDROID®, MS-DOS®, MS-WINDOWS®, OS/2®, UNIX®, LINUX®, or another known operating system. In other cases, I/O controller 1335 may represent or interact with a modem, a keyboard, a mouse, a touchscreen, or a similar device. In some cases, I/O controller 1335 may be implemented as part of a processor. In some cases, a user may interact with device 1305 via I/O controller 1335 or via hardware components controlled by I/O controller 1335.

Peripheral components 1340 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 1345 may represent a device or signal external to device 1305 that provides input to device 1305 or its components. This may include a user interface or an interface with or between other devices. In some cases, input 1345 may be managed by I/O controller 1335, and may interact with device 1305 via a peripheral component 1340.

Output 1350 may represent a device or signal external to device 1305 configured to receive output from device 1305 or any of its components. Examples of output 1350 may include a display, audio speakers, a printing device, another processor or printed circuit board, etc. In some cases, output 1350 may be a peripheral element that interfaces with device 1305 via peripheral component(s) 1340. In some cases, output 1350 may be managed by I/O controller 1335

The components of device 1305 may include circuitry designed to carry out their functions. This may include various circuit elements, for example, conductive lines, transistors, capacitors, inductors, resistors, amplifiers, or other active or inactive elements, configured to carry out the functions described herein. Device 1305 may be a computer, a server, a laptop computer, a notebook computer, a tablet computer, a mobile phone, a wearable electronic device, a personal electronic device, or the like. Or device 1305 may be a portion or aspect of such a device.

Figure 14:
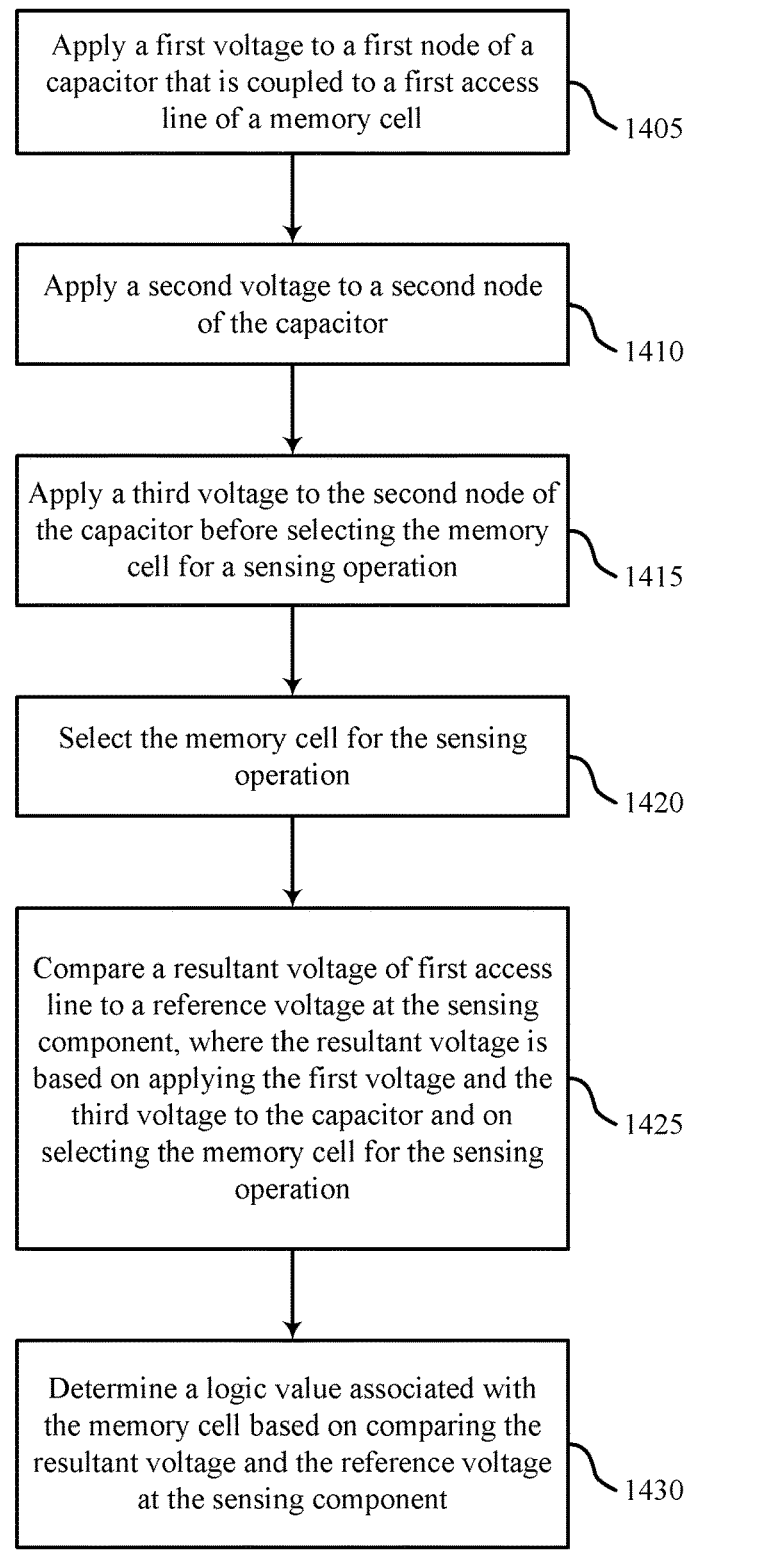
FIG. 14 shows a flowchart illustrating a method that may support self-boost, source following, and sample-and-hold for accessing memory cells in accordance with various embodiments of the present disclosure.

FIG. 14 shows a flowchart illustrating a method 1400 that may support self-boost, source following, and sample-and-hold for accessing memory cells in accordance with various embodiments of the present disclosure. The operations of method 1400 may be implemented by a memory device 100, a device 1105, a device 1305, or its components as described herein. For example, the operations of method 1400 may be performed by a memory controller as described with reference to FIGS. 1 through 13. In some examples, a memory device may execute a set of codes to control the functional elements of the device to perform the functions described below. Additionally or alternatively, the memory device may perform some or all of the functions described below using special-purpose hardware.

At block 1405 the memory device may apply a first voltage to a first node of a capacitor that is coupled to a first access line of a memory cell. In some examples, applying the first voltage to the first node of the capacitor may include activating a switching component coupled between the first node of the capacitor and a first voltage source. The operations of block 1405 may be performed according to the methods described with reference to FIGS. 4 through 10. In certain examples, some or all of the operations of block 1405 may be performed by a voltage selector 1230 as described with reference to FIG. 12.

At block 1410 the memory device may apply a second voltage to a second node of the capacitor. The operations of block 1410 may be performed according to the methods described with reference to FIGS. 4 through 10. In certain examples, some or all of the operations of block 1410 may be performed by a voltage selector 1230 as described with reference to FIG. 12.

At block 1415 the memory device may apply a third voltage to the second node of the capacitor before selecting the memory cell for a sensing operation. Some examples may include deactivating the switching component coupled between the first node of the capacitor and the first voltage source prior to applying the third voltage to the second node of the capacitor. In some cases, applying the third voltage to the second node of the capacitor includes activating a switching component coupled between the second node of the capacitor and the first voltage source. The operations of block 1415 may be performed according to the methods described with reference to FIGS. 4 through 10. In certain examples, some or all of the operations of block 1415 may be performed by a voltage selector 1230 as described with reference to FIG. 12.

At block 1420 the memory device may select the memory cell for the sensing operation. In some cases, the method may also include enabling an amplifier coupled between the memory cell and the sense component on the first access line, which may include activating a switching component coupled between the amplifier and a voltage source. The operations of block 1420 may be performed according to the methods described with reference to FIGS. 4 through 10. In certain examples, some or all of the operations of block 1420 may be performed by a memory cell selector 1235 as described with reference to FIG. 12.

At block 1425 the memory device may compare a resultant voltage of first access line to a reference voltage at the sensing component, wherein the resultant voltage is based at least in part on applying the first voltage and the third voltage to the capacitor and on selecting the memory cell for the sensing operation. The operations of block 1425 may be performed according to the methods described with reference to FIGS. 4 through 10. In certain examples, some or all of the operations of block 1425 may be performed by a sense controller 1240 as described with reference to FIG. 12.

At block 1430 the memory device may determine a logic value associated with the memory cell based at least in part on comparing the resultant voltage and the reference voltage at the sensing component. The operations of block 1430 may be performed according to the methods described with reference to FIGS. 4 through 10. In certain examples, some or all of the operations of block 1430 may be performed by a sense controller 1240 as described with reference to FIG. 12.

Figure 15:
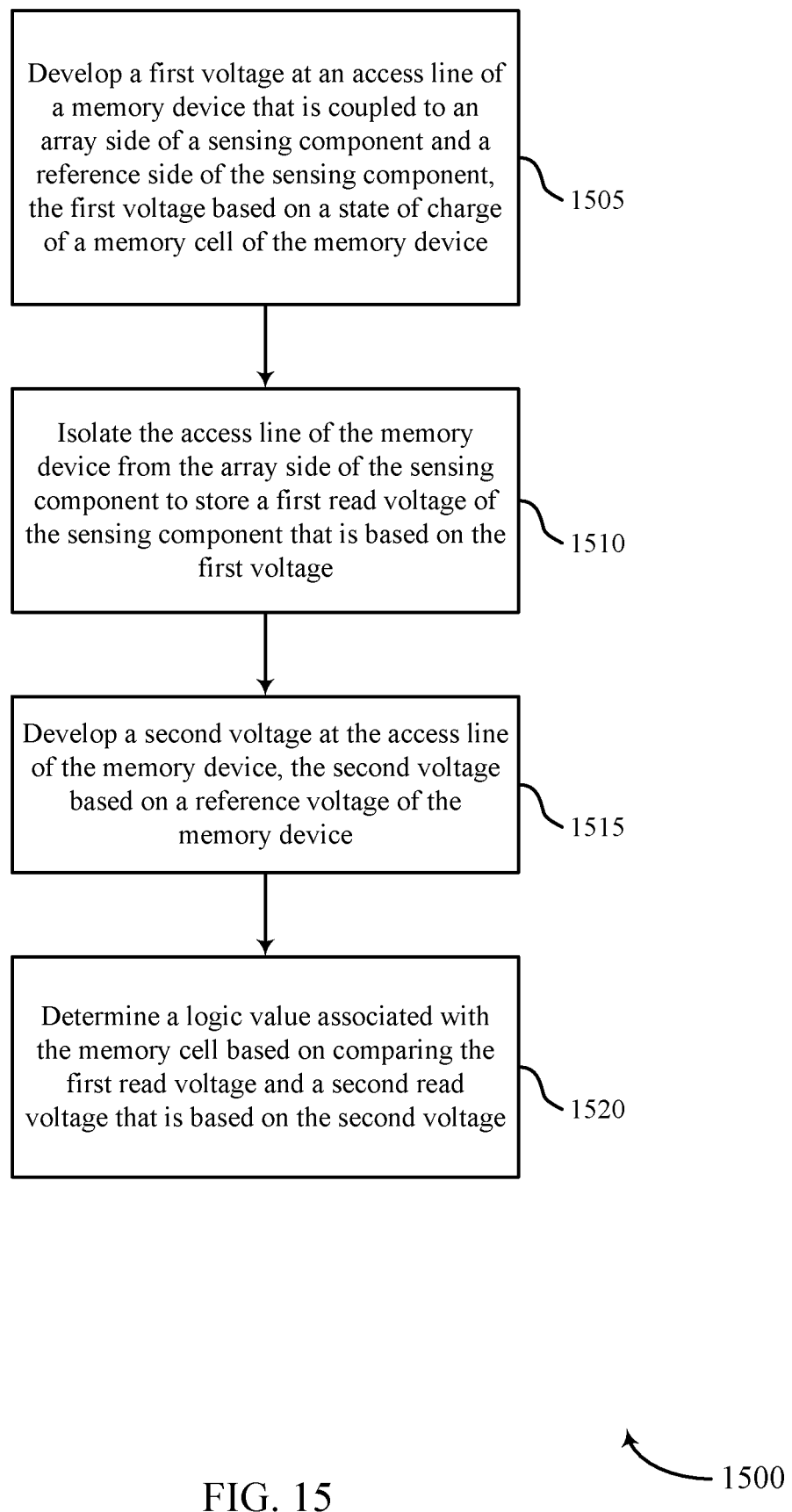
FIG. 15 shows a flowchart illustrating a method that may support sample-and-hold for accessing memory cells in accordance with various embodiments of the present disclosure.

FIG. 15 shows a flowchart illustrating a method 1500 that may support sample-and-hold for accessing memory cells in accordance with various embodiments of the present disclosure. The operations of method 1500 may be implemented by a memory device 100, a device 1105, a device 1305, or its components as described herein. For example, the operations of method 1500 may be performed by a memory controller as described with reference to FIG. 1, 11, or 13. In some examples, a memory device may execute a set of codes to control the functional elements of the device to perform the functions described below. Additionally or alternatively, the memory device may perform some or all of the functions described below using special-purpose hardware.

At block 1505 the memory device may develop a first voltage at an access line of a memory device that is coupled to an array side of a sensing component and a reference side of the sensing component, the first voltage based at least in part on a state of charge of a memory cell of the memory device. The operations of block 1505 may be performed according to the methods described with reference to FIGS. 4 through 10. In certain examples, some or all of the operations of block 1505 may be performed by a voltage selector 1230 as described with reference to FIG. 12.

At block 1510 the memory device may isolate the access line of the memory device from the array side of the sensing component to store a first read voltage of the sensing component that is based at least in part on the first voltage. The operations of block 1510 may be performed according to the methods described with reference to FIGS. 4 through 10. In certain examples, some or all of the operations of block 1510 may be performed by a sense controller 1240 as described with reference to FIG. 12.

At block 1515 the memory device may develop a second voltage at the access line of the memory device, the second voltage based at least in part on a reference voltage of the memory device. The operations of block 1515 may be performed according to the methods described with reference to FIGS. 4 through 10. In certain examples, some or all of the operations of block 1515 may be performed by a voltage selector 1230 as described with reference to FIG. 12.

At block 1520 the memory device may determine a logic value associated with the memory cell based at least in part on comparing the first read voltage and a second read voltage that is based at least in part on the second voltage. The operations of block 1520 may be performed according to the methods described with reference to FIGS. 4 through 10. In certain examples, some or all of the operations of block 1520 may be performed by a sense controller 1240 as described with reference to FIG. 12.

It should be noted that the methods described above describe possible implementations, and that the operations and the steps may be rearranged or otherwise modified and that other implementations are possible. Furthermore, embodiments from two or more of the methods may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

As used herein, the term "virtual ground" refers to a node of an electrical circuit that is held at a voltage of approximately zero volts (0V), or more generally represents a reference voltage of the electrical circuit or device including the electrical circuit, which may or may not be directly coupled with ground. Accordingly, the voltage of a virtual ground may temporarily fluctuate and return to approximately 0V, or virtual 0V, at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refers to a relationship between components that supports electron flow between the components. This may include a direct connection or coupling between components or may include intermediate components. In other words, components that are "connected with" or "coupled with" are in electronic communication with each other. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected or coupled via a switch (e.g., a transistor) are in electronic communication regardless of the state of the switch (i.e., open or closed).

The term "isolated" refers to a relationship between components in which electrons are not presently capable of flowing between them; components are isolated from each other if there is an open circuit between them. For example, two components physically coupled by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the application of voltage and/or flow of charge between components (or lines) that are in electronic communication.

The devices discussed herein, including memory device 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or gro1h of the substrate, by ion-implantation, or by any other doping means.

A transistor or transistors discussed herein may represent a field-effect transistor (FET) and comprise a three terminal device including a source, drain, and gate. The terminals may be coupled with other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The terms "example," "exemplary," and "embodiment," as used herein mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

As used herein, the term "substantially" means that the modified characteristic (e.g., a verb or adjective modified by the term substantially) need not be absolute but is close enough so as to achieve the advantages of the characteristic.

As used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. An apparatus, comprising:
    a memory cell coupled with a first access line and a second access line;
    a capacitor, separate from the memory cell, coupled with the first access line and a first voltage source;
    an amplifier coupled with the capacitor and the first access line; and
    a sensing component coupled with the first access line at a first terminal of the sensing component and coupled with a reference voltage source at a second terminal of the sensing component, the sensing component configured to detect a logic state stored by the memory cell based at least in part on a flow of charge between the capacitor and the first access line.

2. The apparatus of claim 1, wherein:
    the amplifier is configured to bias a portion of the first access line to a voltage based at least in part the flow of charge between the capacitor and the first access line; and
    the sensing component is configured to detect the logic state based at least in part on the amplifier biasing the portion of the first access line to the voltage.

3. The apparatus of claim 2, further comprising:
a second amplifier coupled with the amplifier and the sensing component, the second amplifier configured to bias the portion of the first access line to a second voltage, wherein the sensing component is configured to detect the logic state based at least in part on the second amplifier biasing the portion of the first access line to the second voltage.

4. The apparatus of claim 1, further comprising:
a reference line coupled with the reference voltage source and the sensing component; and
a second capacitor, separate from the memory cell, coupled with the reference line and the first voltage source,
wherein the sensing component is configured to detect the logic state stored by the memory cell based at least in part on a flow of charge between the second capacitor and the reference line.

5. The apparatus of claim 4, further comprising:
a second amplifier coupled with the second capacitor and the sensing component, the second amplifier configured to bias a first portion of the reference line to a voltage, wherein the sensing component is configured to detect the logic state based at least in part on the second amplifier biasing the first portion of the reference line to the voltage.

6. The apparatus of claim 5, further comprising:
a third amplifier coupled with the second amplifier and the sensing component, the third amplifier configured to bias the first portion of the reference line to a second voltage, wherein the sensing component is configured to detect the logic state based at least in part on the third amplifier biasing the first portion of the reference line to the second voltage.

7. The apparatus of claim 1, wherein the amplifier is electrically coupled between the memory cell and the sensing component.

8. A method, comprising:
applying a first voltage to a capacitor, separate from a memory cell, that is coupled with a first access line of the memory cell;
selecting the memory cell for a sensing operation;
enabling an amplifier coupled with the memory cell and a sensing component on the first access line;
comparing a resultant voltage of the first access line to a reference voltage at the sensing component, wherein the resultant voltage is based at least in part on enabling the amplifier and on a flow of charge between the capacitor and the first access line that is based at least in part on applying the first voltage to the capacitor; and
determining a logic value associated with the memory cell based at least in part on comparing the resultant voltage and the reference voltage at the sensing component.

9. The method of claim 8, further comprising:
enabling a second amplifier that is coupled with the amplifier and the sensing component, wherein the resultant voltage is based at least in part on enabling the second amplifier.

10. The method of claim 8, further comprising:
applying the first voltage to a second capacitor, separate from the memory cell, that is coupled with the sensing component, wherein the reference voltage is based at least in part on applying the first voltage to the second capacitor.

11. The method of claim 10, further comprising:
enabling a second amplifier that is coupled with the second capacitor and the sensing component wherein the reference voltage is based at least in part on enabling the second amplifier.

12. The method of claim 11, further comprising:
enabling a third amplifier that is coupled with the second amplifier and the sensing component, wherein the reference voltage is based at least in part on enabling the third amplifier.

13. The method of claim 8, further comprising:
biasing a first portion of the first access line to a second voltage based at least in part on selecting the memory cell for the sensing operation and applying the first voltage to the capacitor; and
biasing a second portion of the first access line to the resultant voltage based at least in part on biasing the first portion of the first access line to the second voltage and enabling the amplifier.

14. The method of claim 8, wherein the amplifier is electrically coupled between the memory cell and the sensing component.

15. An apparatus, comprising:
a memory cell;
a capacitor, separate from the memory cell, that is coupled with a first access line of the memory cell; and
a controller coupled with the memory cell and the capacitor, wherein the controller is operable to cause the apparatus to:
apply a first voltage to the capacitor;
select the memory cell for a sensing operation;
enable an amplifier coupled with the memory cell and a sensing component on the first access line;
compare a resultant voltage of the first access line to a reference voltage at the sensing component, wherein the resultant voltage is based at least in part on enabling the amplifier and on a flow of charge between the capacitor and the first access line that is based at least in part on applying the first voltage to the capacitor; and
determine a logic value associated with the memory cell based at least in part on comparing the resultant voltage and the reference voltage at the sensing component.

16. The apparatus of claim 15, wherein the controller is further operable to cause the apparatus to:
enable a second amplifier that is coupled with the amplifier and the sensing component, wherein the resultant voltage is based at least in part on enabling the second amplifier.

17. The apparatus of claim 15, wherein the controller is further operable to cause the apparatus to:
applying the first voltage to a second capacitor, separate from the memory cell, that is coupled with the sensing component, wherein the reference voltage is based at least in part on applying the first voltage to the second capacitor.

18. The apparatus of claim 17, wherein the controller is further operable to cause the apparatus to:
enabling a second amplifier that is coupled with the second capacitor and the sensing component wherein the reference voltage is based at least in part on enabling the second amplifier.

19. The apparatus of claim 18, wherein the controller is further operable to cause the apparatus to:
enabling a third amplifier that is coupled with the second amplifier and the sensing component, wherein the reference voltage is based at least in part on enabling the third amplifier.

20. The apparatus of claim 15, wherein the controller is further operable to cause the apparatus to:
- biasing a first portion of the first access line to a second voltage based at least in part on selecting the memory cell for the sensing operation and applying the first voltage to the capacitor; and
- biasing a second portion of the first access line to the resultant voltage based at least in part on biasing the first portion of the first access line to the second voltage and enabling the amplifier.

* * * * *